United States Patent
Hale

(10) Patent No.: US 10,509,873 B2
(45) Date of Patent: Dec. 17, 2019

(54) SYSTEM AND METHOD FOR AUTOMATED MODEL CALIBRATION, SENSITIVITY ANALYSIS, AND OPTIMIZATION

(71) Applicant: University of Florida Research Foundation, Incorporated, Gainesville, FL (US)

(72) Inventor: David K. Hale, McLean, VA (US)

(73) Assignee: UNIVERSITY OF FLORIDA RESEARCH FOUNDATION, INCORPORATED, Gainesville, FL (US)

( * ) Notice: Subject to any disclaimer, the term of this patent is extended or adjusted under 35 U.S.C. 154(b) by 77 days.

(21) Appl. No.: 15/916,913

(22) Filed: Mar. 9, 2018

(65) Prior Publication Data

US 2018/0196902 A1 Jul. 12, 2018

Related U.S. Application Data

(62) Division of application No. 14/446,783, filed on Jul. 30, 2014, now Pat. No. 9,946,818.

(60) Provisional application No. 61/859,819, filed on Jul. 30, 2013.

(51) Int. Cl.
  *G06F 17/50* (2006.01)
  *G08G 1/01* (2006.01)
(52) U.S. Cl.
  CPC ....... *G06F 17/5009* (2013.01); *G08G 1/0104* (2013.01)

(58) Field of Classification Search
  None
  See application file for complete search history.

(56) References Cited

U.S. PATENT DOCUMENTS

| 7,155,376 B2 | 12/2006 | Yang et al. |
| 2007/0093997 A1 | 4/2007 | Yang et al. |
| 2010/0125347 A1 | 5/2010 | Martin et al. |

OTHER PUBLICATIONS

Clarke-Laurer, M.D. et al., "Evolving Simulation Modeling: Calibrating SLEUTH Using a Genetic Algorithm", *GeoComputation 2011, Session 1B: Genetic Algorithms & Cellular Automata Modelling*, pp. 25-30.

Hale, D.K., "Directed Brute Force Calibration," *SimSub Mid-Year Newsletter*, Aug. 2013, p. 16.

(Continued)

*Primary Examiner* — Syed A Roni
(74) *Attorney, Agent, or Firm* — Alston & Bird LLP

(57) ABSTRACT

A computer-implemented interface apparatus and method are directed to automated calibration, sensitivity analysis, and optimization of computer models. User interfaces may be provided for automatically managing interchangeable input parameters, interchangeable output objective functions, and interchangeable optimization methods. A user may use the computer-implemented interface apparatus and method to select any number of input and output parameters and calibration or search thoroughness levels for automated calibration, sensitivity analysis, and optimization of a computer model. The functionality of selecting the input and output parameters and calibration or search thoroughness levels may allow the user to adjust or control computer run times for automated calibration, sensitivity analysis, and optimization of the computer model.

20 Claims, 32 Drawing Sheets

(56) References Cited

OTHER PUBLICATIONS

Hale, D.K. et al., "Comparison of Optimization Methods for Assisted Calibration of Traffic Micro-Simulation," *An International Conference on Engineering and Applied Sciences Optimization*, Jun. 4-6, 2014, Kos Island, Greece.

Jie, L. et al., "Calibration of a microscopic simulation model for emission calculation," *Transportation Research Part C*, 2013, pp. 172-184, vol. 31.

Menneni, S., "Pattern Recognition Based Microsimulation Calibration and Innovative Traffic Representations," *A Dissertation presented to the Faculty of the Graduate School at the University of Missouri-Columbia*, Dec. 2008.

Pell, A. et al., "Onliine traffic simulation software for heterogeneous road networks—current state and future trends," *9ITS European Congress*, Jun. 4-7, 2013, Dublin, Ireland.

PTV Group Traffic Software product information, [online, webpage, retrieved Nov. 12, 2014] from: http://vision-traffic.ptvgroup.com/en-us/products/ptv-vissim/, pp. 1-5.

Aimsun product information, [online, webpage, retrieved Nov. 12, 2014] from: http://www.aimsun.com/wp/?page_id=21, pp. 1-2.

TransModeler Traffic Simulation Software product information, [online, webpage, retrieved Nov. 12, 2014] from: http://www.caliper.com/transmodeler/, pp. 1-2.

Trafficware product information, [online, webpage, retrieved Nov. 12, 2014] from: http://www.trafficware.com/, p. 1.

Paramics Simulation Software product information, [online, webpage, retrieved Nov. 12, 2014] from: http://www.paramics-online.com/, pp. 1-2.

CORSIM: Microscopic Traffic Simulation Model product information, [online, webpage, retrieved Nov. 12, 2014] from: http://www-mctrans.ce.ufl.edu/featured/TSIS/version5/corsim.htm, p. 1.

TransCAD Transportation Planning Software product information, [online, webpage, retrieved Nov. 12, 2014] from: http://www.caliper.com/tcovu.htm, pp. 1-6.

DynustT product information, [online, webpage, retrieved Nov. 12, 2014] from: http://dynust.net/, pp. 1-2.

McTrans Highway Capacity Software product information, [online, webpage, retrieved Nov. 12, 2014] from: http://mctrans.ce.ufl.edu/tset4242uu/hcs/, pp. 1-2.

TEAPAC by Strong Concepts product information, [online, webpage, retrieved Nov. 12, 2014] from: http://www.strongconcepts.com/, pp. 1-2.

Complete Streets product information, [online, webpage, retrieved Nov. 12, 2014] from: http://www.kittelson.com/expertise_areas/complete=streets, pp. 1-3.

Citilabs Professional Transportation Planning Software product information, [online, webpage, retrieved Nov. 12, 2014] from: http://www.citilabs/, p. 1.

Multitude product information, [online, webpage, retrieved Nov. 12, 2014] from: http://www.multitude-project.eu/, pp. 1-3.

Brockfield, E. et al., "Calibration and Validation of Microscopic Models of Traffic Flow," *Transportation Research Record: Journal of the Transportation Research Board*, 2005, pp. 179-187, No. 1934.

Jung-Beom Lee, Calibration of traffic simulation models using Simulation Perturbation Stochastic Approximation (SPSA) Method extended through Bayesian Sampling Methodology, Oct. 2008, pp. 1-170.

| | A | B | C | D | E | F | G | H |
|---|---|---|---|---|---|---|---|---|
| 1 | Freeway Node Metering Headway (FRESIM) | 20 | 25 | 30 | 35 | 40 | 45 | 50 |
| 2 | Vehicles Entering Link | 1682 | 1749 | 1683 | 1664 | 1651 | 1689 | 1708 |
| 3 | Vehicles Exiting Link | 1703 | 1770 | 1697 | 1684 | 1672 | 1712 | 1725 |
| 4 | Lane Changes Total | 414 | 542 | 430 | 436 | 379 | 444 | 398 |
| 5 | Content Current | 12 | 12 | 19 | 13 | 12 | 10 | 16 |
| 6 | Content | 15.33 | 16.13 | 15.25 | 15.16 | 14.36 | 15.34 | 15.15 |
| 7 | Travel Distance Total | 160.3 | 166.6 | 160.1 | 158.6 | 157.2 | 161 | 162.7 |
| 8 | Travel Time Total | 230 | 242 | 228.8 | 227.5 | 215.5 | 230.1 | 227.4 |
| 9 | Travel Time Per Vehicle | 8.15 | 8.25 | 8.12 | 8.15 | 7.78 | 8.12 | 7.94 |
| 10 | Move Time Per Vehicle | 5.24 | 5.24 | 5.24 | 5.24 | 5.24 | 5.24 | 5.24 |
| 11 | Delay Travel Per Vehicle | 2.9 | 3 | 2.87 | 2.9 | 2.54 | 2.87 | 2.69 |
| 12 | Move Time Per Travel Time Ratio | 0.64 | 0.63 | 0.64 | 0.64 | 0.67 | 0.64 | 0.66 |
| 13 | Travel Time Per Distance Traveled | 1.43 | 1.45 | 1.43 | 1.43 | 1.37 | 1.42 | 1.39 |
| 14 | Delay Travel Per Mile | 0.51 | 0.52 | 0.5 | 0.51 | 0.44 | 0.5 | 0.47 |
| 15 | Volume Per Lane | 1693 | 1759 | 1690 | 1674 | 1660 | 1700 | 1718 |
| 16 | Density Per Lane | 40.48 | 42.59 | 40.27 | 40.03 | 37.92 | 40.5 | 40.02 |
| 17 | Speed Average | 41.81 | 41.3 | 41.97 | 41.82 | 43.76 | 41.98 | 42.91 |

FIG. 38

SYSTEM AND METHOD FOR AUTOMATED MODEL CALIBRATION, SENSITIVITY ANALYSIS, AND OPTIMIZATION

CROSS-REFERENCE TO RELATED APPLICATIONS

The present application is a divisional application of U.S. application Ser. No. 14/446,783, filed Jul. 30, 2014, which claims the benefit of U.S. Provisional Application Ser. No. 61/859,819, filed Jul. 30, 2013, the disclosures of each of which are hereby incorporated by reference in their entirety, including any figures, tables, or drawings.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF INVENTION

The use of computer implemented models to evaluate complicated systems has become increasingly popular. A well-designed, adequately validated model can be used to understand current conditions and predict future trends. The ability to accurately model multi-variable systems can aid in optimizing current resources and allow for future planning.

One area in which computer models have become increasingly important is in the area of vehicle traffic control and road maintenance. The continued increase in population means that the number of vehicles traversing the roadways has also increased and will continue to increase. As a result, it has become more important for large and small municipalities to be able to improve traffic safety and determine how limited resources for road construction and maintenance can be optimally allocated in their areas. Software modeling applications for simulating traffic and road conditions are becoming more commonly used as a tool for analyzing traffic operations.

This increase in their importance has led to computer programs for traffic simulation becoming increasingly more advanced and sophisticated over the past two decades. Usage of traffic simulation has increased significantly; and this high-fidelity modeling, along with moving vehicle animation, has allowed important transportation decisions to be made with better confidence. During this time, traffic engineers have typically been encouraged to embrace the process of calibration, in which steps are taken to reconcile simulated and field-observed traffic performance.

According to international surveys, top experts, and conventional wisdom, existing (non-automated) methods of calibration have been difficult and/or inadequate. Consulting engineers and DOT personnel have expressed strong interest in making calibration faster, cheaper, easier, and requiring less engineering expertise. Some users of simulations have been unwilling to perform any amount of calibration; frequently citing labor-intensive data collection procedures, or a lack of coherent procedures and guidelines. Some simulation users have also tried to apply procedures and guidelines that exist in the literature; but have found that these guidelines are difficult to apply, or that the guidelines are a poor fit for their specific type of simulation analysis. Finally, some simulation users believe that they have somewhat mastered the process of calibration; but that the amount of engineering expertise required to achieve this mastery could be measured in decades, or that successful execution of calibration for a new project could require many weeks of hard work.

There has been a significant amount of research in the area of automated calibration techniques, for traffic simulation. However, many of these research projects and papers have not provided the level of flexibility and practicality that are typically required by real-world engineers. There is a need for a calibration method that can increase the effectiveness of computer models. Such a calibration method will ideally be simple to implement, provide sufficient customization to accommodate different user needs, and increase the efficiency of computer models.

BRIEF SUMMARY

The embodiments of the subject invention provide a method for self-calibration of complex computer models that can potentially utilize multiple simulation data parameters. More specifically, embodiments of the subject invention provide architecture for software-assisted calibration that can be used with a simulation-based optimization (SO) family of simulation models. In simulation-based optimization, the numeric discrepancy between simulated and field-measured results can be an objective function to be minimized. Certain implementations of the subject invention provide an efficient and accurate method for self-calibrating traffic simulation models. One or more methods of the subject invention described herein can:

1. Make calibration easier, and reduce the amount of engineering expertise required for calibration.
2. Reduce the amount of time and money typically required for calibration.
3. Improve the standard of accuracy for future simulation analyses.
4. Increase uniformity of simulation practices, which could lead to increased acceptance of simulation for traffic analysis and other types of system models.
5. Provide a design blueprint for other simulation developers to utilize.
6. Provide material for simulation guidelines.

Embodiments of the subject invention provide architecture for software-assisted calibration, within a simulation-based optimization (SO) family of methods. The new architecture can use a database of real-life based default values for various input parameters, to pre-define a narrow set of trial values to be used during optimization. The architecture can also allow engineers to prioritize input and output parameters, and specify a tolerable computer run time, prior to initiating the SO-based calibration process. The use of a "directed brute force" (DBF) search process algorithm can make the architecture flexible and practical, for real-world use. These same features can also be extended to provide an enhanced platform for sensitivity analysis, and optimization. The acronym term "SASCO" (Sensitivity Analysis, Self-Calibration, and Optimization) refers to a database-centric framework embodiment that can support any one of these three analysis types.

SASCO can be classified as belonging to the simulation-based optimization (SO) family of methods Under SO, numerous input combinations are simulated for the purpose of minimizing or maximizing an objective function. When the goal of SO is calibrating a simulation model, minimizing the difference between simulated and field-measured outputs is sometimes the objective function. In addition to the objective function, another important aspect of SO is the searching method. Intelligent searching methods are designed to obtain the best possible solutions in the shortest amount of time, or using the smallest number of trials. Intelligent searching methods would not be needed if computers were infinitely fast; optimum solutions could be located by exhaustive ("brute force") searching, which would simulate every possible combination of inputs. But given the speed of modern computers, brute force optimization is not practical for computationally expensive traffic simulations.

Embodiments of the subject invention can also incorporate sensitivity analysis for one or more input parameters. Sensitivity analysis is often used in systems modeling to study the uncertainty that can affect the output of a mathematical-based model or system and that can be apportioned to different sources of uncertainty in its inputs. Sensitivity analysis can be useful for testing the robustness of a modeling system in the face of uncertainty in input parameters. It can also lend a greater understanding of the relationships between input and output variables, which can help to reduce uncertainty in the model inputs.

Optimization of an input parameter is precisely what it implies, which is finding the best possible value for a particular input parameter within a range of possibilities. However, optimization of a model with numerous possible input parameters can be time consuming. As a result, model systems often focus on optimization of variables that are most often associated with the particular output parameters being reviewed. This can obtain results faster; but, it also reduces the possibility of discovering unknown input variables that affect those same output parameters. Embodiments of the subject invention can increase the number of optimized input parameters to improve output parameter results.

As with any computer software simulation method, there can be any of a variety of limitations that affect the accuracy of the calibration method of the subject invention. Largely due to computer speed limitations, it is believed that automated calibration processes cannot fully replace user judgment, user expertise, or manual (non-automated) calibration. Automated self-calibration also cannot defend against fundamental (volume, timing, laneage) input data errors, simulation software bugs, simulation software limitations, inconsistent performance measure definitions, and other limitations and factors understood by those with skill in the art. However, if properly designed and used, the automated process of the subject invention can reduce the amount of time and expertise typically required for calibration. Simulated performance measures can be made to match field-measured performance measures by several methods, including, for example:

1. Correction of fundamental input data (e.g., volume, timing, laneage) errors
2. Reconciliation of inconsistent performance measure definitions*
3. Collection of more accurate field-measured values
4. Elimination of simulation software limitations*
5. Correction of simulation software bugs*
6. Manual (non-automated) calibration
7. Automated self-calibration
(*usually handled by the simulation software developers)

Embodiments of the subject invention provide several unique advantages over the currently used calibration methods. One embodiment allows a user to select any number of field-measured output parameter values and any number of items from an available database of real-life based default values for various input parameters. A further embodiment utilizes a "directed brute force" methodology to provide at least three levels of data optimization (quick, medium, and thorough). With the directed brute force method, a user is able to selectively calibrate individual parameters by determining the level of calibration thoroughness utilized for each input parameter. Other algorithms can be incorporated as well that are capable of increasing the sensitivity and optimizing results. Implementation of the calibration method allows a user to determine and select data for each chosen parameter that effectively simulates real-world observations. In a further embodiment, calibration comprises archiving user-selected data to be utilized for future simulations, to obtain more accurate results.

Further implementations display an estimate of the amount of time required to conduct the number of simulations necessary to achieve the levels of data optimization that have been selected (i.e., quick, medium, thorough). This, in turn, allows a user to select and adjust the levels to obtain a tolerable number of runs or simulations, and, thus, a tolerable run time, or simulation time, in advance.

Embodiments of the subject invention also provide flexibility to the self-calibration technology. In one embodiment, various selected input parameters can be weighted prior to simulation to further adjust run-time and the accuracy of resulting output values. In another embodiment, a random number seeding method can be used to examine a fuller range of possible outcomes. Another embodiment allows users to customize a database of candidate input parameter values. This allows a user to eliminate values that are considered to be outliers or non-applicable for a particular simulation.

Advantageously, embodiments of the calibration method of the subject invention are easy to use. In one embodiment, users can automatically load/display all outputs from an original run and, in a further embodiment, available field-measured values can be entered for any parameter. Other embodiments can include various display options. One embodiment displays the original average percent difference between real world data and model coefficient values. Another embodiment displays results during a run or simulation process, and allows a user to abort a run if necessary. For example, if it becomes apparent that the simulation is inaccurate as simulation results are displayed, it may be determined that certain parameters need to be adjusted and continuing the current simulation process is unnecessary. Embodiments of the subject invention provide the advantage of permitting a user the option of aborting a simulation process during mid-operation to avoid wasting time and resources. A still further embodiment can display standard deviations between candidate (trial) calibration parameters, revealing model sensitivity to the calibrated input parameter values.

Self-calibration features in the embodiments of the subject invention advantageously maximize practicality, flexibility, and user-friendliness of computer model calibration. In particular, the invention has been demonstrated effective in the arena of traffic simulation models. The implemented methodologies allow users to quickly and easily select a set of input and output parameters for calibration. This methodology also allows users to prioritize selected specific input and output parameters, and to further specify a tolerable computer run-time, prior to initiating the self-calibration process. The "directed brute force" search process utilized in implementations herein further allow the methodology to be sufficiently flexible and practical for real-world use.

BRIEF DESCRIPTION OF DRAWINGS

In order that a more precise understanding of the above recited invention can be obtained, a more particular description of the invention briefly described above will be rendered by reference to specific embodiments thereof that are illustrated in the appended drawings. Thus, understanding that these drawings depict only typical embodiments of the invention and are not therefore to be considered as limiting in scope, the invention will be described and explained with additional specificity and detail through the use of the accompanying drawings in which:

FIG. 16 illustrates an example of database values selected for quick, medium, or thorough calibration, where successive levels entail a greater number of simulations.

Figure 17:
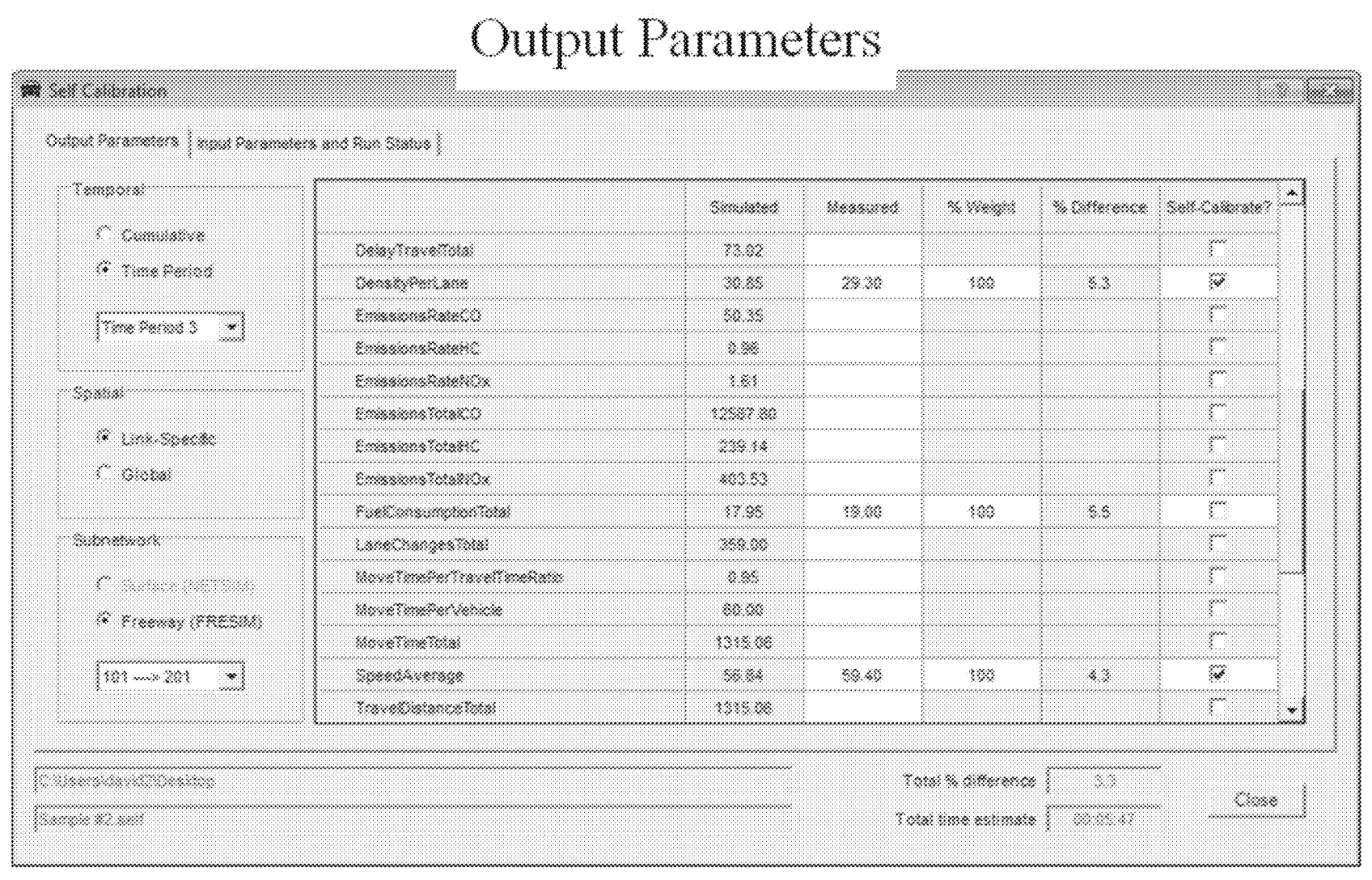

FIG. 17 illustrates one embodiment of a user interface screen for selecting output parameters.

FIG. 19 illustrates one embodiment of an output parameters screen, according to the subject invention.

FIG. 24 illustrates one embodiment of a pop-up dialog box for selecting whether to import calibration settings for the selected data set.

FIG. 25 illustrates an interface screen of some of database values for input parameters. In this embodiment, the database contains multiple preset input parameters within a few dozen text files.

FIG. 26 illustrates an example of the types of database values that can be utilized when certain input parameters are selected for calibration.

FIG. 27 illustrates one embodiment of an interface screen with an example of the Sensitivity Analysis (SA) results conducted for a link-specific left-turn pocket length simulation.

FIG. 28 illustrates an example list of the contents of a database text file, according to the subject invention.

FIG. 38 is an example where tabular outputs for a particular data set have been imported into a spreadsheet file, so that all desired outputs can be simultaneously reviewed.

DETAILED DISCLOSURE

The subject disclosure describes embodiments of a calibration method for computer simulation programs. More specifically, the subject disclosure provides methods for calibrating simulation programs having numerous possible input and output variables. Methods are described that provide the ability to select the number and type of variables utilized by the simulation program, so as to control the run-time of the software and the accuracy and relevance of the information output. Specific embodiments are database-centric, such that they utilize a database of pre-determined values use with input parameters to conduct one or more simulations.

In general, methods of the subject invention can be employed with any computer model that utilizes multiple input and output variables. Certain embodiments of the subject invention conduct simulations by employing a database populated with pre-determined values for each selectable input variable. Alternative embodiments can employ a method wherein a large range of values is available and presented to the user from which a constrained sub-range of values can be dynamically selected. Further embodiments allow a user to selected the stepwise values to be used within the constrained sub-range. Embodiments of subject invention, which can employ specific, selectable, algorithms during simulations, provide a unique advantage of being able to predict the run-time of a simulation scenario, based upon the number of selected input parameters, and based on the chosen calibration thoroughness of each selected input parameter. This predicted run-time can be provided to a user for determining if the run-time, or the time required to execute a selected set of simulation parameters, is acceptable. If the run-time is unacceptable a user can alter the number of selected input parameters, and/or the calibration thoroughness of any input parameters, so as to adjust the run-time.

The following description is directed to an implementation that is particularly useful in the field of traffic and road condition simulations. However, a person with skill in the art will be able to recognize numerous other uses that would be applicable to the devices and methods of the subject invention. Thus, while the subject application describes, and many of the terms herein relate to, a use for calibration of traffic simulation software, other modifications apparent to a person with skill in the art and having benefit of the subject disclosure are contemplated to be within the scope of the present invention.

Figures 1A, 1C:
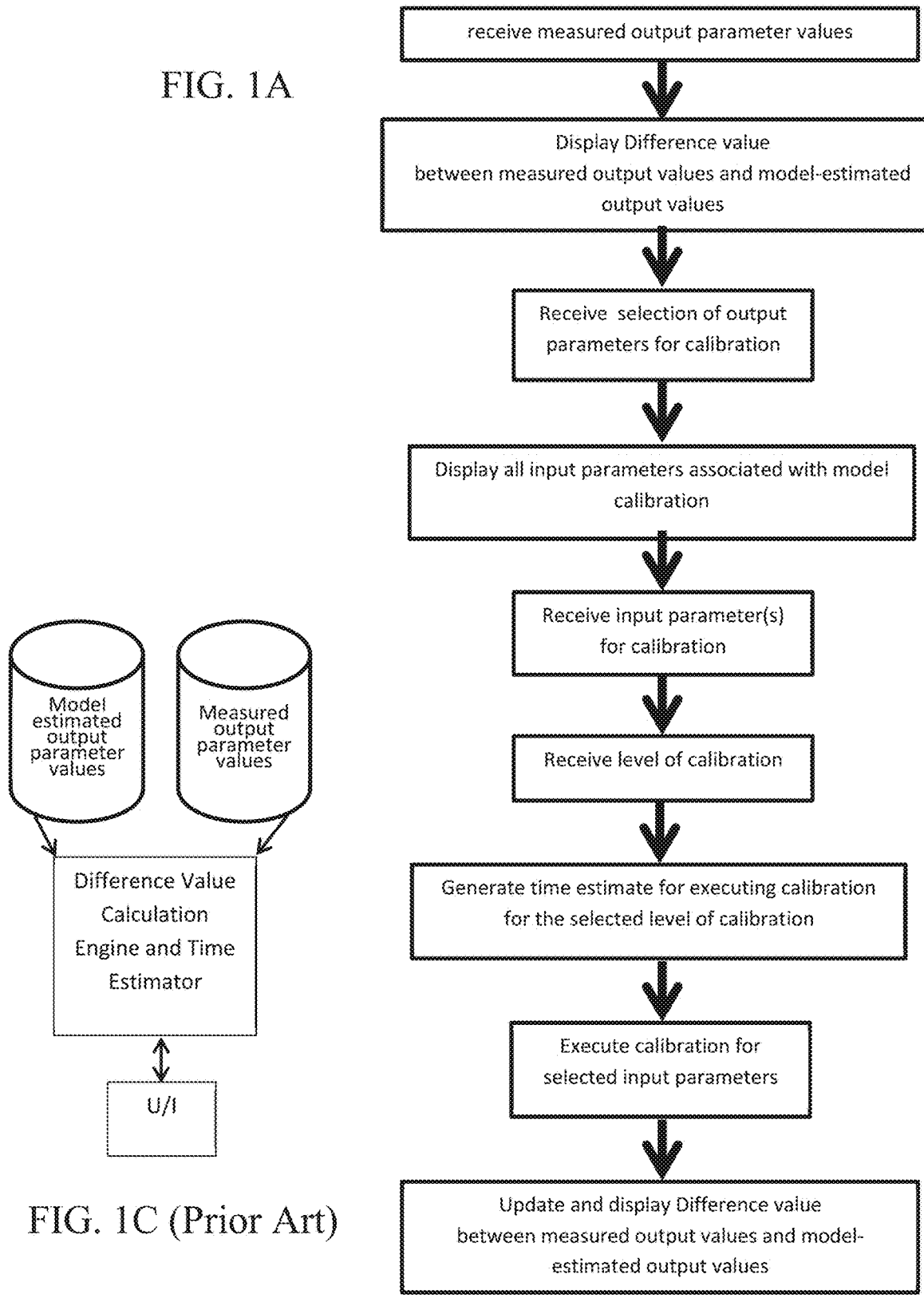
FIG. 1A is a flowchart illustrating the basic steps of one embodiment of the invention.
FIG. 1C is a diagram illustrating a typical operating environment of a simulation model.
Figure 1B:
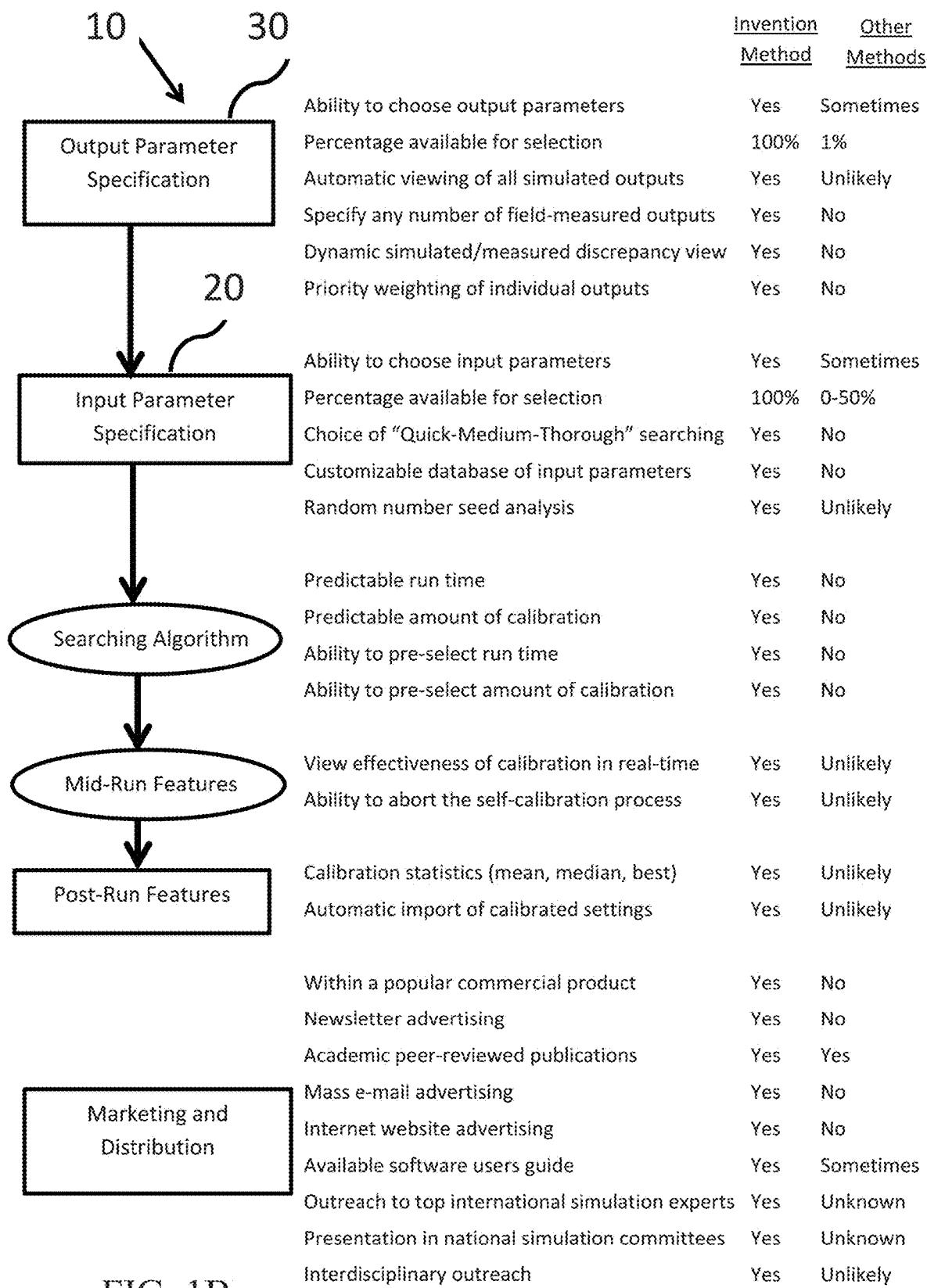
FIG. 1B is a flowchart that illustrates a comparison of the features of the calibration method of the subject invention with other methods of calibration known in the art.
Figure 2:
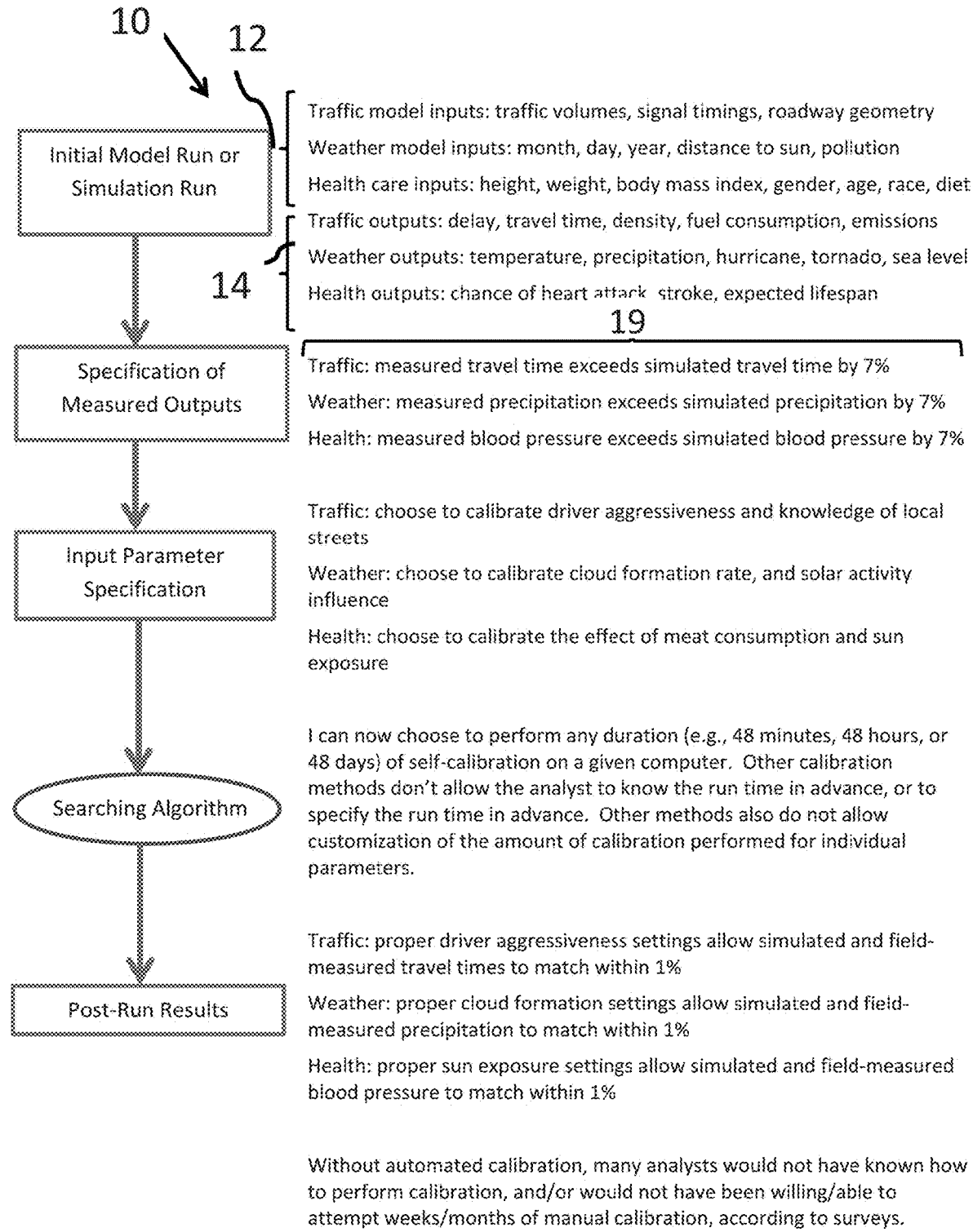
FIG. 2 is a flowchart that illustrates a method of self-calibration, according to one implementation of the subject invention.
Figure 13:
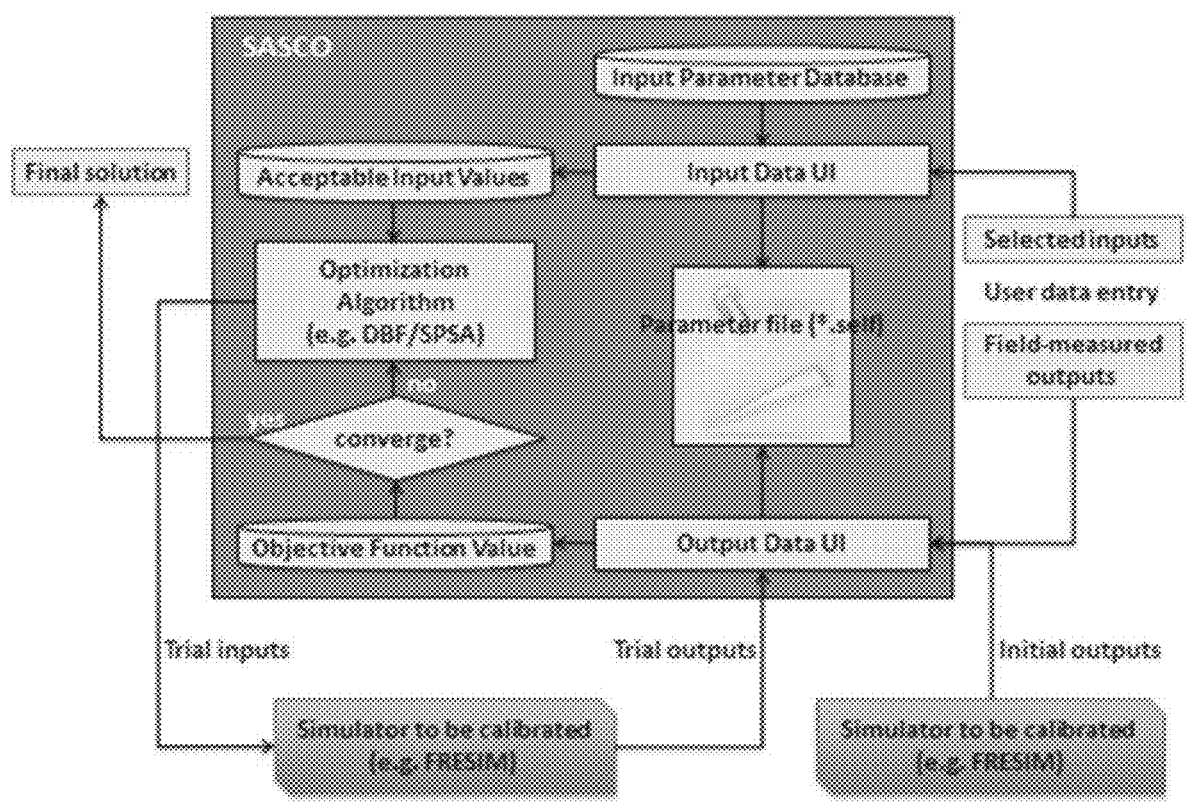
FIG. 13 is a flowchart illustrating one embodiment of a Sensitivity Analysis, Self-Calibration, and Optimization (SASCO) system according to the subject invention.

With reference to FIGS. 1B, 2 and 13, it can be seen that the method of the subject invention can be used to calibrate any of a variety of software implemented mathematical models. FIG. 1B illustrates a general outline of the operations conducted with typical mathematical models. FIGS. 1A and 1B also show various steps conducted by certain implementations of the calibration method of the subject invention and how they compare to other known calibration methods. It can be seen in FIG. 1B that the calibration method of the subject invention provides ability and flexibility previously unavailable in model calibration methods.

Mathematical models can include, but are not limited to, simulation of behaviors of business, economic, social, biological, physical, mental, and chemical systems, or combinations thereof. FIGS. 2 and 13 illustrate the basic steps utilized by embodiments of the calibration method of the subject invention and how they can be applied to example models that simulate traffic, weather and personal health.

In one implementation, the calibration method of the subject invention is a software program that can be integrated with a mathematical modeling program. As shown in FIG. 2, the initial step can be for a user to perform at least one simulation run with the model, to generate the simulation outputs necessary prior to calibration. For traffic modeling implementations, calibrations for time period-specific outputs, in addition to, or instead of, cumulative outputs can require generation of additional files specific to the model being calibrated.

In one embodiment, the model 10 is implemented by selecting input parameters 12 that can be relevant to the output parameters 14 of interest, or are otherwise utilized by the modeling program to generate output parameters. FIG. 2 is a flow chart illustrating the general steps for three examples of mathematical models used to simulate traffic, weather and personal health parameters. FIG. 2 also describes examples of the types of input parameters 12 that might be chosen to obtain appropriate output parameters 14.

Figure 3:
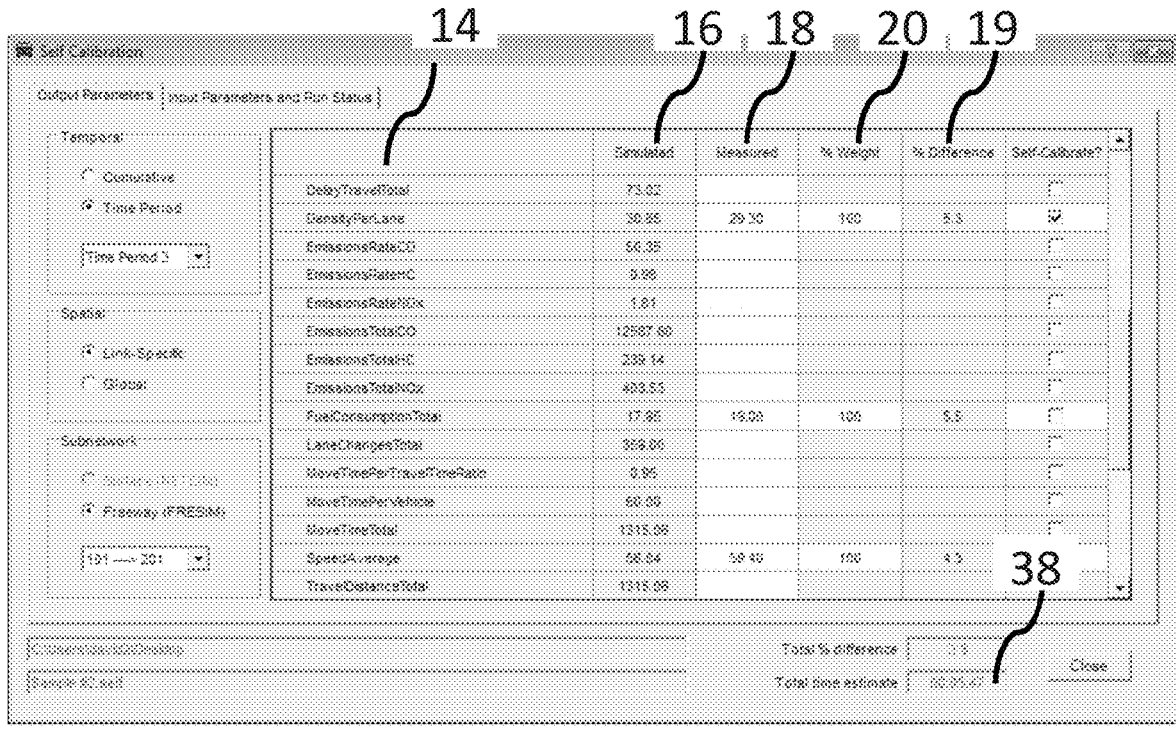
FIG. 3 shows one implementation of an Output Parameters interface screen.
Figure 4:
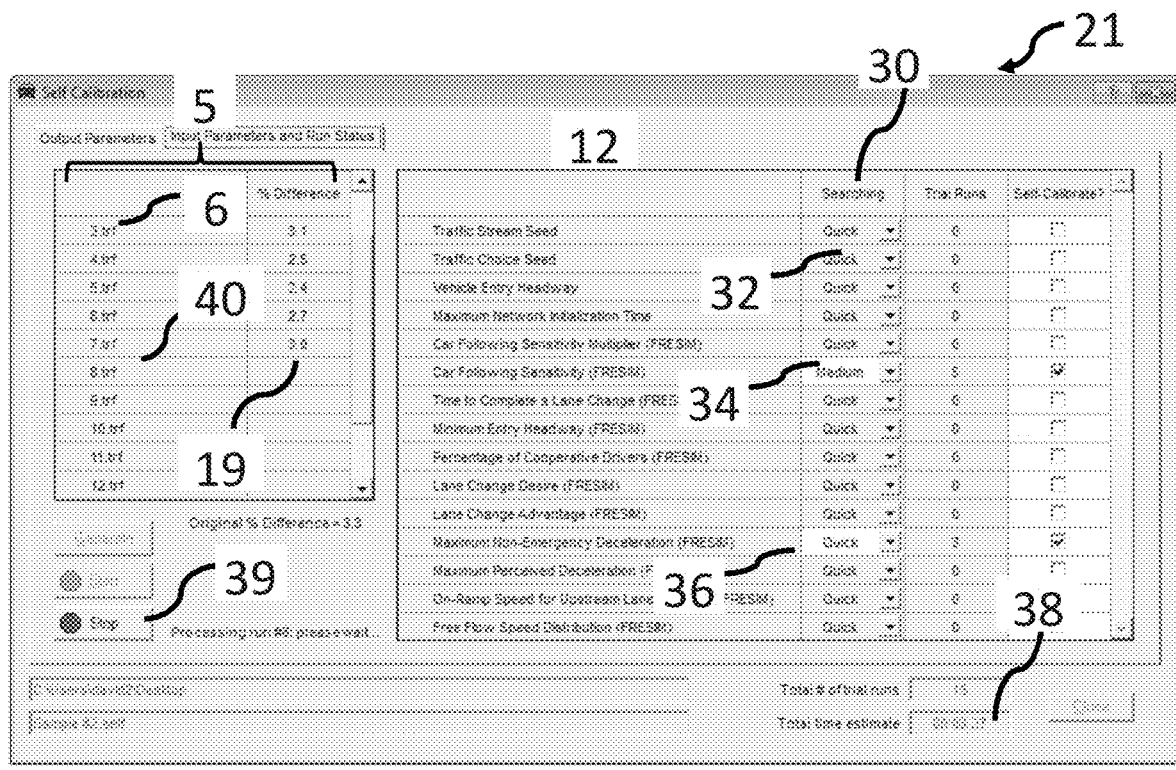
FIG. 4 shows one implementation of an Input Parameters and Run Status interface screen.

In a particular embodiment, a model that simulates traffic patterns can have specific input parameters, such as those shown, for example, in FIG. 4. FIG. 3 illustrates examples of some output parameters 14 that are typically generated by traffic simulation. A preliminary simulation run can be performed, to generate an initial set of simulated output measurements 16.

The output measurements 16 are then compared to "ground truth" values, which can be field measured or empirical values, user estimated values, or values obtained from another analysis tool, such as, for this example, a separate traffic analysis tool. In one embodiment, the output measurements 16 are then compared to empirical or real-world measured observations 18 for the same parameters. FIG. 3 illustrates an example of a computer interface screen showing a list of output parameters 14 selected for a traffic simulation model and the simulated output measurements 16 along with the empirical measurements 18 for the selected parameters. In a further embodiment, also shown in FIG. 3, the simulated output measurements 16 are compared to the empirical measurements 18 and a percent difference 19 between the two values is displayed. The preliminary simulation can indicate where the model deviates from real-world observations and provide information as to which parameters need to be calibrated.

By default, all output parameters have an equal effect on the overall percentage difference between modeled and measured performance. In other words, they are all given the same weight, i.e., 100%, by default. In a further embodiment, the output parameters can be weighted, to reflect their desired influence upon the calibration process. FIG. 3 shows a "% weighted column" 20 in which parameter weights can be viewed and/or adjusted.

Figure 14:
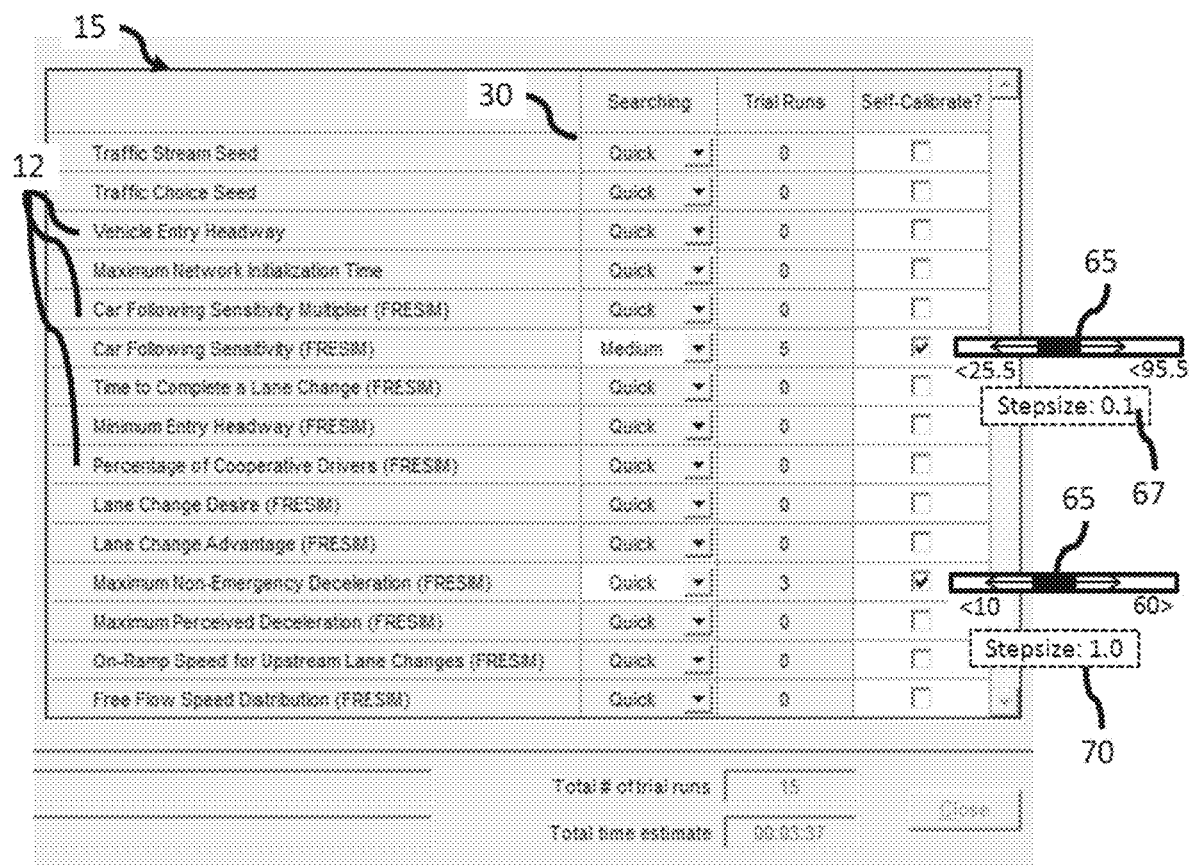
FIG. 14 is an example of a user-interface screen design for selecting calibration input parameters to be calibrated by the embodiments of the subject invention.
Figure 15:
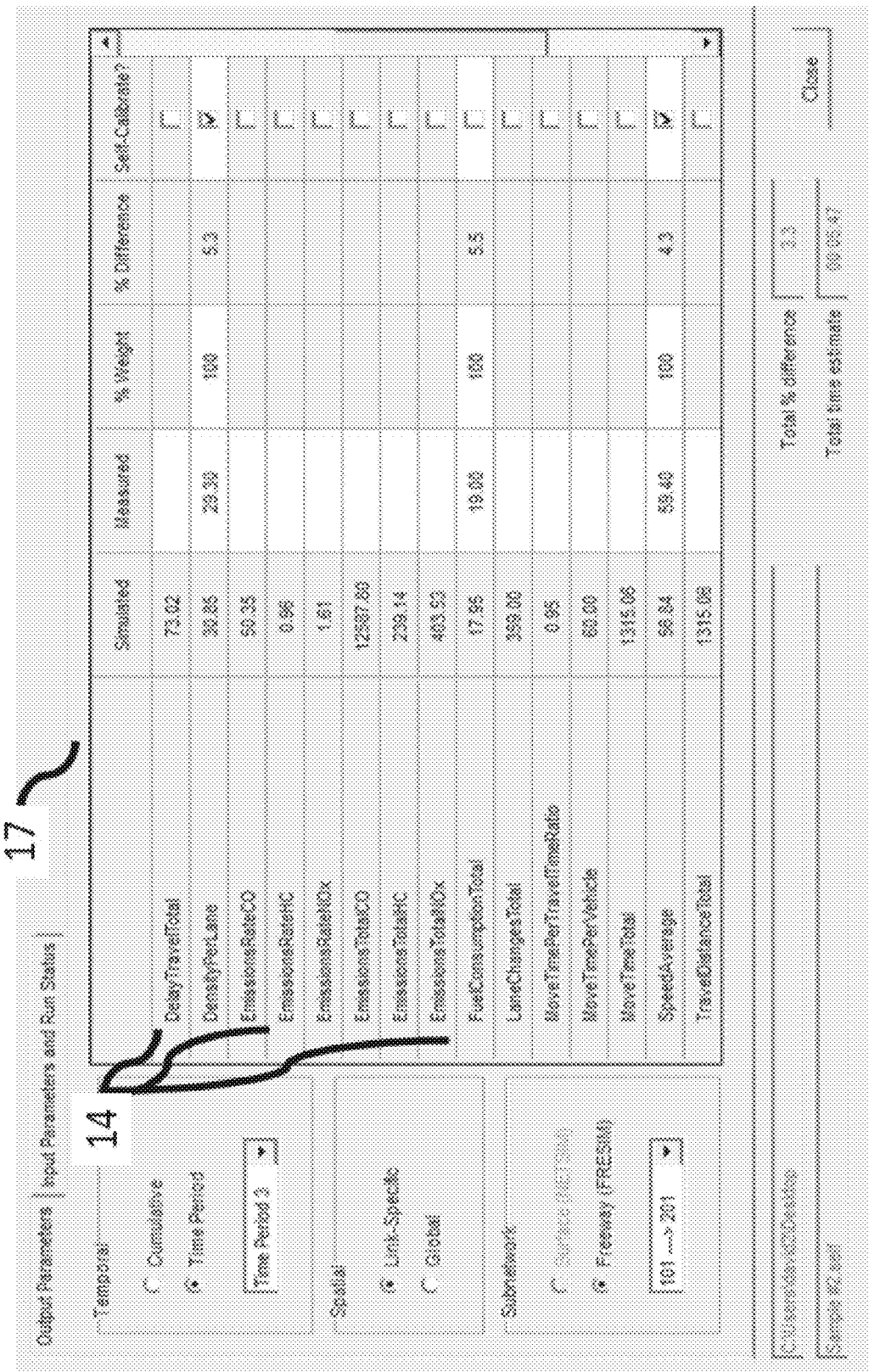
FIG. 15 illustrates an example of a user-interface screen listing a variety of selectable output parameters from which a user can chose one or more of interest for a particular calibration run.

Once an initial simulation has been conducted, selected input parameters can be calibrated. In one embodiment, a user determines which input parameters to calibrate, in order to minimize the % Difference 19, which is the difference between the model simulated results and the model generated value based upon ground truth values, like empirical data. FIG. 14 illustrates an example of an input screen that allows a user to select multiple input parameters to be calibrated. If certain input parameters only require calibration within subsets of the overall system, a user can also define 22 those subsets. FIG. 2 illustrates examples of model-simulated output parameters having a % Difference 19 of 7% when compared to actual, empirical, measured output parameters. FIG. 15 illustrates an example of a user-interface screen listing a variety of selectable output parameters 14 from which a user can chose one or more of interest for a particular calibration run.

Once a user has determined which simulated output parameters need to be corrected for accuracy, i.e., calibrated, the appropriate input parameters that affect the desired output parameters can be selected for calibration. In the example shown in FIG. 2, a user can choose to calibrate specific input parameters, such as, for example, driver aggressiveness, solar activity or meat consumption, within each, respective, model. FIG. 14 illustrates an embodiment of an input user interface screen that lists a variety of selectable input parameters 12 from which one or more can be chosen for calibration. A user interface (U/I) can be part of an apparatus that includes instructions stored on a computer readable storage media. Utilization of a user interface, as employed with the embodiments of the subject invention, can be conducted with any of one or more various input devices and output devices, such as, for example, touchscreens, keyboards, mice, external displays, speakers, and screens, and other devices suitable for inputting or outputting information as described herein, and combinations thereof.

Embodiments of the subject invention can also be used to facilitate sensitivity analysis (SA) for specific input parameters. SA has long been relied upon by professionals as a way to gain a better understanding of a system model, and to identify those input parameters that have the strongest impact on model results. Sensitivity analysis can allow input parameters not normally associated with calibration (e.g., desired free-flow speed, entry node volume, percent trucks, etc.) to be examined, in an automated manner, to determine if they have any specific impact on output results. The input parameters most commonly associated with calibration can also be quickly analyzed via automated SA as well.

With regard to output parameters generated by embodiments of the subject invention, a user can still select desired performance measures on the Output Parameters screen. In one embodiment, measured values that match the simulated values could be used. This can allow the percent difference between simulated and empirical values or ground truth values, prior to sensitivity analysis, to be displayed as 0.0 for existing conditions. This can provide the advantage of more clearly understanding the impact of a selected input parameter on the model results.

Figure 8:
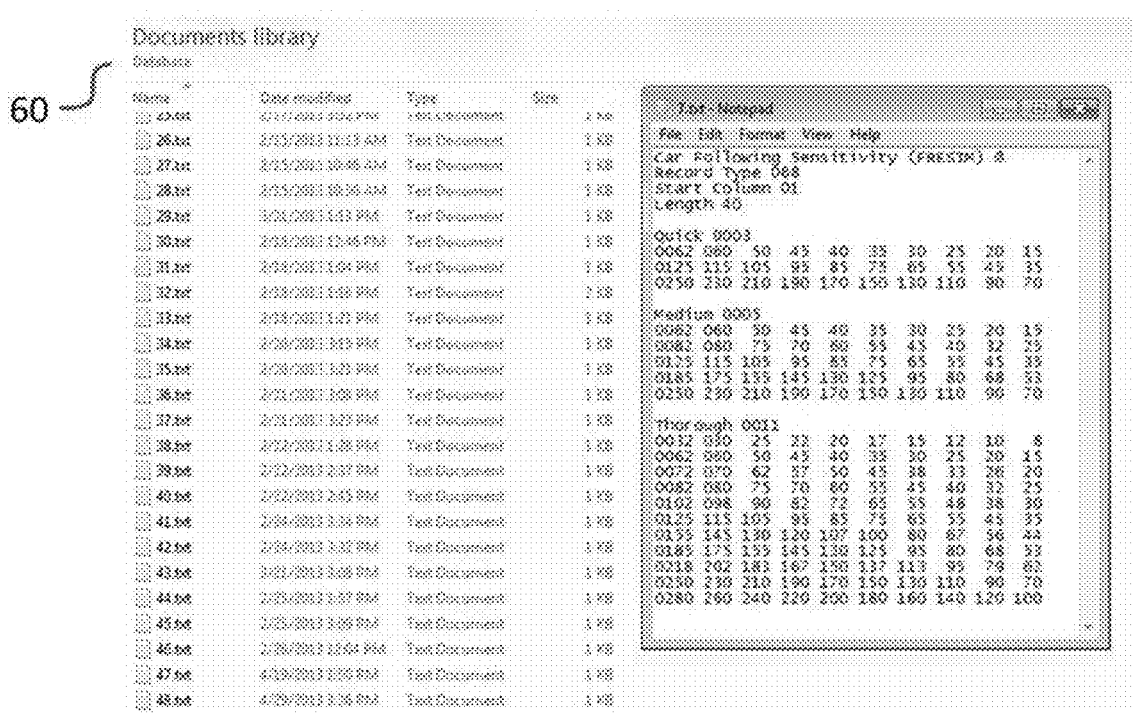
FIG. 8 shows a dialog box listing a database of values to be used with input parameters for self-calibration.
Figure 18:
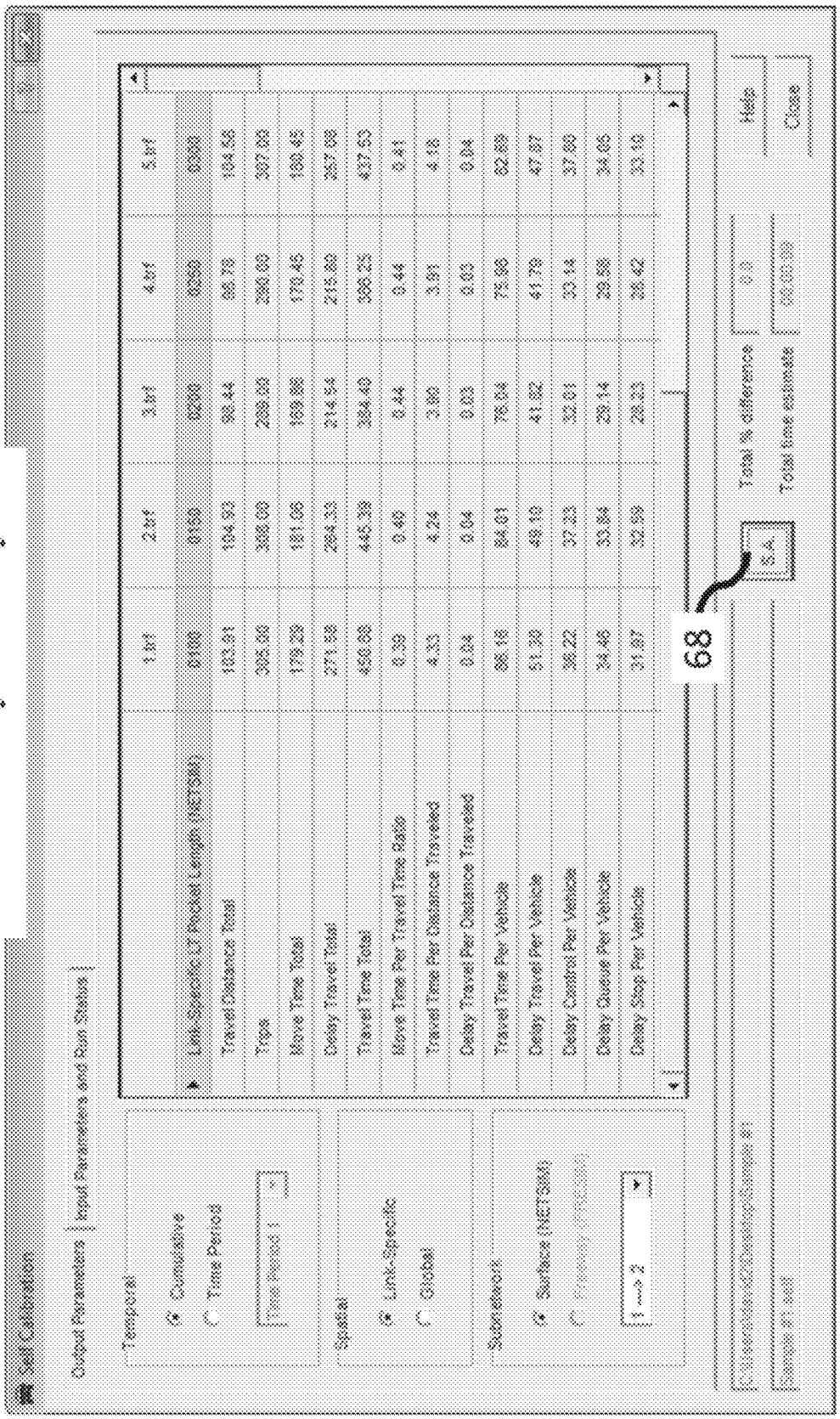
FIG. 18 illustrates one embodiment of a user interface screen for reviewing results of sensitivity analyses.

In one embodiment, the database 60 can be customized with specific input parameters. This can be accomplished by modifying, deleting, or adding to existing input parameters values. In a specific embodiment, a candidate data set 40, such as, for example, in the form of a text file, as shown in FIG. 8, containing values for a particular input parameter can be added to the database 60. Once this text file has been added to the database, that particular input parameter will then be available to select on the Input Parameters screen 15. After selecting that input parameter, sensitivity analysis can be performed by completing a calibration cycle. In further embodiment, the sensitivity analysis results can be viewed in a tabular format by going to the associated Output Parameters screen 17. In a further embodiment, the output parameters screen can include sensitivity analysis results selector 68 that, when invoked, will display the results of the sensitivity analysis. FIG. 18 illustrate a non-limiting example where a sensitivity analysis results selector 68 is a button on the output parameters screen. In a further embodiment, the sensitivity analysis results selector only becomes available after trial datasets have been generated on the Input Parameters screen. Advantageously, the sensitivity analysis feature of the subject invention allows a user to automatically contrast any of a variety of simulation input and outputs.

In one embodiment of the subject invention, a "directed brute force" (DBF) calibration method is utilized to calibrate specific input variables. A regular brute force (BF) calibration method conducts exhaustive trials, wherein it simulates every mathematically possible combination of input parameters. Such a method could be used with different models to determine which input parameter combinations (contained within candidate data sets 40) provide the most accurate simulation, when compared to measured output parameters. Those candidate data sets that most closely match the ground truth values, such as, for example, empirical results, can be isolated and used to conduct future simulations, to further refine or calibrate the model, or be used for predictive analysis. In effect, DBF calibration culls through all allowable input parameter values to determine which combination(s) of selected input variables, and their associated data sets, provide simulated output parameters that most closely match the measured output parameters, which are based empirical data or other types of ground truth values. This method has the advantage of searching completely through input parameter values in a regular and reproducible manner. As will be discussed below, this can be advantageous in predicting a run-time value for any given simulation. However, computer run-time requirements of this method can be overwhelmingly impractical, for a vast majority of real-world cases. Other search methods (e.g., genetic algorithms, downhill simplex, latin hypercube, hillclimb, gradient, Simultaneous Perturbation Stochastic Approximation (SPSA)) can require fewer trials than regular brute force searching, but may not provide the flexibility and practicality needed for most situations and the inherent time requirements can inhibit public acceptance of such calibration methods.

Figure 16:
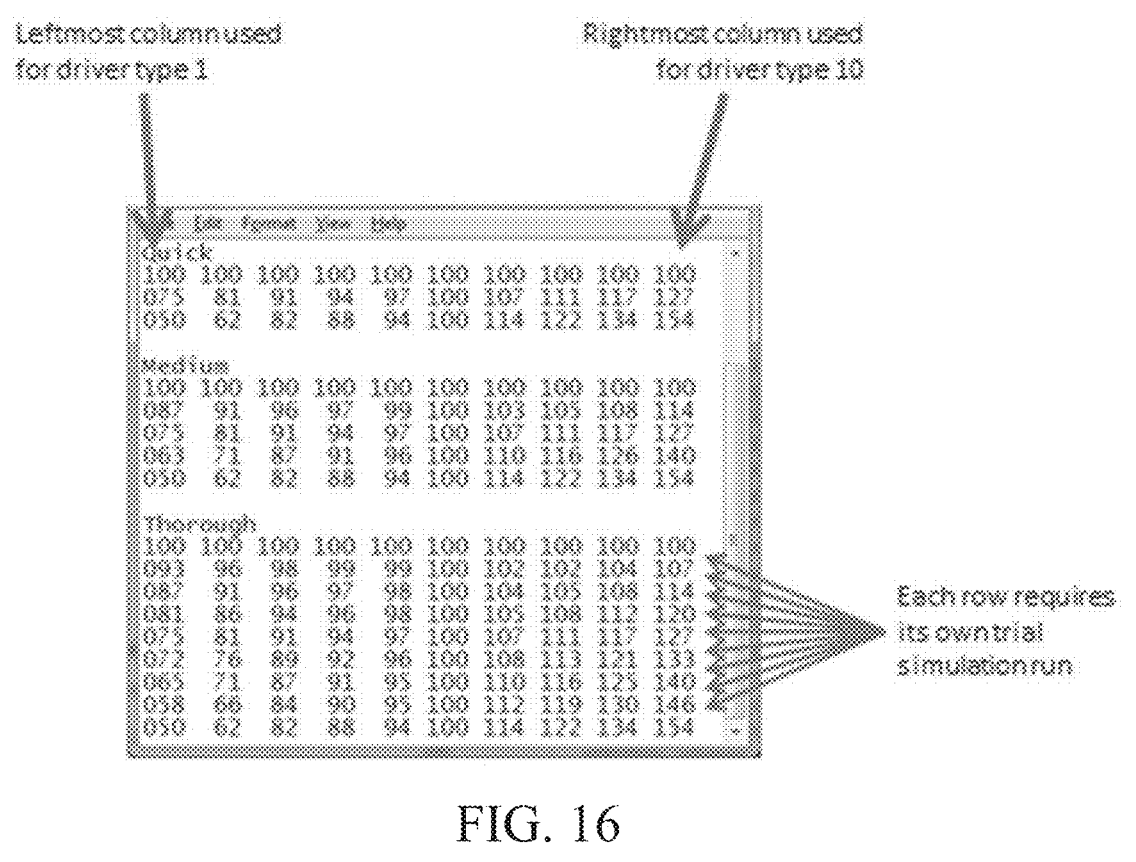

Implementations of the "directed" brute force (DBF) calibration method of the subject invention overcome these disadvantages by allowing a user to select the amount of calibration that will be conducted for each variable, thus allowing total control over the number of trials 5 and the accuracy of calibration performed on any selected input parameter. In one implementation, after an initial simulation has been conducted, as described above, a user will be presented with an output parameter calibration results screen 17 which displays information about selected output variables, such as shown, for example, in FIG. 3, that can be used to determine which of the selected output variables need to be calibrated. In one embodiment, an input parameter calibration selection screen 15 is provided, non-limiting examples of which are shown in FIGS. 4 and 14, so that a user can select for each input variable to be calibrated, the level 30 of brute force calibration desired for individual input variables, such as, for example, quick, medium, or thorough. This ability to select the level of calibration thoroughness allows a user to "direct" the amount of calibration desired for each parameter. In one embodiment, the selected level 30 can determine the number of trials 5 or searches conducted, using the pre-determined values provided in the database 60, that the calibration method will conduct. In one implementation, a user can select from quick, medium, or thorough calibration levels. FIG. 16 illustrates an example of database values selected for quick, medium, or thorough calibration, where successive levels entail a greater number of simulations. Each of these levels can be set to conduct any specific number of searches through the input parameter values within the database 60. In one embodiment, the calibration thoroughness is predetermined, such that the method will only conduct a designated number of trials for that level. For example, a low level search can conduct and analyze on just a few trials 5, a medium level can conduct and analyze more trials and a thorough level can conduct and analyze still more trials. FIG. 13 illustrates an example of a pre-run input parameter calibration screen 15, which can be used to initially select the input parameters to be calibrated. It is within the skill of a person trained in the art to determine the number of trials that each level will conduct. Such variations which provide the same function, in substantially the same way, with substantially the same result, are within the scope of the subject invention.

Figure 6:
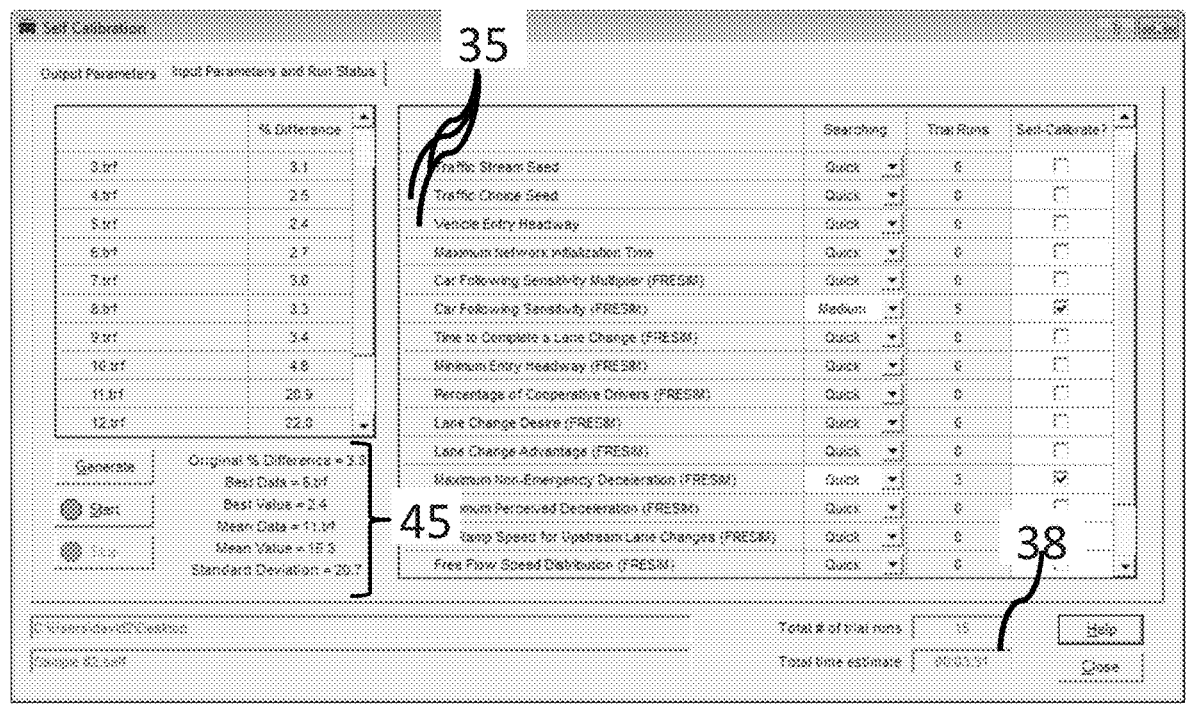
FIG. 6 shows an Input Parameters and Run Status interface screen at the conclusion of a run.

In one embodiment, shown, for example, in FIGS. 4 and 6, quick calibration 32 will conduct 3 trials, medium calibration 34 will conduct 5 trials and thorough calibration 36 will conduct 10 trials. In a further embodiment, the same or a different level of calibration can be selected from each input variable. For example, quick calibration 32 (3 trials) can be selected for a first input parameter, medium calibration 34 (5 trials) can be selected on a second input parameter, and thorough calibration 36 (10 trials) can be selected for a third input parameter. With this calibration strategy, there would be 150 different trials 5 that product 150 different candidate data sets 40 derived from the database 60 of trial values for each input parameter, i.e., 3 trials*5 trials*10 trials=150 candidate data sets. In a further embodiment, trial data sets are automatically archived by the model for future use. This can be accomplished by a variety of techniques, including, but not limited to, marking the data within each respective data file, extracting it or copying it to another file, saving it within another area of the same file, or saving virtual data sets within memory. A person with skill in the art would be able to determine how the trial data can be saved for future use.

In a further embodiment, random number seed generators are made available as input parameters subject to calibration, for the purpose of accommodating stochastic models. Stochastic models have the common characteristic of producing different output results when the random number seed is changed. Repeated analysis of a data set will produce identical results if the random number seed is not changed. Random number seed generators are often utilized in software and are well-known in the art. One embodiment of the subject invention utilizes at least one seed parameter default list 35. In a specific implementation for a traffic simulation model, three seed parameter default lists 35 are utilized. FIG. 6 shows a non-limiting example of a post-run input parameter calibration screen 21 that includes the ability to select an Entry Headway Seed; Traffic Stream Seed and Traffic Choice Seed files that contain default seed parameters that can be used with traffic simulation model embodiments of the subject invention.

In a further embodiment, the seed parameters default lists can be used for an initial self-calibration run to determine if individual trial 5 results may be "outliers". This can provide better statistical certainty and a fuller range of possible outcomes. One embodiment for utilizing the random number parameters is illustrated in Example 1, below.

Traffic simulators often contain random number seed (RNS) data entry, to analyze stochastic effects. Changing the RNS can influence driver such parameters as driver aggressiveness, driver decisions, headways between vehicles, etc. When only one simulation is conducted, the results can be misinterpreted as being typical, average real-world results. But, when analyzing unstable environments or situations, such as, for example, traffic conditions, numerous simulations (with different RNS) may be needed to provide sufficient confidence in the final results. This can present a dilemma for automated, simulation-based optimization calibration. For example, if 10 simulations (with different RNS) were needed for each combination of calibration inputs, this would drastically inflate computer run times. The embodiments of the subject invention provide some assistance in addressing uncertainty and randomness. At the top of FIG. 14, it can be seen that RNS inputs (Traffic Stream Seed, Traffic Choice Seed, etc.) are available for selection, similar to the calibration inputs. These RNS inputs can be located at the top of the list to encourage end-users to select these specific types of parameters to analyze randomness. This allows simultaneous optimization of RNS and calibration inputs; but run times could be high, and results difficult to interpret.

In a further embodiment, to manage randomness when run times are high, "pre- and post-" analysis is one option. Prior to conducting a calibration run, a pre-calibration run could be performed to "calibrate" and import a RNS producing the most "average" results. These RNS could then remain in effect during the standard calibration run. After importing the optimized inputs, a post-calibration run could be perforated, to determine whether the solution was stable for different RNS. Pre-calibration stochastic analysis would increase odds of a stable final solution; but if unstable, the "average" RNS could be imported at this time. The sequential technique of "pre- and post-" stochastic analysis is not a perfect strategy because randomness is ignored during a calibration run. Another option can be to perform multiple optimizations, but manually change the RNS before each calibration run. For example, after five optimizations one could assess variance of the five final objective function values, and then import calibrated settings that produced the median final objective function value. The important point is that embodiments of the subject invention allows end-users to control how much stochastic analysis is performed; whether that involves sequential optimizations, or whether that involves reduced levels (Quick/Medium/Thorough) of RNS replication.

The ability to select levels of calibration thoroughness, to be conducted within the database 60 for each input parameter, advantageously provides a user with control over the level of calibration necessary or desired for a particular simulation scenario. By selecting the calibration level for each input parameter a user can also control the amount of time to be dedicated to each automated calibration scenario, as described in FIG. 2. In one embodiment, the model can generate an estimate of the time required to generate results for a particular input scenario. In a particular embodiment, the time required to run the initial simulation, conducted prior to calibration, is multiplied by the number of trials that would be necessary based upon the number of input parameters and calibration levels 30 selected. Thus, in the example provided above, the initial simulation time can be multiplied by 150 to obtain an estimate of the amount of time it will take to run the selected simulation scenario with 150 trials.

In a further embodiment, a calibration method that employs a DBF algorithm can generate the time estimate prior to the start of self-calibration. This provides a user with the ability to alter the self-calibration scenario, such as, for example, by altering the search levels selected for each parameter, so as to change the time estimate. Thus, if a user can tolerate self-calibration with a longer time estimate, changes can be made to the search level(s) selected for each input parameter 12, perhaps selecting thorough calibration 36 for more of the parameters. Likewise, if the time estimate for a self-calibration is too long, calibration levels and/or number of selected input parameters can be adjusted to reduce the time estimate. FIGS. 4 and 6 illustrate embodiments of interface screens on which a time estimate 38, generated by the calibration method, is provided. FIG. 4 illustrates an embodiment of an interface which shows a time estimate 38 generated for 15 trial runs for selected parameters prior to starting the self-calibration process.

In a further embodiment, after an end-user chooses input parameters and output parameters, any known optimization algorithm could be employed during the calibration process. A non-limiting example would be a powerful heuristic algorithm (e.g., genetic algorithm (GA), simulated annealing, and downhill simplex) that requires an excessive and unpredictable number of trials, and thus may not be well-suited to computationally expensive simulations. Faster heuristics (e.g., hill-climbing, gradient methods, and greedy algorithms) have been known to produce poor solutions. By contrast, the embodiments of the subject invention can be specifically used to calibrate time-expensive simulations. End-users can pro-actively customize trial values and run times for directed brute force (DBF) searching.

As mentioned above, the difference between brute force (BF) and "directed" brute force (DBF) based simulations are that DBF can uses a restricted set of trial values within a given database 60. In the earlier example Quick searching (3 trials) on one input parameter, Medium (5 trials) on a second, and Thorough (10 trials) on a third would lead to simulation that provides 3*5*10=150 possible solutions. The number of trials for Quick, Medium, and Thorough can be flexible adjustable in the embodiments of the subject invention. The database 60 can offer intelligent defaults, but also allow customization. Embodiments of the subject invention are particularly useful with DBF.

In an alternative embodiment, default values for use with input parameters could be determined on a sliding scale, such that a range of values can be pre-selected for one or more input parameters. There are a variety of methods by which this can be accomplished. In one embodiment, there can be provided a selection device 65, such as, for example, an input slider display, that allows a user to select from a large range of values a smaller sub-range of values from which input values can be selected during calibration. FIG. 14 illustrates one example of input sliders 65 being provided for those input parameters selected for calibration. In a further embodiment, each constrained sub-range for a particular input parameter can be set with default incremental step-sizes 67 to be used within the constrained range. For example, in FIG. 14, the input parameter entitled "Car Following Sensitivity" could be set to test values in the selected range at incremental steps of 0.1 increments. Likewise, the input parameter entitled "Maximum Non-emergency Deceleration" could be set to test values in the selected range at incremental steps of 1.0. In one embodiment, the step-size 67 for range selected with the input slider 65 can be pre-determined and set within the calibration software. In an alternative embodiment, the step-size 67 for each selected range can also be selected by a user. By way of non-limiting example, FIG. 14 illustrates a step-size dialog box 70 in which a user can insert the stepsize to be used. A person with skill in the art would be able to determine any of a variety of methods by which a range can be selectable by a user, as well as a step-size. Such variations are within the scope of this invention.

FIG. 6 illustrates one embodiment of a user-interface (UI) software screen, for selection of inputs to be calibrated. This UI screen loads the input parameter database at runtime; thus calibrating a different simulation product can require switching databases. In one embodiment, an end-user can select, such as with a check mark, each input parameter to calibrate. In a further embodiment, the user can further select a calibration thoroughness level (e.g., Quick, Medium, or Thorough) for each input selected.

When directed brute force (DBF) optimization is in effect, a total run time estimate can be shown at the bottom of the screen. Advance knowledge of computer run times can be advantageous. For example, if an end-user chose Quick searching (3 trials) on one input parameter, Medium searching (5 trials) on a second, and Thorough searching (10 trials) on a third, run time from an initial simulation could be multiplied by 150 (i.e., 3*5*10), to produce a reasonable estimate. If a longer run time can be tolerated, a more thorough searching on some parameters can be selected, or the number of parameters can be increased. If the estimated run time were uncomfortably high, the calibration levels can be adjusted or certain parameters can be removed from the optimization.

When Simultaneous Perturbation Stochastic Approximation (SPSA) optimization is in effect, run time estimates may not be possible unless based on the max allowed number of simulations. However, by allowing the end-user to easily and dynamically adjust range limits (continuous SPSA) or trial values (discrete SPSA) for any input parameter, SAS-CO's input data UI is expected to augment the efficiency of SPSA.

Simultaneous Perturbation Stochastic Approximation (SPSA) algorithm has gained favor as an algorithm for efficient optimization of complex simulations. When an SPSA optimization algorithm is employed with embodiments of the subject invention, run time estimates may not be possible unless based on the maximum allowed number of simulations. However, by allowing the end-user to easily and dynamically adjust range limits (continuous SPSA) or trial values (discrete SPSA) for any input parameter, the embodiments of the subject invention can augment the efficiency of SPSA. For the discrete form of SPSA, the database 60 can be made to specify explicit trial values for each input parameter 12. For the continuous form, the database 60 can adjust range limits for each input parameter.

Figure 39:
FIG. 39 illustrates one embodiment of slider controls. In this example, the slider controls are used to dynamically adjust the range limits for times and includes checkboxes to select cost ranges.

An alternative embodiment of the input parameter database would involve software controls (e.g., sliders, checkboxes), to easily reduce the number of trial input values used during calibration. FIG. 39 illustrates an example of slider controls currently used in the art to dynamically adjust the range limits of inbound and outbound flight times, plus checkboxes to select price ranges. Similar controls could be used to dynamically adjust range limits of calibration input parameters, and/or specify a step-size between range limits.

FIG. 13 illustrates one embodiment of the operation of the calibration method of the subject invention. As shown, when the run is launched, the selected optimization algorithm (e.g., DBF or SPSA) proceeds to minimize the objective function, by testing acceptable input values from the input data UI. Throughout the run the discrepancy between simulated and field-measured results, a.k.a., the objective function, become lower and lower, thus indicating a better-calibrated model. In one embodiment, a post-run input parameter calibration interface screen 21 is provided that shows the results of each trial 5 conducted by the self-calibration process as it operates. FIG. 4 illustrates an example of this interface screen on which a file name 6 representing each candidate data set 40 generated by each trial 5 run is listed, along with the % Difference 19, i.e., difference between simulation and empirical results, for each candidate data set 40. This allows an end-user to observe % Differences as they are generated by the model for a particular candidate scenario. In the example shown in FIG. 4, the self-calibration method of the subject invention has only generated results through trial 7 of the 15 possible trials that it is scheduled to complete.

In a further embodiment, a user is provided with the option of aborting a self-calibration process during operation. Thus, if during observation of the self-calibration results, it becomes apparent that continued execution of the self-calibration process is unnecessary, a user can select to abort the process before completion. This can save time and resources. In a particular embodiment, an interface screen can include any of a variety of control features that a user can select to abort the self-calibration process. FIG. 4 illustrates an example of a post-run input parameter calibration interface screen 21 with a stop button 39 that can be used to abort a self-calibration process.

Once a self-calibration cycle has been completed, a user can observe the trials 5 and select the candidate data set 40 providing the most accurate correlation to the ground truth values, such as empirical data, i.e., field-measured data. FIG. 2 illustrates an example of how the calibration method of the subject invention can produce candidate data sets, which produce model-estimated results, which are sometimes closer to field-measured or empirical values. Input parameter values from these candidate data sets can then be imported to the simulation model, for more accurate modeling. More specifically, the candidate data sets best correlated to the empirical data can be selected, and archived or uploaded, for use in future modeling.

Figure 11:
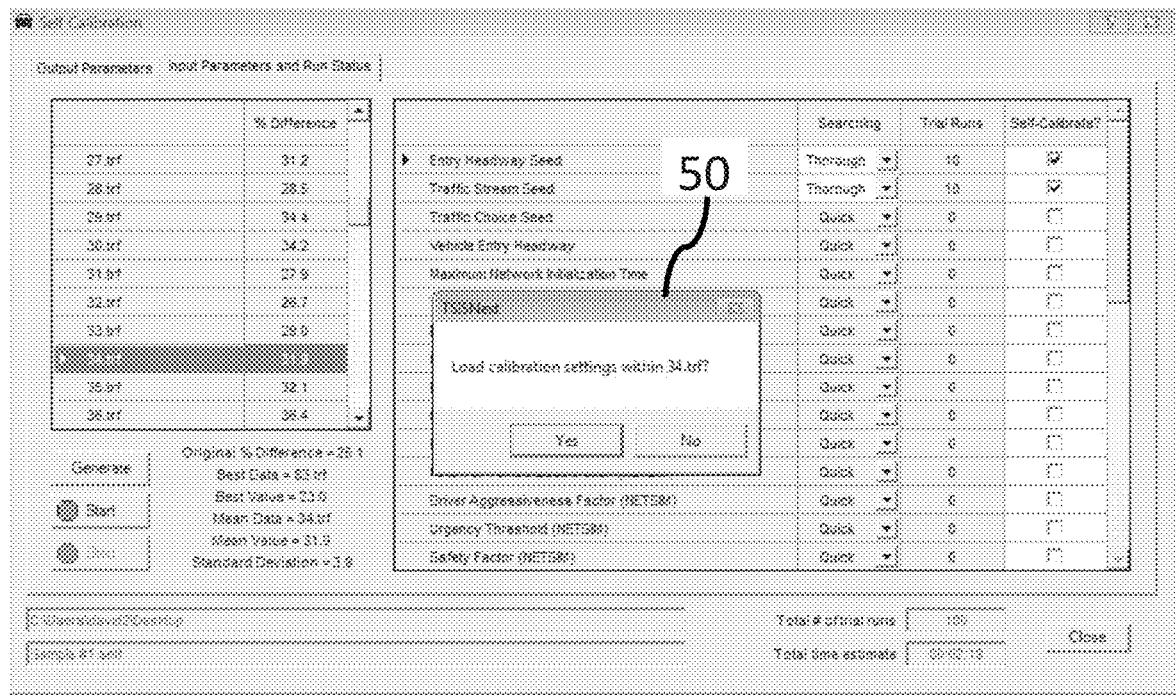
FIG. 11 shows an input parameter interface screen with a dialog box to select loading of one set of candidate values for a particular trial, i.e., the 34.trf trial.

In one embodiment, a user can be provided with the option of loading particular candidate trial values. FIG. 11 illustrates an example of post-run input parameter calibration interface screen overlaid with a "load calibration settings" dialog box 50, in which a user can choose to upload individual (candidate) trial values. With this example, if the user selects "yes" the candidate values from the file named "34.trf" will be uploaded to the simulation model.

Once a simulation or trial has been conducted, simulated output parameter values can be compared to field measured or empirical output values, and a Difference value 19 can be generated for that particular trial. In one embodiment, a Difference Value is displayed as a percentage of the difference between the simulated and empirical output values. FIG. 3 illustrates one example where the Difference Value is represented as % Difference. FIGS. 4 and 6 illustrate a list of trials 5 in the process of being conducted, for which those that are completed a % Difference has been calculated. In a further embodiment, various statistical analyses can be conducted on the Difference values 19 to provide a user with information about overall results of the self-calibration. These analyses 45 can be provided to the user, for example, as shown in FIG. 6. By way of example, the Difference values 19 can be analyzed to determine which candidate data set provided the closest fit to the measured output parameters, what is the mean value of the Difference for all of the trials, average standard deviation between the trials, and other information that would be relevant to a user. A person with skill in the art would be able to determine any of numerous types of statistical analyses that can be conducted with the Difference values 19 or the underlying candidate data sets 40. Such variations are within the scope of the subject invention.

Figure 9:
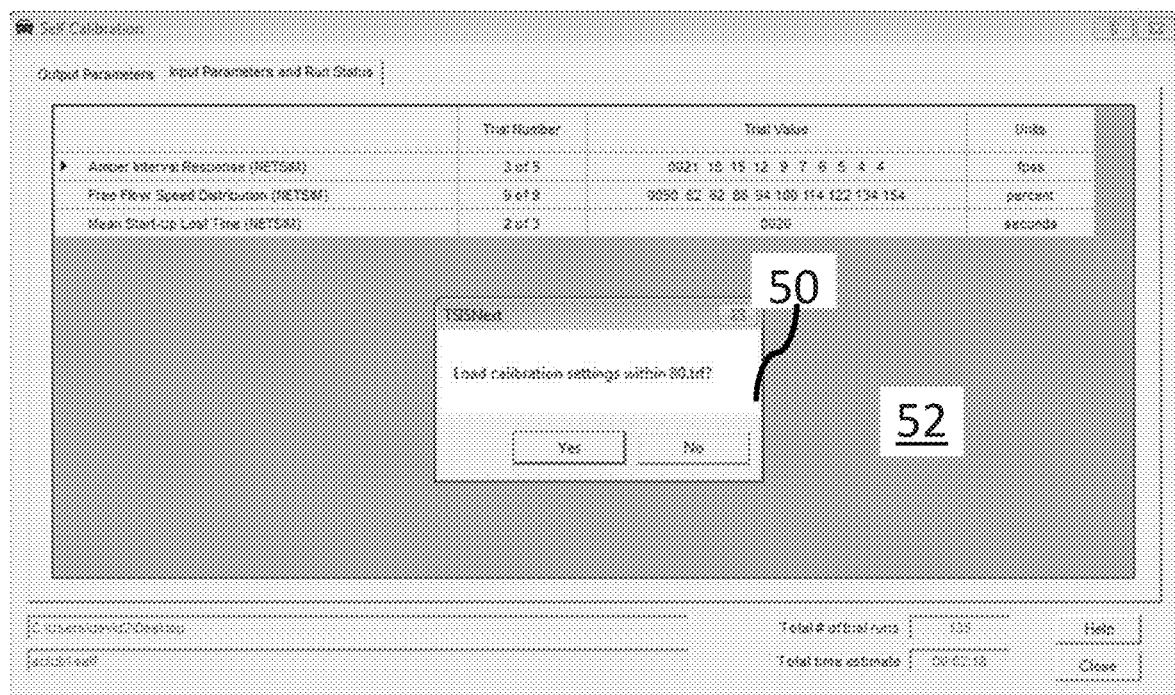
FIG. 9 shows a pop-up dialog box that allows a user to input whether existing calibration settings shown on the interface screen can be imported for the selected parameters.

Prior to uploading to the simulation model a particular candidate data set, it can be beneficial for a user to review the input parameter values contained within the candidate data set. In one embodiment, users can manually search the one or more individual data set(s) to review candidate or calibrated parameter values therein. However, this can require a user to spend several minutes or longer selecting and opening individual data sets. Another embodiment of the subject invention allows a user to select and simultaneously view specific or even all of the candidate data set values for a selected calibration run. This can provide an end-user with more information about which input parameter values produced the best fit between model-estimated and field-measured or empirical observations. Additionally, this can allow a user to inspect various candidate values without necessarily importing them to the simulation model; which could aid in their understanding of the calibration process, as well as provide information about how to create further, more refined, self-calibration scenarios. FIG. 9 illustrates a candidate value interface screen 52 showing the actual values for a particularly selected files called "80.trf" and a "load calibration settings" dialog box 50 thereon.

In one embodiment, a candidate value interface screen 52 can be displayed when a user selects a particular simulation or trial 40, such as one shown in the example in FIG. 6 or FIG. 11. In a further embodiment, the "load calibration settings" dialog box 50 can be displayed on the candidate value interface screen 52, an example of which is shown in FIG. 9. After reviewing the candidate data, the "load calibration" dialog box provides a user with the option of choosing whether the candidate data should be uploaded or not. In a further embodiment, the self-calibration method can be repeated sequentially after importing prior calibrated values, to continually refine accuracy while minimizing run times.

Embodiments of the directed brute force calibration method described herein can permit a simulation model to be calibrated to a desired accuracy. In a specific implementation, the calibration method can be used to customize a traffic simulation model for a particular area or region or even a particular street. This can increase the effectiveness and usability of a model, while at the same time increasing the accuracy of the model for a given area.

Following are examples that illustrate procedures for practicing various embodiments of the subject invention. These examples are provided for the purpose of illustration only and should not be construed as limiting. Thus, any and all variations that become evident as a result of the teachings herein or from the following examples are contemplated to be within the scope of the present invention.

Example 1: Method of Self-Calibration of the TSIS-CORSIM Traffic Simulation Model TSIS-CORSIM is a microscopic traffic simulation software model for signal systems, highway systems, freeway systems, or combinations thereof. CORSIM (CORridor SIMulation) is an integrated set of two other microscopic traffic simulation models. The first, NETSIM, simulates traffic on urban streets and the other, FRESIM, simulates traffic on highways and freeways. TSIS (Traffic Software Integrated System) is a development software program that enables a user to conduct traffic operations analysis. TSIS allows a user to customize a set of tools, define and manage traffic analysis projects, define or create traffic networks and conduct traffic simulation analyses for interpretation. The following example is specifically directed to an implementation of the subject method for calibration of the TSIS-CORSIM program.

Overview:

The TSIS-CORSIM self-calibration process is managed from TSIS Next, which is one of the available "front-end" interface applications for CORSIM simulation. The self-calibration feature also requires build 514 (or higher) of the CORSIM simulation engine. Before initiating self-calibration, a user should load a CORSIM data set (*.TRF) into TSIS Next; and should perform at least one standard CORSIM run from within TSIS Next, to generate the simulation outputs necessary for calibration. If a user a user wishes to calibrate time period-specific outputs, in addition to, or instead of, cumulative outputs, a set of expanded CSV files should also be generated; which can be generated by turning on the checkboxes under Options>Preferences>Output Files, prior to performing a CORSIM run.

The self-calibration features can be launched in TSIS Next by clicking on the Self-Calibration toolbar icon, or by selecting Run>Self-Calibration, or by right-clicking on a link in the Map View and selecting Self-Calibrate. The Output Parameters interface screen is shown in FIG. 3, and will be described first. The Input Parameters and Run Status interface screen will be illustrated and described later.

Simulated performance measure values, from the most recent run, are automatically displayed for easy reference. Field-measured values can be entered for any number of output parameters provided on the list. Field-measured values may be entered for any temporal setting (cumulative and/or time period-specific), and for any spatial setting (global and/or link-specific). Priority weightings may be specified for any of the output parameters, if desired. Link-specific calibration settings can be accessed, or specified, by right-clicking on a link in the Map View. Overall percent difference, between field-measured values and simulated values, is automatically displayed for easy reference. Finally, user-specified calibration settings are automatically archived (within <user_filename>.self).

The Input Parameters and Run Status interface screen is shown in FIG. 4, and will be described next.

A user can choose to calibrate any number of input parameters provided on the list. Freeway input parameters are not displayed for surface-only networks, and vice-versa. Combined surface-and-freeway networks will present both FRESIM and NETSIM input parameters for selection. The amount of searching (Quick, Medium, or Thorough) can be selected for each input parameter. The resulting number of candidate "trial" values is then displayed next to each input parameter. A number of chosen input parameters, together with the amount of searching for each parameter, combine to produce the estimated run time, displayed at the bottom of the interface screen. The estimated run time is a crucial element; because it allows a user a user to choose their own tolerable run time, prior to the run. When the number of chosen input parameters is increased, or when the amount of searching is increased, the estimated run time increases simultaneously.

Therefore, a user can use judgment in choosing input parameters and search levels, which can improve their model accuracy within a reasonable amount of time. For example, in surface-street networks that do not have permissive left turns in them, Permissive Left-Turn Acceptable Gaps (NETSIM) should not be chosen for self-calibration, as this will blow up run times without improving model accuracy.

Figure 5:
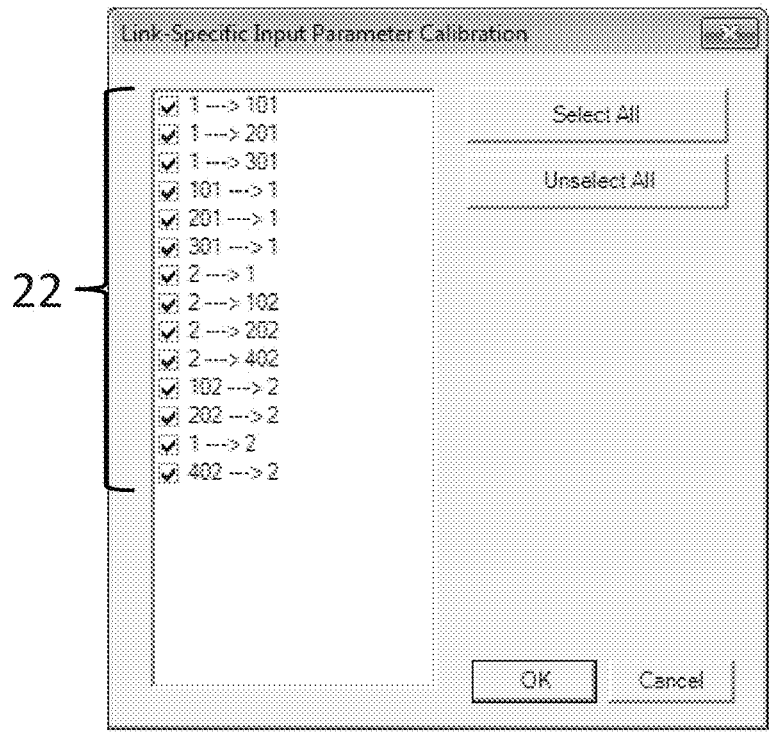
FIG. 5 shows one implementation of a pop-up dialog box used to calibrate a local subset of input parameter values within a model, as opposed to globally adjusting all values of a given input parameter. Here it is shown that CORSIM input parameters Mean Queue Discharge Headway (NETSIM), and Car Following Sensitivity Multiplier (FRESIM), can be calibrated in specifically chosen areas of the traffic network.

CORSIM input parameters for Mean Queue Discharge Headway (NETSIM) and Car Following Sensitivity Multiplier (FRESIM) are sometimes calibrated to contain unique values on certain links, and in certain areas of the traffic network. Because of this, the pop-up dialog shown in FIG. 5 is provided for these two parameters, to allow calibration on some links but not others.

Regarding the Run Status section of the interface screen, the Generate button is used to create trial data sets, prior to the self-calibration run.

Scenario: An end-user chooses Quick searching (3 trials) on one input parameter, Medium searching (5 trials) on a second input parameter, and Thorough searching (10 trials) on a third input parameter, which would generate 3*5*10=150 data sets, according to the directed brute force methodology.

The Start button is then used to initiate the self-calibration run, during which the percent difference for each trial run is displayed in real-time. The Stop button can be used to abort the run prior to completion, if desired. The revised Input Parameters and Run Status interface screen is shown again, as illustrated in FIG. 6, but this time at the conclusion of a run.

After the self-calibration run is completed, some of the trial runs may exhibit percent differences lower than the original percent difference, thus indicating a better-calibrated traffic network. These trial data sets are then available for further use in the SelfCalibrate folder, which is a subfolder of the folder containing the original data set. Also following the self-calibration run, the mean value and standard deviation are displayed. The standard deviation provides a measure of model sensitivity to the input parameters that were just chosen and tested. Higher values of standard deviation indicate model results that were highly sensitive to the chosen input parameters.

Automatic Importing of Calibration Settings

Calibration settings can be automatically imported from specific trial datasets, if desired. This can be done by clicking on the name of any trial dataset, and a pop-up box, such as shown, for example in FIG. 7, will ask whether or not the calibration settings for that dataset should be imported. This process is also demonstrated in the tutorial exercises.

Database of Input Parameters for Self-Calibration

The database of input parameters for self-calibration is shown in FIG. 8.

By default, this database contains a few dozen preset input parameters within a few dozen text files. The default list of calibration input parameters is shown below. This default list may change (sequence and/or content) in future software versions.

1. Entry Headway Seed
 2. Traffic Stream Seed
 3. Traffic Choice Seed
 4. Vehicle Entry Headway
 5. Maximum Network Initialization Time
 6. Car Following Sensitivity Multiplier (FRESIM)
 7. Car Following Sensitivity (FRESIM)
 8. Time to Complete a Lane Change (FRESIM)
 9. Minimum Entry Headway (FRESIM)
10. Percentage of Cooperative Drivers (FRESIM)
11. Lane Change Desire (FRESIM)

12. Lane Change Advantage (FRESIM)
13. Maximum Non-Emergency Deceleration (FRESIM)
14. Maximum Perceived Deceleration (FRESIM)
15. Time to Complete a Lane Change (NETSIM)
16. Deceleration Reaction Time (NETSIM)
17. Minimum Lane Changing Deceleration (NETSIM)
18. Mandatory Lane Change Deceleration (NETSIM)
19. Discretionary Lane Change Deceleration (NETSIM)
20. Lead Vehicle Deceleration (NETSIM)
21. Follower Vehicle Deceleration (NETSIM)
22. Driver Aggressiveness Factor (NETSIM)
23. Urgency Threshold (NETSIM)
24. Safety Factor (NETSIM)
25. Percentage of Cooperative Drivers (NETSIM)
26. Minimum Lane Change Headway (NETSIM)
27. Maximum Lane Change Headway (NETSIM)
28. Lane Change Distance (NETSIM)
29. Queue Discharge and Lost Time Distribution (NETSIM)
30. Mean Queue Discharge Headway (NETSIM)
31. On-Ramp Speed for Upstream Lane Changes (FRESIM)
32. Left-Turn Jumpers (NETSIM)
33. Turning Speed (NETSIM)
34. Probability of Joining Queue Spillback (NETSIM)
35. Probability of Left-Turn Lagger (NETSIM)
36. Near-Side Gap Acceptance at a Sign (NETSIM)
37. Far-Side Gap Acceptance at a Sign (NETSIM)
38. Amber Interval Response (NETSIM)
39. Permissive Left-Turn Acceptable Gaps (NETSIM)
40. Permissive Right-Turn Acceptable Gaps (NETSIM)
41. Pedestrian Delays during Weak Interaction (NETSIM)
42. Pedestrian Delays during Strong Interaction (NETSIM)
43. Free Flow Speed Distribution (NETSIM)
44. Free Flow Speed Distribution (FRESIM)
45. Distribution of Lane Change Distance (NETSIM)
46. Driver Familiarity with Paths (NETSIM)
47. On-Ramp Anticipatory Lane Change Distance (FRESIM)
48. Off-Ramp Reaction Distance (FRESIM)
49. Mean Start-Up Lost Time (NETSIM)

The input parameter database can be customized by a user if desired. These text files can be created or edited quickly, usually within minutes, and are automatically loaded by the program at run time. By changing the numeric file names, a user can change the order of input parameters displayed on-screen. By deleting certain text files in the database, a user can remove input parameters from the list. By changing the numbers inside the text files, a user can re-define the amount of searching associated with Quick-Medium-Thorough, or change the existing trial values themselves. To do this, a user would often need to refer to the CORSIM Reference Manual, to access the definition of CORSIM data formats. Adding text files to the list could add to the list of input parameters; but the current program is designed to handle either data types in the preset database, or data types already present in the original data set. For example, if a user wishes to calibrate data type 150 for HOT lanes, then data type 150 must be present in the original data set, because data type 150 is not included in the default database of input parameters.

Data types (a.k.a. record types) available in the default database are as follows: 2, 11, 20, 68, 70, 81, 140, 141, 142, 143, 144, 145, 146, 147, 152, 153.

A user can exercise judgment with regard to the random number seeds (vehicle entry headway, traffic choice, traffic flow), which sit atop the default list of input parameters. If these seed parameters are not included in a self-calibration run, it is possible that some of the individual trial results may be "outliers". For better statistical certainty, it can be helpful to perform random number seed "calibration" at the appropriate times, to observe a fuller range of possible outcomes. This recommended procedure is illustrated in the Tutorial Examples section.

The calibration software allows users to observe all candidate data values at a glance, for any trial. Typically, a user can manually search one or more datasets, to review the candidate or calibrated parameter values provided within each dataset. FIG. 11 shows an interface screen on which candidate values for the three parameters in the 80.trf trial data set are displayed. The calibration settings dialog box shown in FIG. 11 allows a user to decide whether to upload the candidate values. By selecting "yes" in the pop-up dialog box, the calibration method will continue using the pre-set candidate values. If "no" is selected, a user will have the option of editing the candidate values.

Example 2: Tutorial for Calibration of Surface Street Simulation

Figure 10:
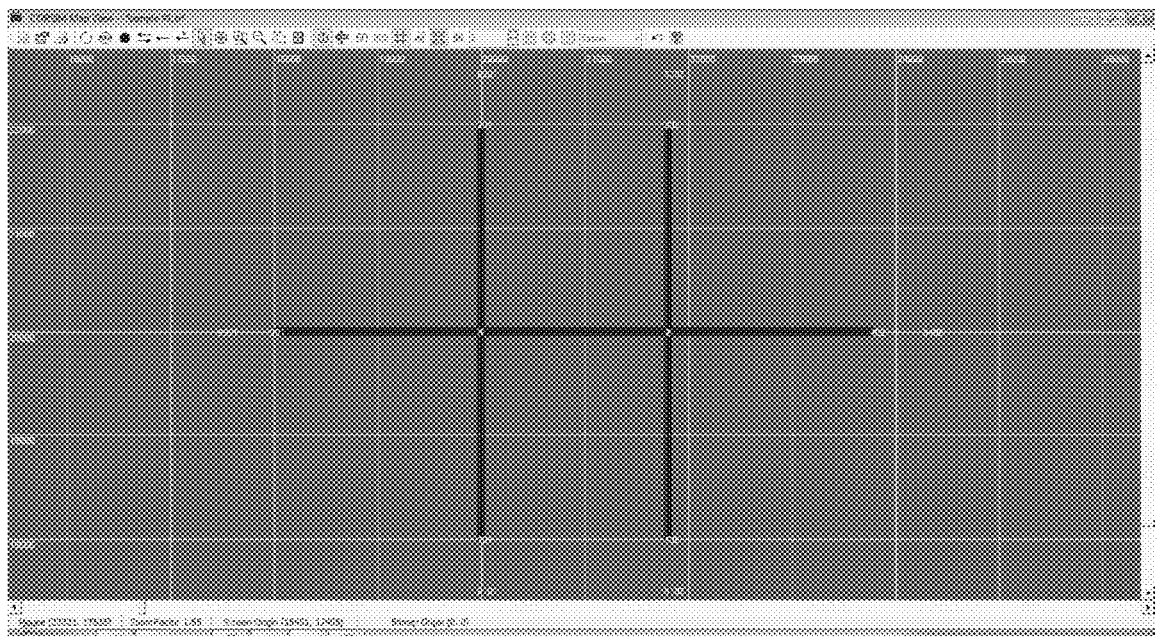
FIG. 10 shows an example of simple link-node geometry for a simple surface-street section with two signalized intersections separated by 1800 feet. Example 5 describes the calibration of this particular example.

The first tutorial example is a simple surface-street section with two signalized intersections. The intersections are separated by 1800 feet. The volume, timing, and laneage details were derived from a 2010 Highway Capacity Manual example problem, in which access points between the intersections were deleted. The simple link-node geometry is shown in FIG. 10.

Before beginning the normal self-calibration runs, it would be advisable to perform some preliminary random number seed analysis, to determine whether the simulated performance measures actually represent non-typical results. However, field-measured performance measure values should be entered prior to any type of analysis. The steps to set up a preliminary random number seed analysis are as follows:

Launch ISIS Next.
Open Sample #1.trf.
Turn on the following checkbox: Options>Preferences>Output Files>After CORSIM runs, copy OUT/CSV files to the TRF file folder.
Perform one preliminary CORSIM simulation run by clicking on the "Run CORSIM" toolbar icon.

Next, field-measured values are entered in the Output Parameters interface screen. The values to be used for this exercise are listed below. These values can be entered by clicking on the "Self-Calibration" toolbar icon, and then switching between links using the combo box; or by right-clicking on specific links in the Map View, and then selecting the "Self-Calibrate" menu item. In each case, after entering the numeric value, it is then necessary to turn on the checkbox under the "Self-Calibrate?" column.

SpeedAverage values for Cumulative Link-Specific Surface (NETSIM)
    Enter 22.96 for links 1--->2 and 2--->1
Delay Control per Vehicle values for Cumulative Link-Specific Surface (NETSIM)
    Enter 19.30 for links 301--->1 and 402--->2
    Enter 25.10 for links 2--->1 and 1--->2
    Enter 39.40 for links 101--->1, 201--->1, 102--->2, and 202--->2

After entering in all of these values, the "total percent difference" should be displayed as 25.1%. Now, the preliminary random number seed analysis can begin.

Click on the tab that says Input Parameters and Run Status

In the data row that says Entry Headway Seed, turn on the checkbox under the Self-Calibrate? column At the far left side of this same data row, select Thorough under the Searching column Click on the Generate button Click on the Start button At the end of the run, a Mean Value of 32.1% is displayed, which is significantly different than the original percent difference (25.1%). When this process is repeated with only the Traffic Stream Seed selected, a Mean Value of 29.2% is displayed, which is also significantly different than the original. When this process is repeated with only the Traffic Choice Seed selected, a Mean Value of 27.2% is displayed, which is perhaps not significantly different than the original. Finally, Entry Headway Seed and Traffic Stream Seed are simultaneously selected for Thorough searching (100 total runs, time estimate 2 minutes 17 seconds).

Figure 7:
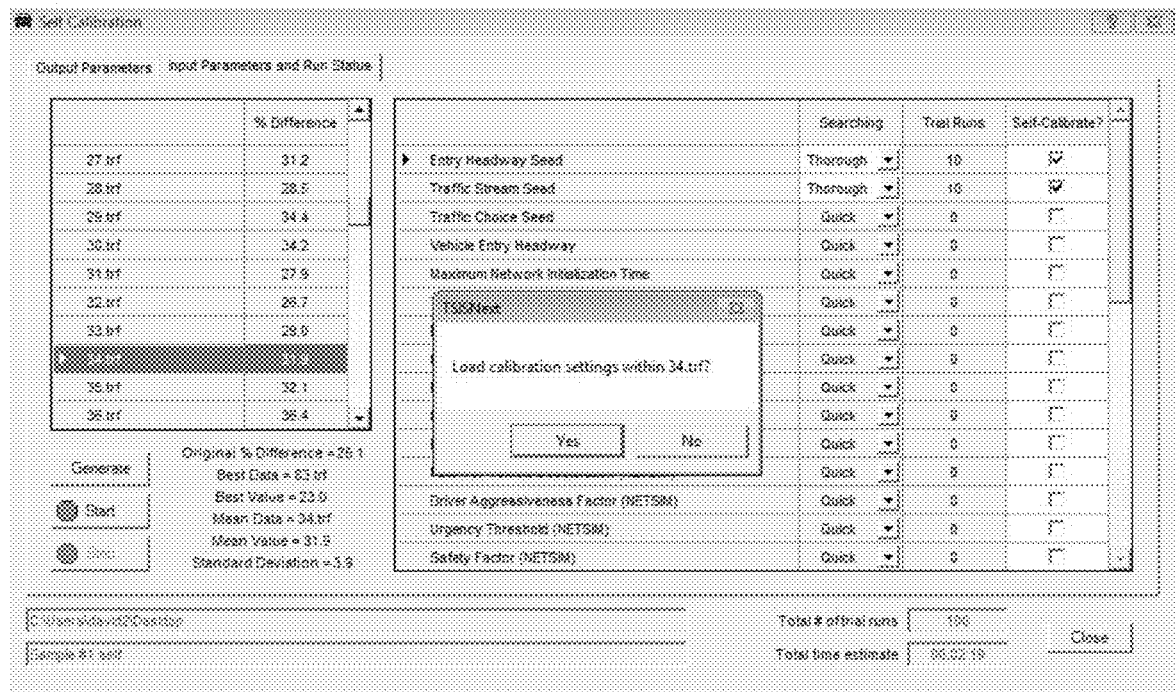
FIG. 7 shows a dialog box used to import a specific trial dataset.

FIG. 7 below shows that data file 34.trf contains a % Difference value that is closest to the Mean Value for all 100 trial datasets. Therefore, it might be safer to perform calibration using random number seeds within 34.trf, instead of random number seeds within the original dataset.

Random number seeds from 34.trf can be automatically imported by clicking on the table cell that says "34.trf". After this, performance measures based on those random number seeds can be automatically generated by performing another CORSIM run, without even leaving the Self Calibration interface screen. Just click "Yes" when the program says "Refresh output by performing a CORSIM run?", as shown in FIG. 11.

Now that the random number seeds have been checked, the self-calibration process can continue. Because NETSIM has a large number of calibration parameters available for selection, some judgment by a user is needed for choosing a smaller set of parameters for self-calibration. This is because simultaneous calibration of all parameters would result in an unacceptable computer run time. Certain input parameters should be omitted from self-calibration on the basis of traffic network characteristics. For networks with no permissive left-turn movements, the associated input parameters (i.e., Permissive Left-Turn Acceptable Gaps, Probability of Left-Turn Lagger, Left-Turn Jumpers) should not be chosen for self-calibration. The same holds for networks with no queue spillback (Probability of Joining Spillback), networks with no right-turns-on-red (Permissive Right-Turn Acceptable Gaps), or networks with no sign-controlled intersections (Near-Side Gap Acceptance at a Sign, Far-Side Gap Acceptance at a Sign).

In future versions of the software, it is hoped that research studies for sensitivity analysis will help to prioritize the input parameters in terms of importance, such that the parameters tending to affect results the most would appear near the top of the list by default. For now, a set of preliminary self-calibration runs was performed to gauge the effect of each parameter. The preliminary runs were performed as follows:

Click on the tab that says Input Parameters and Run Status

Choose Vehicle Entry Headway as the only parameter chosen for self-calibration

Set the Searching level to Quick

Click on the Generate button

Click on the Start button

At the end of the run, if the Best Value is lower than the Original % Difference value by more than 0.1%, make a note of the Standard Deviation value This run showed that the trial Vehicle Entry Headways did not produce a lower Best Value. Therefore, the Standard Deviation value (0.6) is not recorded for Vehicle Entry Headway. After a few minutes of preliminary runs in this manner, there were sixteen input parameters that showed promise:

| | |
|---|---|
| 1. Maximum Network Initialization Time | 1.4 |
| 2. Minimum Lane Changing Deceleration (NETSIM) | 1.5 |
| 3. Discretionary Lane Change Deceleration (NETSIM) | 1.4 |
| 4. Lead Vehicle Deceleration (NETSIM) | 3.1 |
| 5. Follower Vehicle Deceleration (NETSIM) | 0.9 |
| 6. Driver Aggressiveness Factor (NETSIM) | 0.7 |
| 7. Safety Factor (NETSIM) | 0.7 |
| 8. Percentage of Cooperative Drivers (NETSIM) | 0.4 |
| 9. Lane Change Distance (NETSIM) | 0.9 |
| 10. Mean Queue Discharge Headway (NETSIM)* | 2.5 |
| 11. Left-Turn Jumpers (NETSIM) | 3.0 |
| 12. Turning Speed (NETSIM) | 1.4 |
| 13. Amber Interval Response (NETSIM) | 2.2 |
| 14. Free Flow Speed Distribution (NETSIM) | 2.9 |
| 15. Driver Familiarity with Paths (NETSIM) | 1.6 |
| 16. Mean Start-Up Lost Time (NETSIM) | 1.1 |

*All links selected

Even at the Quick searching level, simultaneous calibration of all sixteen parameters produces a run time estimate that is considered unacceptably high. Therefore, these output parameters were self-calibrated individually at the Thorough level, and the best solution was automatically loaded after each run. After a few minutes of sequential self-calibration runs in this manner, the percent difference improvements (original percent difference was 31.9%) were as follows:

| | |
|---|---|
| 1. Maximum Network Initialization Time | 28.5 |
| 2. Minimum Lane Changing Deceleration (NETSIM) | 28.5 |
| 3. Discretionary Lane Change Deceleration (NETSIM) | 28.5 |
| 4. Lead Vehicle Deceleration (NETSIM) | 28.5 |
| 5. Follower Vehicle Deceleration (NETSIM) | 26.5 |
| 6. Driver Aggressiveness Factor (NETSIM) | 25.7 |
| 7. Safety Factor (NETSIM) | 25.7 |
| 8. Percentage of Cooperative Drivers (NETSIM) | 25.7 |
| 9. Lane Change Distance (NETSIM) | 25.7 |
| 10. Mean Queue Discharge Headway (NETSIM)* | 21.9 |
| 11. Left-Turn Jumpers (NETSIM) | 19.1 |
| 12. Turning Speed (NETSIM) | 19.1 |
| 13. Amber Interval Response (NETSIM) | 18.7 |
| 14. Free Flow Speed Distribution (NETSIM) | 16.0 |
| 15. Driver Familiarity with Paths (NETSIM) | 15.8 |
| 16. Mean Start-Up Lost Time (NETSIM) | 15.8 |

*All links selected

At this stage, it may appear that the calibration exercise has doubled (31.9% percent difference, reduced to 15.8%) the accuracy of the model. However, it is still possible that the 15.8% result represents a non-typical result, due to stochastic variation. Thus, it is advisable to perform some "post-calibration" random number seed analysis. By choosing Medium searching for all three random number seeds, it is possible to set up a randomness analysis run with only 125 simulations (run time estimate 2 minutes 40 seconds). After this post-calibration analysis run, the Mean Value is displayed as 20.8%, with 33.trf as the Mean Dataset. Clicking on 33.trf automatically loads these random number seeds, and File>Save As can now be used to save this calibrated network.

At this point, a user might want to review the calibrated network (animation, inputs, outputs) for possible problems and anomalies. In addition, manual (non-automated) "fine-tuning" calibration could optionally be performed at this stage.

In summary, at the outset, it appeared that the percentage difference (between simulated and field-measured performance) was 25.1%, but randomness analysis revealed the actual difference was closer to 31.9%. In less than an hour, it was possible to reduce the percentage difference from 32% to around 21%. Since the calibration of individual settings was done sequentially, instead of simultaneously, it is possible that the best combination of settings was not yet located. The sequential process was used to keep run times low, but a simultaneous process (with a small number of input parameters) might be preferable. To reduce the percentage difference further below 21%, a user might want to re-consider the overall list of options below.

---

1. Correction of fundamental input data (e.g., volume, timing, laneage) errors
2. Reconciliation of inconsistent performance measure definitions*
3. Collection of more accurate field-measured values
4. Elimination of simulation software limitations*
5. Correction of simulation software bugs*
6. Manual (non-automated) calibration
7. Automated self-calibration

---

*usually handled by the simulation software developers

In this exercise, all calibration input parameters were treated as "fair game", such that changing those parameters would be acceptable to the client. In a real-world project, a user could use judgment to avoid self-calibration of 1) parameters the client does not want changed, and 2) parameters that are not applicable (e.g., Probability of Joining Spillback in an undersaturated network) to the given network. Self-calibration of non-applicable parameters would not interfere with accurate model results; but it would waste time, because non-applicable parameters have no impact on model results.

Example 3: Tutorial for Calibration of Multi-Period Freeway Simulation

This tutorial example is an extended freeway facility with eleven segments, and five time periods. Volume and laneage details were derived from a 2010 Highway Capacity Manual example problem. The link-node geometry is shown in FIG. 10.

Before beginning the normal self-calibration runs, it would be advisable to perform some preliminary random number seed analysis, to determine whether the simulated performance measures actually represent non-typical results. However, field-measured performance measure values should be entered prior to any type of analysis. The steps to set up a preliminary random number seed analysis are as follows:
Launch TSIS Next.
Open Sample #2.trf.
Turn on the following checkbox: Options>Preferences>Output Files>After CORSIM runs, copy OUT/CSV files to the TRF file folder.
Perform one preliminary CORSIM simulation run by clicking on the "Run CORSIM" toolbar icon.
Next, field-measured values are entered in the Output Parameters interface screen. The values to be used for this exercise are listed below. These values can be entered by clicking on the "Self-Calibration" toolbar icon, and then switching between links using the combo box; or by right-clicking on specific links in the Map View, and then selecting the "Self-Calibrate" menu item. In each case, after entering the numeric value, it is then necessary to turn on the checkbox under the "Self-Calibrate?" column.
DensityPerLane values for Time Period 3 Link-Specific Freeway (FRESIM)
Enter 29.30 for link 101--->201
Enter 34.20 for link 301--->402
Enter 31.90 for link 501--->602
Enter 35.80 for link 701--->801
Enter 37.70 for link 1101--->1102
SpeedAverage values for Time Period 3 Link-Specific Freeway (FRESIM)
Enter 59.40 for link 101--->201
Enter 57.10 for link 301--->402
Enter 58.30 for link 501--->602
Enter 56.10 for link 701--->801
Enter 55.00 for link 1101--->1102
After entering in all of these values, the "total percent difference" should be displayed as 3.3%. Now, the preliminary random number seed analysis can begin.
Click on the tab that says Input Parameters and Run Status
In the data row that says Entry Headway Seed, turn on the checkbox under the Self-Calibrate? column
At the far left side of this same data row, select Medium under the Searching column
Click on the Generate button
Click on the Start button
At the end of the run, a Mean Value of 3.3% is displayed, which is identical to the original percent difference. When this process is repeated with only the Traffic Stream Seed selected, a Mean Value of 3.3% is again displayed. When this process is repeated with only the Traffic Choice Seed selected, a Mean Value of 3.3% is again displayed. Although the Entry Headway and Traffic Choice seeds produced some variability in results, the overall Mean Value was still 3.3%. This means the original dataset probably contains random number seeds that produce typical results, and it is probably safe to perform self-calibration without changing the original random number seeds.

Now that the random number seeds have been checked, the self-calibration process can continue. Because FRESIM has a large number of calibration parameters available for selection, some user judgment is needed for choosing a smaller set of parameters for self-calibration. This is because simultaneous calibration of all parameters would result in an unacceptable computer run time.

Analysis of sensitivity analysis can help to prioritize the input parameters in terms of importance, such that the parameters tending to affect results the most would appear near the top of the list by default. For now, a set of preliminary self-calibration runs was performed to gauge the effect of each parameter. The preliminary runs were performed as follows:
Click on the tab that says Input Parameters and Run Status
Choose Vehicle Entry Headway as the only parameter chosen for self-calibration
Set the Searching level to Thorough
Click on the Generate button
Click on the Start button
At the end of the run, if the Best Value is lower than the Original % Difference value by more than 0.1%, then make a note of the Best Value
This run showed that the trial Vehicle Entry Headways produced a Best Value of 2.8%. Therefore, the Best Value (2.8) is recorded for Vehicle Entry Headway. After a few minutes of preliminary runs in this manner, there were fourteen input parameters that showed promise:

| | |
|---|---|
| 1. Vehicle Entry Headway | 2.8 |
| 2. Maximum Network Initialization Time | 2.7 |
| 3. Car Following Sensitivity Multiplier (FRESIM)* | 2.8 |
| 4. Car Following Sensitivity (FRESIM) | 2.4 |
| 5. Time to Complete a Lane Change (FRESIM) | 3.1 |
| 6. Minimum Entry Headway (FRESIM) | 3.0 |
| 7. Lane Change Desire (FRESIM) | 2.8 |
| 8. Lane Change Advantage (FRESIM) | 2.7 |
| 9. Maximum Non-Emergency Deceleration (FRESIM) | 2.4 |
| 10. Maximum Perceived Deceleration (FRESIM) | 3.1 |
| 11. On-Ramp Speed for Upstream Lane Changes (FRESIM) | 2.9 |
| 12. Free Flow Speed Distribution (FRESIM) | 2.5 |
| 13. On-Ramp Anticipatory Lane Change Distance (FRESIM) | 2.9 |
| 14. Off-Ramp Reaction Distance (FRESIM) | 2.8 |

*All links selected

For this exercise, suppose that user judgment was used to eliminate Car Following Sensitivity Multiplier and Maximum Network Initialization Time from consideration. Car Following Sensitivity Multiplier and Car Following Sensitivity (global) are somewhat redundant, and Car Following Sensitivity Multiplier is primarily used to affect operations on specific individual links. Maximum Network Initialization Time produced a low Best Value in its first couple of trials, but this was because the network failed to reach equilibrium.

Even at the Quick searching level, simultaneous calibration of all twelve remaining parameters produces a run time estimate that is considered unacceptably high. Therefore, these output parameters were self-calibrated individually at the Thorough level, and the best solution was automatically loaded after each run. After a few minutes of sequential self-calibration runs in this manner, the percent difference improvements (original percent difference was 3.3%) were as follows:

| | |
|---|---|
| 1. Vehicle Entry Headway | 2.8 |
| 2. Car Following Sensitivity (FRESIM) | 2.1 |
| 3. Time to Complete a Lane Change (FRESIM) | 2.1 |
| 4. Minimum Entry Headway (FRESIM) | 1.9 |
| 5. Lane Change Desire (FRESIM) | 1.9 |
| 6. Lane Change Advantage (FRESIM) | 1.9 |
| 7. Maximum Non-Emergency Deceleration (FRESIM) | 1.9 |
| 8. Maximum Perceived Deceleration (FRESIM) | 1.9 |
| 9. On-Ramp Speed for Upstream Lane Changes (FRESIM) | 1.9 |
| 10. Free Flow Speed Distribution (FRESIM) | 1.9 |
| 11. On-Ramp Anticipatory Lane Change Distance (FRESIM) | 1.9 |
| 12. Off-Ramp Reaction Distance (FRESIM) | 1.9 |

At this stage, it may appear that the calibration exercise has nearly doubled (3.3% percent difference, reduced to 1.9%) the accuracy of the model. However, it is still possible that the 1.9% result represents a non-typical result, due to stochastic variation. Thus, it is advisable to perform some "post-calibration" random number seed analysis. Repeating the same steps from the preliminary random number seed analysis, only the Traffic Choice Seed appears to have any impact on results. After this post-calibration analysis run, the Mean Value is displayed as 2.4%, with 1.trf as the Mean Dataset. Clicking on 1.trf automatically loads these random number seeds, and File>Save As can now be used to save this calibrated network with another name.

At this point, a user might want to review the calibrated network (animation, inputs, outputs) for possible problems and anomalies. In addition, manual (non-automated) "fine-tuning" calibration could optionally be performed at this stage.

To summarize, it appeared at the beginning that the percentage difference (between simulated and field-measured performance) was 3.3%, and random number analysis confirmed this to be a typical result for various seeds. In a short period of time, it was possible to reduce the percentage difference from 3.3% to 2.4%. Since the calibration of individual settings was done sequentially, instead of simultaneously, it is possible that the best combination of settings was not yet located. The sequential process was used to keep run times low, but a simultaneous process (with a small number of input parameters) might be preferable. To reduce the percentage difference further below 2.4%, a user might want to re-consider the overall list of options below.

1. Correction of fundamental input data (e.g., volume, timing, laneage) errors
2. Reconciliation of inconsistent performance measure definitions*
3. Collection of more accurate field-measured values
4. Elimination of simulation software limitations*
5. Correction of simulation software bugs*
6. Manual (non-automated) calibration
7. Automated self-calibration

*usually handled by the simulation software developers

In this exercise, all calibration input parameters were treated as "fair game", such that changing those parameters would be acceptable to the client. In a real-world project, a user would use judgment to avoid self-calibration of 1) parameters the client does not want changed, and 2) parameters that are not applicable to the given network. Self-calibration of non-applicable parameters would not interfere with accurate model results; but it would waste time, because non-applicable parameters have no impact on model results.

Example 4: User's Guide to Self-Calibration of TSIS-CORSIM Simulation Program

This user's guide describes the automated self-calibration features, for micro-simulation of traffic operations, within the TSIS-CORSIM software package.

I. How to Use SASCO in TSIS-CORSIM

The TSIS-CORSIM SASCO process is managed from TSIS Next, which is one of the available "front-end" interface applications for CORSIM simulation. The SASCO features also require build 514 (or higher) of the CORSIM simulation engine. Before initiating SASCO, the user must load a CORSIM data set (*.TRF) into TSIS Next; and must perform at least one standard CORSIM run from within TSIS Next, to generate the simulation outputs necessary for calibration. If the engineer wishes to calibrate time period-specific outputs, in addition to or instead of cumulative outputs, it is also necessary to generate a set of expanded CSV files; which can be generated by turning on the checkboxes under Options>Preferences>Output Files, prior to performing a CORSIM run.

Figure 19:
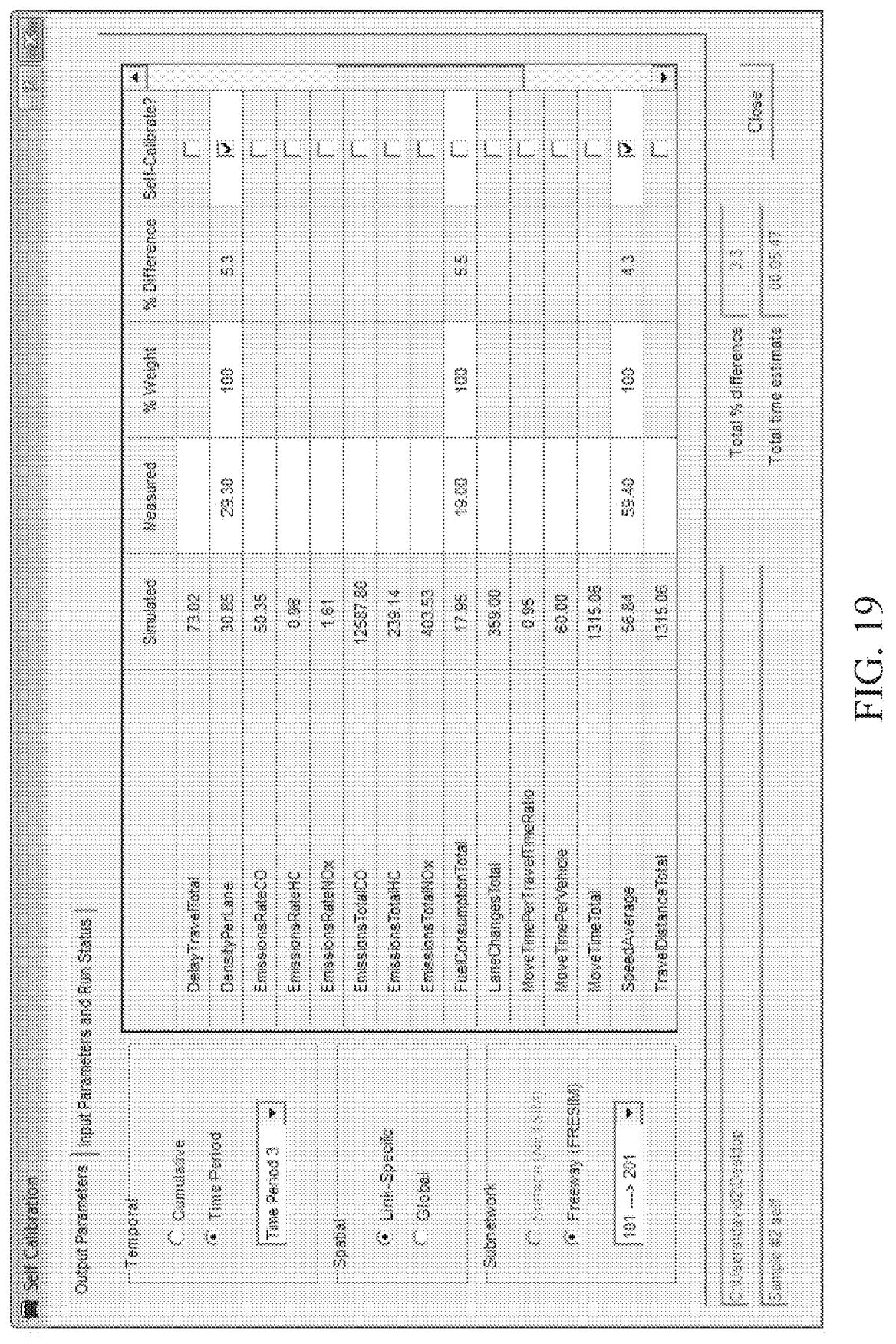

The SASCO features can be launched in TSIS Next by clicking on the Self-Calibration toolbar icon, or by selecting Run>Self-Calibration, or by right-clicking on a link in the Map View and selecting Self-Calibrate. The Output Parameters screen is illustrated in FIG. 19, and will be described first. The Input Parameters and Run Status screen will be illustrated and described later.

Simulated performance measure values, from the most recent run, are automatically displayed for easy reference. Field-measured values can be entered for any number of output parameters provided on the list. Field-measured values may be entered for any temporal setting (cumulative and/or time period-specific), and for any spatial setting (global and/or link-specific). For links with at least one surveillance detector, output parameters generated by these detectors are available for self-calibration, near the bottom of the (time period-specific) output parameter list. For intersections under actuated control, phase-specific green times are available for self-calibration, near the bottom of the Global (time period-specific) output parameter list. Priority weightings may be specified for any of the output parameters, if desired. Link-specific calibration settings can be accessed, or specified, by right-clicking on a link in the Map View. Node-specific and phase-specific settings are also available, primarily for sensitivity analysis and optimization; this functionality is explained later in more detail. Overall percent difference, between field-measured values and simulated values, is automatically displayed for easy reference. Finally, user-specified calibration settings are automatically archived (within <user_filename>.self).

Figure 20:
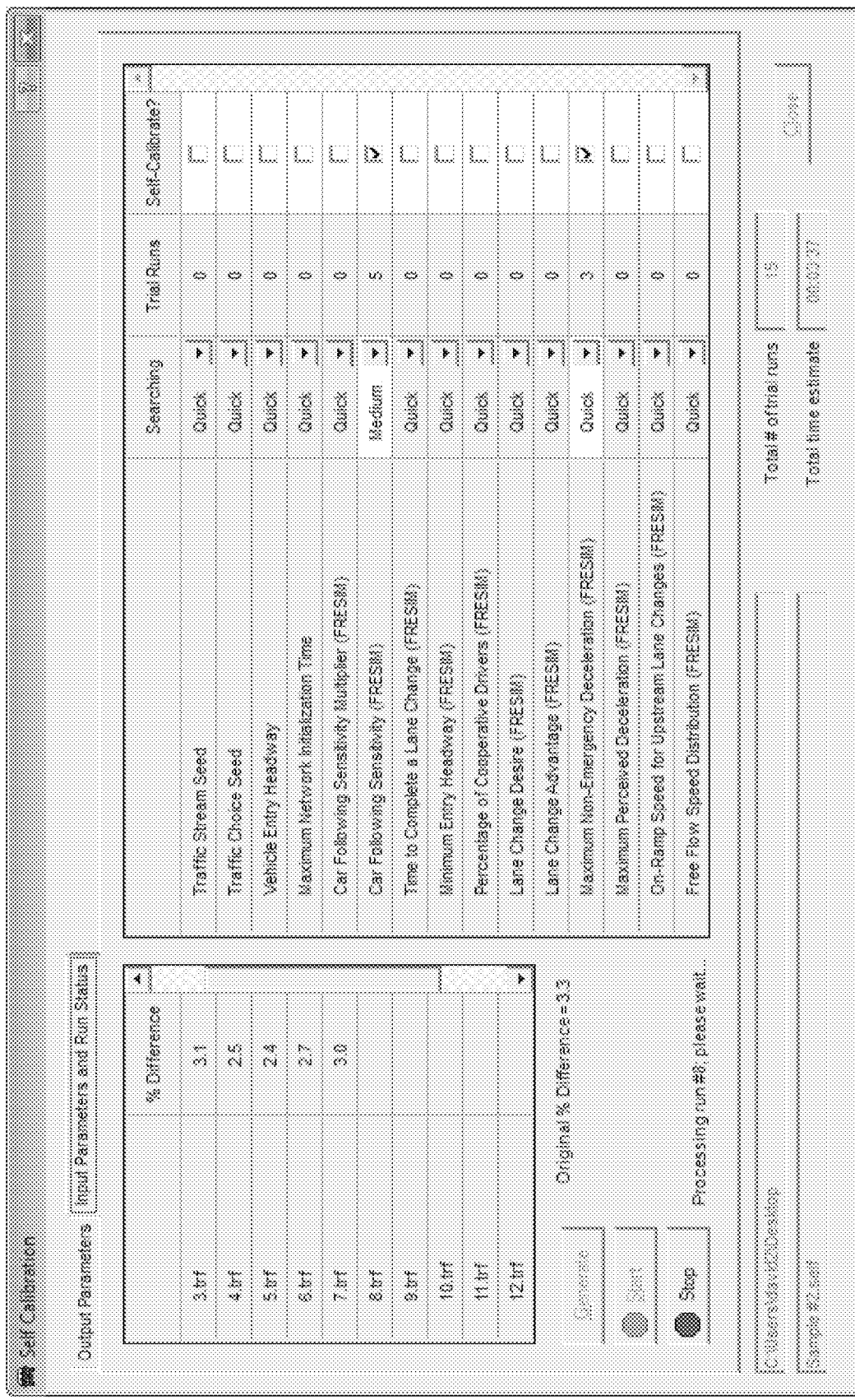
FIG. 20 illustrates one embodiment of an input parameters and run Status screen, according to the subject invention.

The Input Parameters and Run Status screen is illustrated in FIG. 20, and will be described next.

The user can choose to calibrate, optimize, or analyze any number of input parameters provided on the list. Freeway input parameters are not displayed for surface-only networks, and vice-versa. Combined surface-and-freeway networks will present both FRESIM and NETSIM input parameters for selection. The amount of searching (Quick, Medium, or Thorough) can be selected for each input parameter. The resulting number of candidate "trial" values is then displayed next to each input parameter. The number of chosen input parameters, together with the amount of searching for each parameter, are combined to produce the estimated run time, displayed at the bottom of the screen. The estimated run time is a crucial element; because it allows the engineer to choose their own tolerable run time, prior to the run. When the number of chosen input parameters is increased, or when the amount of searching is increased, the estimated run time increases simultaneously.

Therefore, the engineer must use judgment in choosing input parameters and search levels, which can improve their model accuracy within a reasonable amount of time. For example, in surface-street networks that do not have permissive left turns in them, Permissive Left-Turn Acceptable Gaps (NETSIM) should not be chosen for self-calibration, as this will blow up run times without improving model accuracy.

Figures 21, 22:
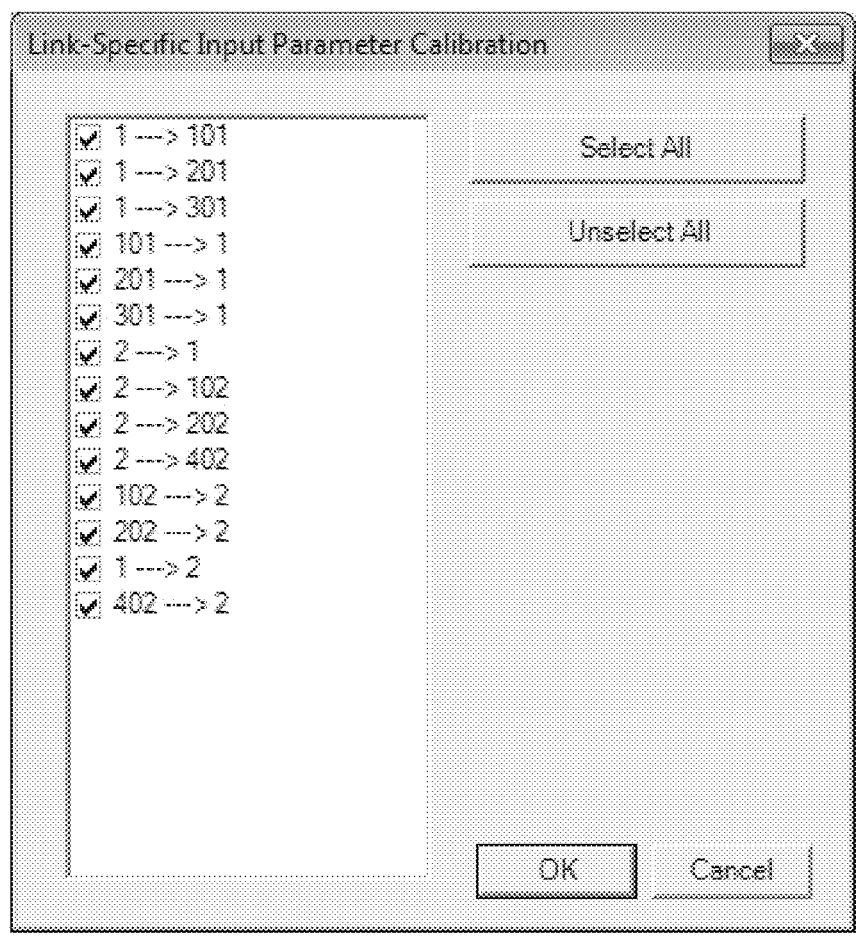
FIG. 21 shows a list of a certain number of input parameter names that begin with the phrase "Link-Specific", as described in Example 5.
FIG. 22 illustrates one embodiment of a pop-up dialog box to allow automated calibration on some links and not others, as described in Example 5.

CORSIM input parameters are sometimes calibrated to contain unique values on certain links, and in certain areas of the traffic network. The list seen in FIG. 21 shows a certain number of input parameter names that begin with the phrase "Link-Specific". These same Link-Specific input parameters are also available in "global" form, in other areas of the list, when needed. The pop-up dialog box in FIG. 22 is provided for these Link-Specific parameters, to allow automated calibration on some links but not others. When all link numbers have a check mark next to them, Link-Specific parameters produce the same results as their "global" counterparts.

Regarding the Run Status section of the screen, the Generate button is used to create trial data sets, prior to the self-calibration run.

Example

If the user chooses Quick searching (3 trials) on one input parameter, Medium searching (5 trials) on a second input parameter, and Thorough searching (10 trials) on a third input parameter, this would generate 3*5*10=150 data sets, according to the directed brute force methodology.

The Start button is then used to initiate the self-calibration run, during which the percent difference for each trial run is displayed in real-time. The Stop button can be used to abort the run prior to completion, if desired.

Figure 23:
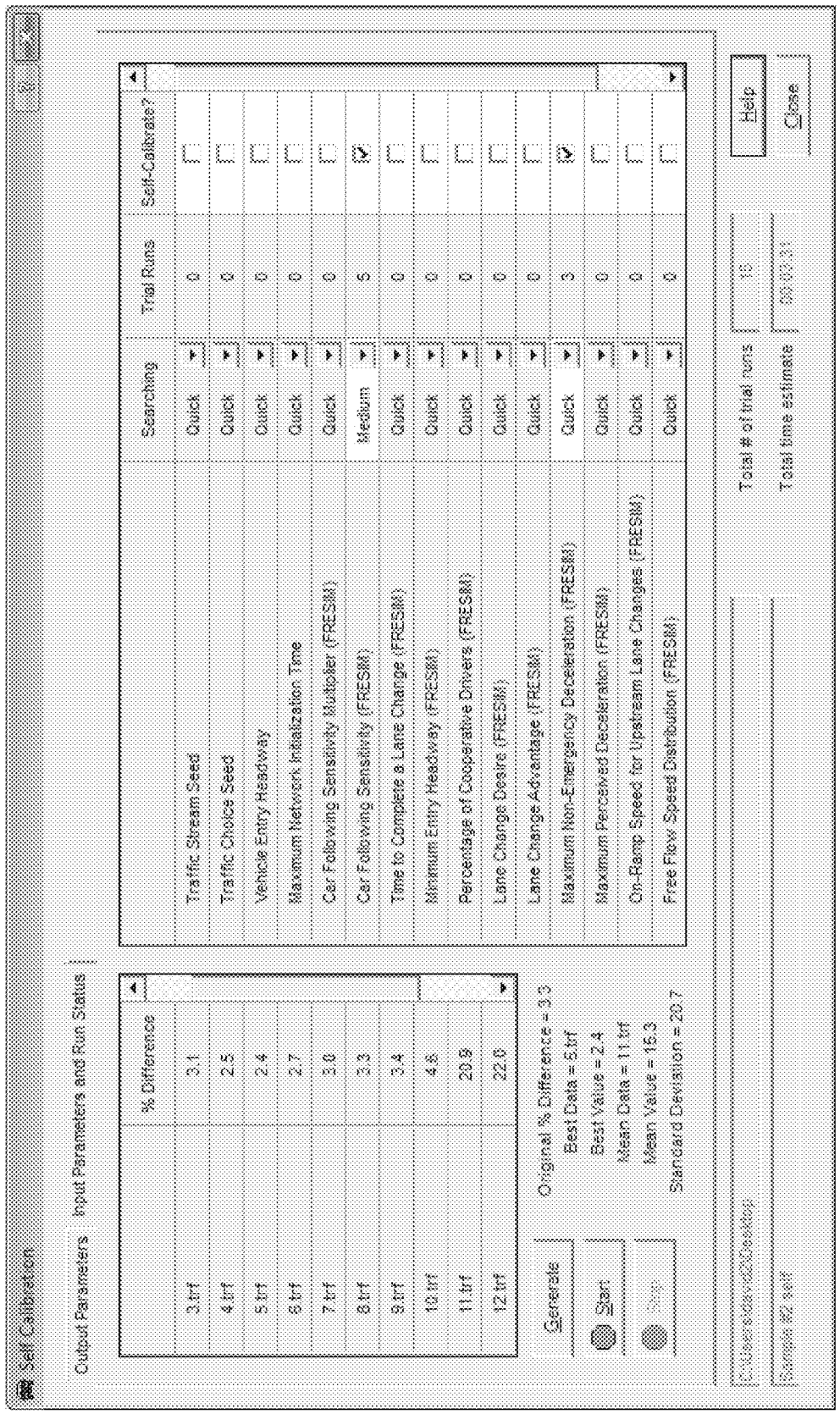
FIG. 23 illustrates one embodiment of an input parameters and run status screen at the conclusion of a run, as described in Example 5.

The Input Parameters and Run Status screen is illustrated again in FIG. 23, but this time at the conclusion of a run. After the self-calibration run is completed, some of the trial runs may exhibit percent differences lower than the original percent difference, thus indicating a better-calibrated traffic network. These trial data sets are then available for further use in the SelfCalibrate folder, which is a subfolder of the folder containing the original data set. Also following the self-calibration run, the mean value and standard deviation are displayed. The standard deviation provides a measure of model sensitivity to the input parameters that were just chosen and tested. Higher values of standard deviation indicate model results that were highly sensitive to the chosen input parameters.

II. Automatic Viewing and Importing of Calibration Settings

Figure 24:
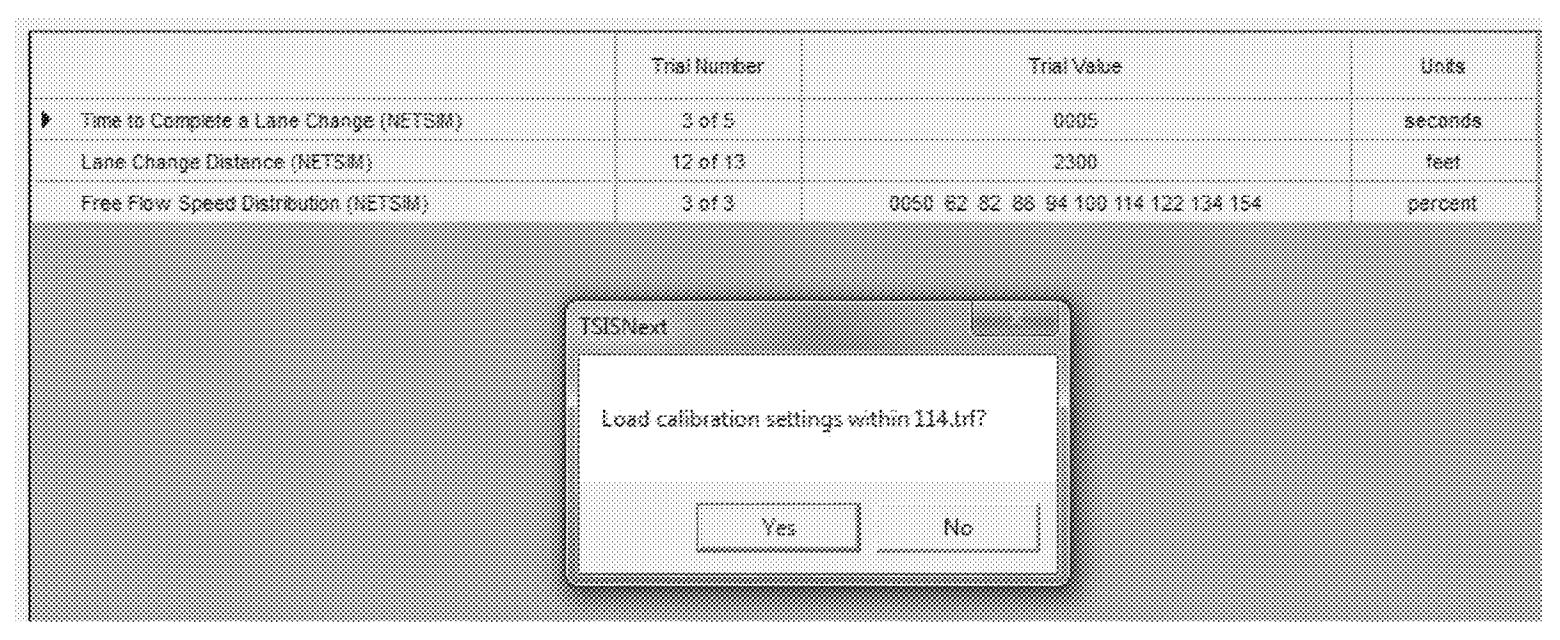

Calibration settings can be automatically viewed and/or imported from specific trial datasets, if desired. Simply click on the name of any trial dataset shown on the left side of the screen, shown in FIG. 24 and a pop-up box will ask whether or not the calibration settings for that dataset should be imported, while simultaneously listing values that would be imported. This process is also demonstrated in the tutorial exercises. Calibration settings can be viewed before, during, or after any self-calibration run. Calibration settings can be imported before or after any self-calibration run, but not during the run.

III. Database of Input Parameters

Figures 25, 26:
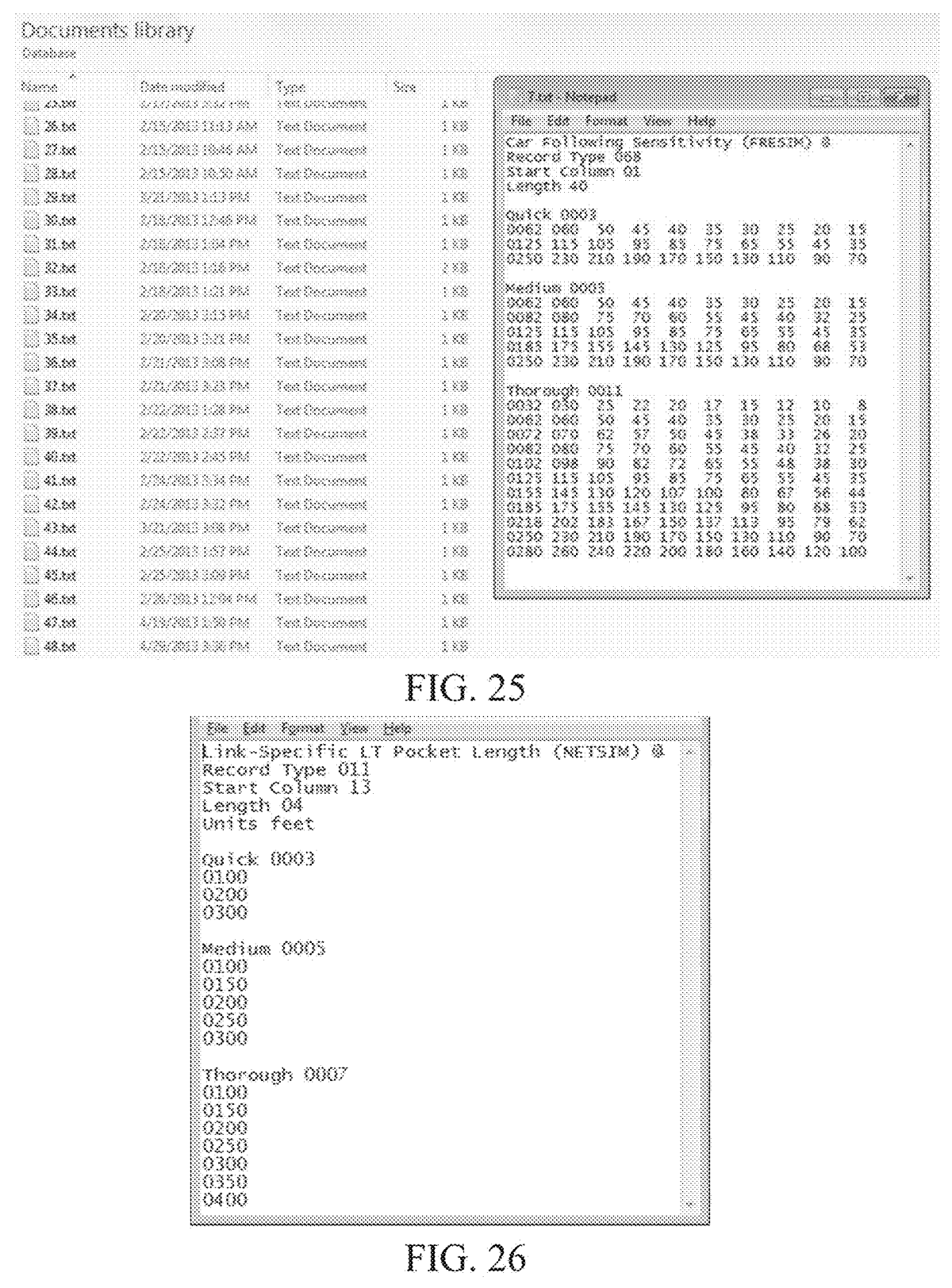

The database of input parameters is illustrated in FIG. 25. By default, this database contains a few dozen preset input parameters within a few dozen text files. The default list of input parameters is shown below. This default list may change (sequence and/or content) in future software versions.

1. Entry Headway Seed
2. Traffic Stream Seed
3. Traffic Choice Seed
4. Vehicle Entry Headway
5. Maximum Network Initialization Time
6. Car Following Sensitivity Multiplier (FRESIM)
7. Car Following Sensitivity (FRESIM)
8. Time to Complete a Lane Change (FRESIM)
9. Minimum Entry Headway (FRESIM)
10. Percentage of Cooperative Drivers (FRESIM)
11. Lane Change Desire (FRESIM)
12. Lane Change Advantage (FRESIM)
13. Maximum Non-Emergency Deceleration (FRESIM)
14. Maximum Perceived Deceleration (FRESIM)
15. Time to Complete a Lane Change (NETSIM)
16. Deceleration Reaction Time (NETSIM)
17. Minimum Lane Changing Deceleration (NETSIM)
18. Mandatory Lane Change Deceleration (NETSIM)
19. Discretionary Lane Change Deceleration (NETSIM)
20. Lead Vehicle Deceleration (NETSIM)
21. Follower Vehicle Deceleration (NETSIM)
22. Driver Aggressiveness Factor (NETSIM)
23. Urgency Threshold (NETSIM)
24. Safety Factor (NETSIM)
25. Percentage of Cooperative Drivers (NETSIM)
26. Minimum Lane Change Headway (NETSIM)
27. Maximum Lane Change Headway (NETSIM)
28. Lane Change Distance (NETSIM)
29. Queue Discharge and Lost Time Distribution (NETSIM)
30. Mean Queue Discharge Headway (NETSIM)
31. On-Ramp Anticipatory Lane Change Speed (FRESIM)
32. Left-Turn Jumpers (NETSIM)
33. Turning Speed (NETSIM)

-continued

34. Probability of Joining Queue Spillback (NETSIM)
35. Probability of Left-Turn Lagger (NETSIM)
36. Near-Side Gap Acceptance at a Sign (NETSIM)
37. Far-Side Gap Acceptance at a Sign (NETSIM)
38. Amber Interval Response (NETSIM)
39. Permissive Left-Turn Acceptable Gaps (NETSIM)
40. Permissive Right-Turn Acceptable Gaps (NETSIM)
41. Pedestrian Delays during Weak Interaction (NETSIM)
42. Pedestrian Delays during Strong Interaction (NETSIM)
43. Free Flow Speed Distribution (NETSIM)
44. Free Flow Speed Distribution (FRESIM)
45. Distribution of Lane Change Distance (NETSIM)
46. Driver Familiarity with Paths (NETSIM)
47. On-Ramp Anticipatory Lane Change Distance (FRESIM)
48. Off-Ramp Reaction Distance (FRESIM)
49. Mean Start-Up Lost Time (NETSIM)
50. Desired Free-Flow Speed (NETSIM)*
51. Desired Mainline Free-Flow Speed (FRESIM)*
52. Desired Ramp Free-Flow Speed (FRESIM)*
53. Entry Node Volume*
54. Entry Node Percent Trucks*
55. Entry Node Percent Carpools*
56. Entry Node Percent HOV Violators*
57. Link-Specific Car Following Multiplier (FRESIM)
58. Link-Specific Mean Discharge Headway (NETSIM)
59. Link-Specific On-Ramp Lane Change Speed (FRESIM)
60. Link-Specific On-Ramp Lane Change Distance (FRESIM)
61. Link-Specific Off-Ramp Reaction Distance (FRESIM)
62. Link-Specific Start-Up Lost Time (NETSIM)
63. Link-Specific Desired Free-Flow Speed (NETSIM)*
64. Link-Specific Desired Free-Flow Speed (FRESIM)*
65. Surface Node Yield Point (NETSIM)**
66. Freeway Node Metering Headway (FRESIM)**

*provided mainly for the purpose of sensitivity analysis
**provided mainly for optimization The input parameter database can be customized by the user if desired. These text files can be created or edited within minutes, and are automatically loaded by the program at run time. By changing the numeric file names, the user can change the order of input parameters displayed on-screen. By deleting certain text files in the database, the user can remove input parameters from the list. By changing the numbers inside the text files, the user can re-define the amount of searching associated with Quick-Medium-Thorough, or change the existing trial values themselves. To do this, the user would often need to refer to the CORSIM Reference Manual, to access the definition of CORSIM data formats. Adding text files to the list could add to the list of input parameters; but the current program is designed to handle either data types in the preset database, or data types already present in the original data set. For example, if the user wishes to calibrate data type 150 for HOT lanes, then data type 150 must be present in the original data set, because data type 150 is not included in the default database of input parameters.

Data types (a.k.a. record types) available in the default database are listed below:
2, 11, 20, 50, 68, 70, 81, 140, 141, 142, 143, 144, 145, 146, 147, 152, 153

For example, if the engineer wanted to analyze the impact of left-turn pocket lengths, they could add a new text file containing trial values for left-turn pocket length into the input database. Analyzing the impact of left-turn pocket lengths would usually be considered sensitivity analysis as opposed to calibration; sensitivity analysis is discussed in more detail in the upcoming section. Left-turn pocket length is not included in the default database of input parameters because 1) they're only applicable to intersection approach links, and generate fatal errors when coded for other links, 2) their value can't exceed the length of the link that they're on, and 3) their absence is useful in providing users guide examples for database customization (this section), and sensitivity analysis (next section).

It can be assumed that the default database of input parameters (typically available under C:\Program Files (x86)\FHWA\TSIS6.3\Database) contains 66 text files, such that left-turn pocket length will be text file #67. The CORSIM Reference Manual specifies that left-turn pocket lengths are stored on record type 11, columns 13-16. It is important that this be a link-specific input parameter, so that only intersection approach links can be included in the analysis. It is also important to provide trial values that will not exceed the link length. Sample contents of "67.txt" are shown in FIG. 26.

The engineer must also exercise judgment with regard to the random number seeds (vehicle entry headway, traffic choice, traffic flow), which sit atop the default list of input parameters. If these seed parameters are not included in a self-calibration run, there's a risk that some of the individual trial results may be "outliers". For better statistical certainty, it might help to perform random number seed "calibration" at the appropriate times, to observe a fuller range of possible outcomes. This recommended procedure is illustrated in the Tutorial Examples section.

IV. Sensitivity Analysis

The SASCO features can also be used to facilitate sensitivity analysis (SA), and this process is demonstrated below in Tutorial Example #4. Practitioners and researchers have long relied on SA to gain a better understanding of the modeling process, and to identify which input parameters have the strongest impact on model results. Input parameters not normally associated with calibration (e.g., desired free-flow speed, entry node volume, percent trucks, etc.) can now be examined quickly, in an automated manner, to determine their specific impact on results. However, the input parameters most commonly associated with calibration can be quickly analyzed via automated SA as well.

Regarding output parameters, engineers can still select their desired performance measures on the Output Parameters screen, but for SA it might be easier in many cases to enter Measured values that actually match the Simulated values. This way, the overall percent difference (between field-measured values and simulated values) will be displayed as 0.0 for existing conditions, prior to SA. Because the primary purpose of SA is to understand the impact of certain input parameters on simulation model results, field-measured performance becomes a lower priority in the context of SA.

The previous section (Database of Input Parameters) provided an example on how to customize the input parameter database. This database can be customized by modifying or deleting existing input parameters; but in this example a brand-new input parameter (link-specific left-turn pocket length) was added, in the form of "67.txt". Once this text file has been added to the input database, link-specific left-turn pocket length will be displayed at the bottom of the Input Parameters and Run Status screen at run-time. After selecting this new input parameter from the available list, SA is performed by clicking on "Generate", followed by "Start". Once this series of simulation runs is completed, SA results can be viewed in a tabular format; by switching over to the Output Parameters screen, and then clicking on the "S.A." button. Note that this button only becomes visible after trial datasets have been generated on the Input Parameters screen. The SA feature is powerful because it can automatically contrast virtually any set of simulation inputs and outputs, globally or link-specific, and cumulatively or TP-specific.

Figures 27, 28:
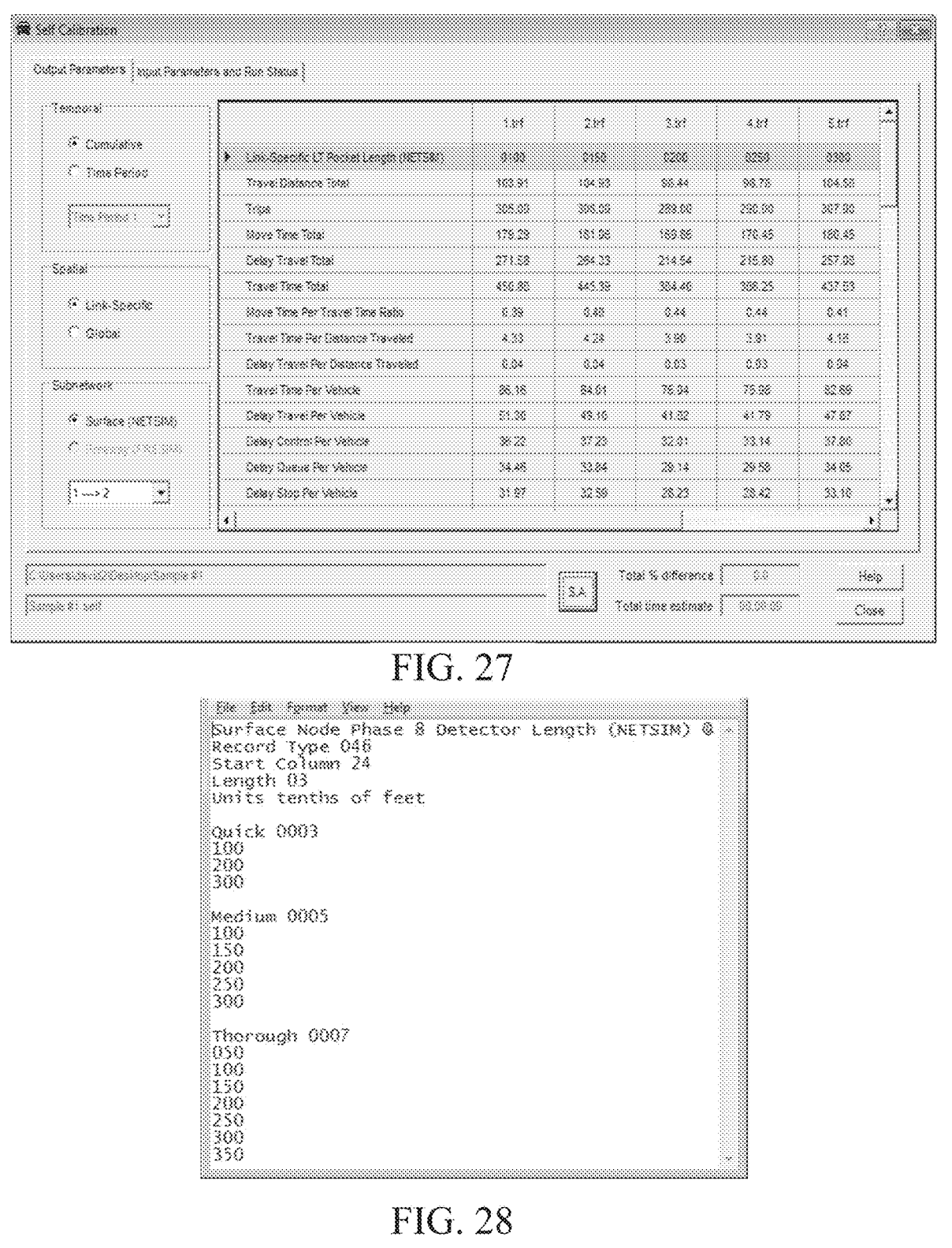

An example of the SA results, for link-specific left-turn pocket length, is illustrated in FIG. 27.

In an earlier section it was mentioned that a pop-up dialog is provided for Link-Specific input parameters, to allow automated calibration on some links but not others. For the entry node input parameters (volume, percent trucks, percent carpools, and percent HOV violators) typically associated with SA, it is also true that a pop-up dialog is provided for Entry Node-Specific parameters, to allow automated SA on selected entry nodes but not others.

The Federal Highway Administration Office of Operations Research and Development has released a report (FHWA-HRT-04-131) for which extensive SA (45,000 runs) was performed for CORSIM, considering a wide variety of traffic networks. The findings of this SA research may be of use in the context of CORSIM self-calibration, because engineers might choose to focus on calibrating those input parameters having the strongest impact on results.

V. Optimization

The SASCO features can also be used to facilitate optimization, and this process is demonstrated below in Tutorial Example #5. Practitioners and researchers have long focused on optimization of cycle length, phasing sequence, green splits, and offsets. Input parameters not normally optimized (e.g., detector lengths, ramp meter timings, esoteric actuated controller settings, etc.) can now be optimized using the SA-based method described earlier. However, offsets and phasing sequence can be optimized using the SA-based method as well.

Regarding output parameters, engineers can still select their desired performance measures on the Output Parameters screen, but (similar to SA) it might be easier in many cases to enter Measured values that actually match the Simulated values. This way, the overall percent difference, a.k.a., difference value, (between field-measured values and simulated values) will be displayed as 0.0% for existing conditions, prior to optimization. Because the primary purpose of optimization is to minimize or maximize certain performance measures, matching the field-measured performance measures becomes a lower priority during optimization. That said, matching field-measured and simulated performance (i.e., calibration) is certainly recommended before pursuing any optimization. Indeed, confirming that the underlying simulation is realistic should be a prerequisite to most optimization efforts.

The prior section "Database of Input Parameters" provided an example on how to customize the input parameter database. Regarding optimization, the applicable input parameters are typically node-specific and/or phase specific. Surface Node Yield Point (NETSIM) and Freeway Node Metering Headway (FRESIM) are included in the default database, but phase-specific inputs may also be added. For example, if the engineer wanted to analyze the impact of detector lengths on phase #8, they could add a new text file containing trial values into the input database. Analyzing the impact of detector lengths could probably be considered either sensitivity analysis or optimization. Detector length is not included in the default database of input parameters because 1) they're only applicable to intersection approach links, and might generate fatal errors when coded for other links, 2) their value can't exceed the length of the link that they're on, and 3) their absence is useful in providing examples for database customization.

It can be assumed that the default database of input parameters (typically available under C:\Program Files (x86)\FHWA\TSIS6.3\Database) contains 66 text files, such that phase #8 detector length will be text file #67. The CORSIM Reference Manual specifies that detector lengths are stored on record type 46, columns 24-26. It is important to provide trial values that will not exceed the link length. Sample contents of "67.txt" are shown in FIG. 28. Omitting the "Phase 8" notation would cause detector lengths to be modified for all signal phases.

In an earlier section it was mentioned that a pop-up dialog is provided for Link-Specific input parameters, to allow automated calibration on some links but not others. For the node-specific input parameters (detector lengths, ramp meter timings, and esoteric actuated controller settings) typically associated with optimization, a pop-up dialog is again provided, to allow optimization on selected nodes but not others.

TUTORIAL EXAMPLES

Tutorial #1—Surface Street Example (Sample #1.trf)

The first tutorial example is a simple surface-street section with two signalized intersections. The intersections are separated by 1800 feet. The volume, timing, and laneage details were derived from a 2010 Highway Capacity Manual example problem, in which access points between the intersections were deleted. The simple link-node geometry is shown in FIG. 10.

Before beginning the normal self-calibration runs, it would be advisable to perform some preliminary random number seed analysis, to determine whether the simulated performance measures actually represent non-typical results. However, field-measured performance measure values must be entered prior to any type of analysis. The steps to set up a preliminary random number seed analysis are as follows:

Launch TSIS Next.
Open Sample #1.trf.
Turn on the following checkbox: Options>Preferences>Output Files>After CORSIM runs, copy OUT/CSV files to the TRF file folder.
Perform one preliminary CORSIM simulation run by clicking on the "Run CORSIM" toolbar icon.
Next, field-measured values are entered in the Output Parameters screen. The values to be used for this exercise are listed below. These values can be entered by clicking on the "Self-Calibration" toolbar icon, and then switching between links using the combo box; or by right-clicking on specific links in the Map View, and then selecting the "Self-Calibrate" menu item. In each case, after entering the numeric value, it is then necessary to turn on the checkbox under the Self-Calibrate? column.
SpeedAverage values for Cumulative Link-Specific Surface (NETSIM)
Enter 22.96 for links 1--->2 and 2--->1
Delay Control per Vehicle values for Cumulative Link-Specific Surface (NETSIM)
Enter 19.30 for links 301--->1 and 402--->2
Enter 25.10 for links 2--->1 and 1--->2
Enter 39.40 for links 101--->1, 201--->1, 102--->2, and 202--->2
After entering in all of these values, the "total percent difference" should be displayed as 25.1%. Now, the preliminary random number seed analysis can begin.
Click on the tab that says Input Parameters and Run Status
In the data row that says Entry Headway Seed, turn on the checkbox under the Self-Calibrate? column At the far left side of this same data row, select Thorough under the Searching column
Click on the Generate button
Click on the Start button
At the end of the run, a Mean Value of 32.1% is displayed, which is significantly different than the original percent difference (25.1%). When this process is repeated with only the Traffic Stream Seed selected, a Mean Value of 29.2% is displayed, which is also significantly different than the original. When this process is repeated with only the Traffic Choice Seed selected, a Mean Value of 27.2% is displayed, which is perhaps not significantly different than the original. Finally, Entry Headway Seed and Traffic Stream Seed are simultaneously selected for Thorough searching (100 total runs, time estimate 2 minutes 17 seconds).

Figure 29:
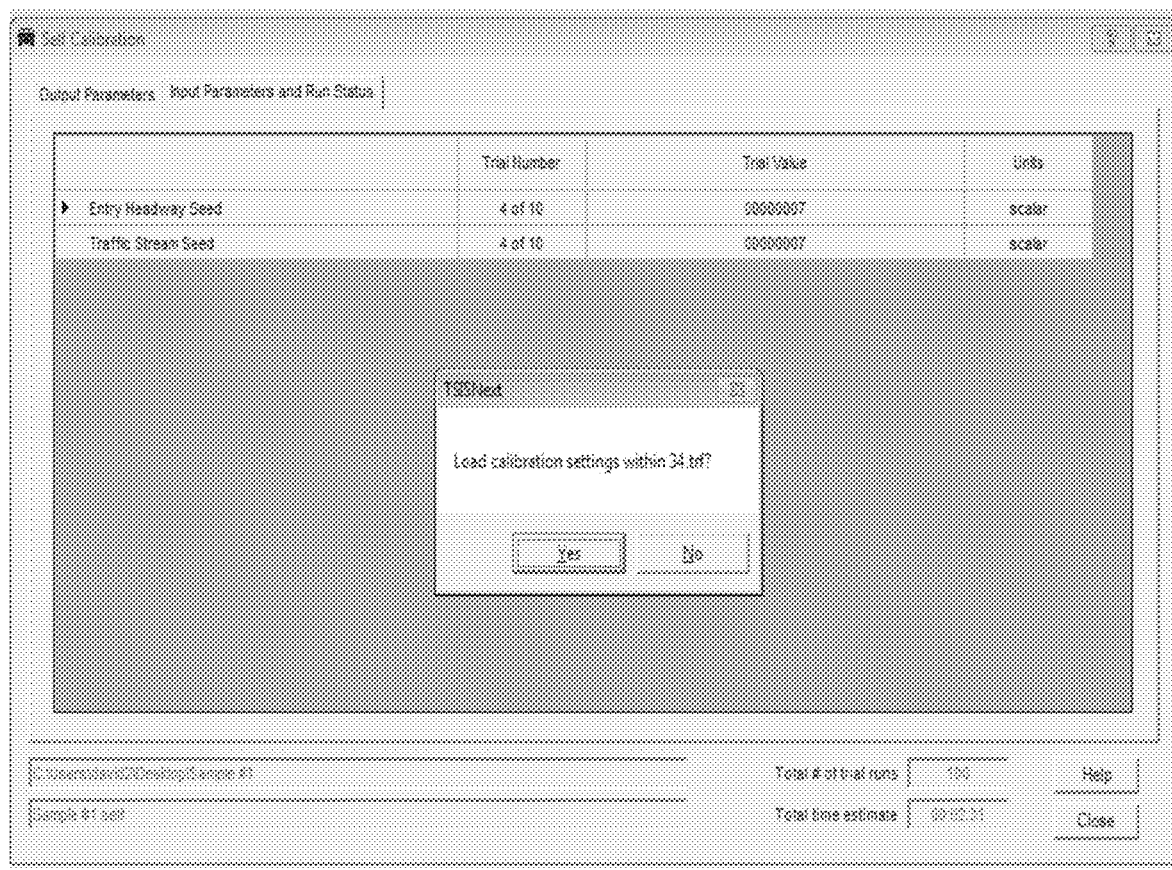
FIG. 29 illustrates one embodiment of an interface screen that shows a data file called "34.trf" contains a % Difference value that is closest to the Mean Value for all 100 trial datasets.

FIG. 29 shows that data file 34.trf contains a % Difference value that is closest to the Mean Value for all 100 trial datasets. Therefore, it might be safer to perform calibration using random number seeds within 34.trf, instead of random number seeds within the original dataset. Random number seeds from 34.trf can be automatically imported by clicking on the table cell that says "34.trf". After this, performance measures based on those random number seeds can be automatically generated by performing another CORSIM run, without even leaving the Self Calibration screen. Just click "Yes" when the program says "Refresh outputs by performing a CORSIM run?"

Now that the random number seeds have been checked, the self-calibration process can continue. Because NETSIM has a large number of calibration parameters available for selection, some engineering judgment is needed for choosing a smaller set of parameters for self-calibration. This is because simultaneous calibration of all parameters would result in an unacceptable computer run time. Certain input parameters should be omitted from self-calibration on the basis of traffic network characteristics. For networks with no permissive left-turn movements, the associated input parameters (i.e., Permissive Left-Turn Acceptable Gaps, Probability of Left-Turn Lagger, Left-Turn Jumpers) should not be chosen for self-calibration.

The same holds for networks with no queue spillback (Probability of Joining Spillback), networks with no right-turns-on-red (Permissive Right-Turn Acceptable Gaps), or networks with no sign-controlled intersections (Near-Side Gap Acceptance at a Sign, Far-Side Gap Acceptance at a Sign).

At this stage of the process, research studies (e.g., FHWA-HRT-04-131) for sensitivity analysis could be considered, to help select the most influential input parameters for calibration. For now, a set of preliminary self-calibration runs was performed to gauge the effect of each global parameter (ignoring link-specific parameters and sensitivity analysis parameters). The preliminary runs were performed as follows:

Click on the tab that says Input Parameters and Run Status
Choose Vehicle Entry Headway as the only parameter chosen for self-calibration
Set the Searching level to Quick
Click on the Generate button
Click on the Start button
At the end of the run, if the Best Value is lower than the Original % Difference value by more than 0.1%, make a note of the Standard Deviation value This run showed that the trial Vehicle Entry Headways did not produce a lower Best Value. Therefore, the Standard Deviation value (0.6) is not recorded for Vehicle Entry Headway. After a few minutes of preliminary runs in this manner, there were sixteen input parameters that showed promise:

| | |
|---|---|
| 17. Maximum Network Initialization Time | 1.4 |
| 18. Minimum Lane Changing Deceleration (NETSIM) | 1.5 |
| 19. Discretionary Lane Change Deceleration (NETSIM) | 1.4 |
| 20. Lead Vehicle Deceleration (NETSIM) | 3.1 |
| 21. Follower Vehicle Deceleration (NETSIM) | 0.9 |
| 22. Driver Aggressiveness Factor (NETSIM) | 0.7 |
| 23. Safety Factor (NETSIM) | 0.7 |
| 24. Percentage of Cooperative Drivers (NETSIM) | 0.4 |
| 25. Lane Change Distance (NETSIM) | 0.9 |
| 26. Mean Queue Discharge Headway (NETSIM) | 2.5 |
| 27. Left-Turn Jumpers (NETSIM) | 3.0 |
| 28. Turning Speed (NETSIM) | 1.4 |
| 29. Amber Interval Response (NETSIM) | 2.2 |
| 30. Free Flow Speed Distribution (NETSIM) | 2.9 |
| 31. Driver Familiarity with Paths (NETSIM) | 1.6 |
| 32. Mean Start-Up Lost Time (NETSIM) | 1.1 |

Even at the Quick searching level, simultaneous calibration of all sixteen parameters produces a run time estimate that is considered unacceptably high. Therefore, these output parameters were self-calibrated individually at the Thorough level, and the best solution was automatically loaded after each run. After a few minutes of sequential self-calibration runs in this manner, the percent difference improvements (original percent difference was 31.9%) were as follows:

| | |
|---|---|
| 17. Maximum Network Initialization Time | 28.5 |
| 18. Minimum Lane Changing Deceleration (NETSIM) | 28.5 |
| 19. Discretionary Lane Change Deceleration (NETSIM) | 28.5 |
| 20. Lead Vehicle Deceleration (NETSIM) | 28.5 |
| 21. Follower Vehicle Deceleration (NETSIM) | 26.5 |
| 22. Driver Aggressiveness Factor (NETSIM) | 25.7 |
| 23. Safety Factor (NETSIM) | 25.7 |
| 24. Percentage of Cooperative Drivers (NETSIM) | 25.7 |
| 25. Lane Change Distance (NETSIM) | 25.7 |
| 26. Mean Queue Discharge Headway (NETSIM) | 21.9 |
| 27. Left-Turn Jumpers (NETSIM) | 19.1 |
| 28. Turning Speed (NETSIM) | 19.1 |
| 29. Amber Interval Response (NETSIM) | 18.7 |
| 30. Free Flow Speed Distribution (NETSIM) | 16.0 |
| 31. Driver Familiarity with Paths (NETSIM) | 15.8 |
| 32. Mean Start-Up Lost Time (NETSIM) | 15.8 |

At this stage, it may appear that the calibration exercise has doubled (31.9% percent difference, reduced to 15.8%) the accuracy of the model. However, it is still possible that the 15.8% result represents a non-typical result, due to stochastic variation. Thus, it is advisable to perform some "post-calibration" random number seed analysis. By choosing Medium searching for all three random number seeds, it is possible to set up a randomness analysis run with only 125 simulations (run time estimate 2 minutes 40 seconds). After this post-calibration analysis run, the Mean Value is displayed as 20.8%, with 33.trf as the Mean Dataset. Clicking on 33.trf automatically loads these random number seeds, and File>Save As can now be used to save this calibrated network.

At this point, the engineer might want to review the calibrated network (animation, inputs, outputs) for possible problems and anomalies. In addition, manual (non-automated) "fine-tuning" calibration could optionally be performed at this stage.

To summarize the results of this exercise, at the outset, it appeared that the percentage difference (between simulated and field-measured performance) was 25.1%, but randomness analysis revealed the actual difference was closer to 31.9%. In less than an hour, it was possible to reduce the percentage difference from 32% to around 21%. Since the calibration of individual settings was done sequentially, instead of simultaneously, it is possible that the best combination of settings was not yet located. The sequential process was used to keep run times low, but a simultaneous process (with a small number of input parameters) might be preferable. To reduce the percentage difference further below 21%, the engineer might want to re-consider the overall list of options below.

---

8. Correction of fundamental input data (e.g., volume, timing, laneage) errors
9. Reconciliation of inconsistent performance measure definitions*
10. Collection of more accurate field-measured values
11. Elimination of simulation software limitations*
12. Correction of simulation software bugs*
13. Manual (non-automated) calibration
14. Automated self-calibration

*usually handled by the simulation software developers

---

In this exercise, all calibration input parameters were treated as "fair game", such that changing those parameters would be acceptable to the client. In a real-world project, the engineer would use judgment to avoid self-calibration of 1) parameters the client does not want changed, and 2) parameters that are not applicable (e.g., Probability of Joining Spillback in an undersaturated network) to the given network. Self-calibration of non-applicable parameters would not interfere with accurate model results; but it would waste time, because non-applicable parameters have no impact on model results.

Tutorial #2—Multi-Period Freeway Example (Sample #2.trf)

Figure 12:
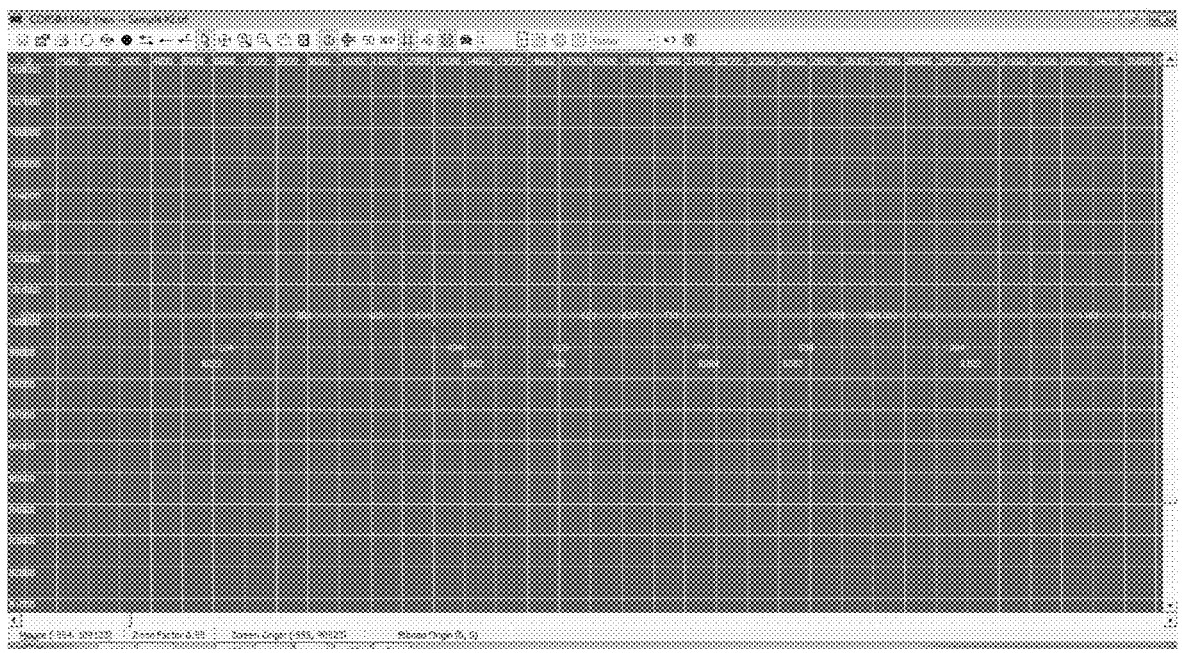
FIG. 12 shows an example of link-node geometry for an extended freeway facility with eleven segments, and five time periods. Example 5 describes a method for calibrating a model of this example.

The second tutorial example is an extended freeway facility with eleven segments, and five time periods. Volume and laneage details were derived from a 2010 Highway Capacity Manual example problem. The link-node geometry is shown in FIG. 12.

Before beginning the normal self-calibration runs, it would be advisable to perform some preliminary random number seed analysis, to determine whether the simulated performance measures actually represent non-typical results. However, field-measured performance measure values must be entered prior to any type of analysis. The steps to set up a preliminary random number seed analysis are as follows:
  Launch TSIS Next.
  Open Sample #2.trf.
  Turn on the following checkbox: Options>Preferences>Output Files>After CORSIM runs, copy OUT/CSV files to the TRF file folder.
  Perform one preliminary CORSIM simulation run by clicking on the "Run CORSIM" toolbar icon.

Next, field-measured values are entered in the Output Parameters screen. The values to be used for this exercise are listed below. These values can be entered by clicking on the "Self-Calibration" toolbar icon, and then switching between links using the combo box; or by right-clicking on specific links in the Map View, and then selecting the "Self-Calibrate" menu item. In each case, after entering the numeric value, it is then necessary to turn on the checkbox under the Self-Calibrate? column.
  DensityPerLane values for Time Period 3 Link-Specific Freeway (FRESIM)
   Enter 29.30 for link 101--->201
   Enter 34.20 for link 301--->402
   Enter 31.90 for link 501--->602
   Enter 35.80 for link 701--->801
   Enter 37.70 for link 1101--->1102
  SpeedAverage values for Time Period 3 Link-Specific Freeway (FRESIM)
   Enter 59.40 for link 101--->201
   Enter 57.10 for link 301--->402
   Enter 58.30 for link 501--->602
   Enter 56.10 for link 701--->801
   Enter 55.00 for link 1101--->1102

After entering in all of these values, the "total percent difference" should be displayed as 3.4%. Now, the preliminary random number seed analysis can begin.
  Click on the tab that says Input Parameters and Run Status
  In the data row that says Entry Headway Seed, turn on the checkbox under the Self-Calibrate? column
  At the far left side of this same data row, select Medium under the Searching column
  Click on the Generate button
  Click on the Start button At the end of the run, a Mean Value of 3.6% is displayed, which is slightly higher than the original percent difference. When this process is repeated with only the Traffic Stream Seed selected, the Mean Value matches the original 3.4%. When this process is repeated with only the Traffic Choice Seed selected, a Mean Value of 3.4% is again displayed. Finally, Entry Headway Seed is selected for Thorough searching (10 runs, time estimate 2 minutes 25 seconds). Afterwards, the screen shows that data file 10.trf contains a % Difference value that is equal to the Mean Value (3.7%) for all 10 trial datasets. Therefore, it might be safer to perform calibration using random number seeds within 10.trf, instead of random number seeds within the original dataset. Random number seeds from 10.trf can be automatically imported by clicking on the table cell that says "10.trf". After this, performance measures based on those random number seeds can be automatically generated by performing another CORSIM run, without even leaving the Self Calibration screen. Just click "Yes" when the program says "Refresh outputs by performing a CORSIM run?"

Now that the random number seeds have been checked, the self-calibration process can continue. Because FRESIM has a large number of calibration parameters available for selection, some engineering judgment is needed for choosing a smaller set of parameters for self-calibration. This is because simultaneous calibration of all parameters would result in an unacceptable computer run time. Research studies (e.g., FHWA-HRT-04-131) for sensitivity analysis could be considered, to help select the most influential input parameters for calibration. For this exercise, output parameters were self-calibrated individually and sequentially at the Thorough level. Sensitivity analysis parameters (e.g., Entry Node Volume, Desired Free-Flow Speed, Percent Trucks, etc.) and link-specific parameters were ignored. The best solution was automatically loaded after each run. After a few minutes of sequential self-calibration runs in this manner, the percent difference improvements (original percent difference was 3.7%) were as follows:

---

| | |
|---|---|
| 13. Vehicle Entry Headway | 2.9 |
| 14. Maximum Network Initialization Time | 2.9 |
| 15. Car Following Sensitivity Multiplier (FRESIM) | 2.7 |
| 16. Car Following Sensitivity (FRESIM) | 2.1 |
| 17. Time to Complete a Lane Change (FRESIM) | 2.1 |

| | |
|---|---|
| 18. Minimum Entry Headway (FRESIM) | 2.1 |
| 19. Percentage of Cooperative Drivers (FRESIM) | 2.1 |
| 20. Lane Change Desire (FRESIM) | 2.1 |
| 21. Lane Change Advantage (FRESIM) | 2.0 |
| 22. Maximum Non-Emergency Deceleration (FRESIM) | 2.0 |
| 23. Maximum Perceived Deceleration (FRESIM) | 2.0 |
| 24. On-Ramp Anticipatory Lane Change Speed (FRESIM) | 2.0 |
| 25. Free Flow Speed Distribution (FRESIM) | 2.0 |
| 26. On-Ramp Anticipatory Lane Change Distance (FRESIM) | 2.0 |
| 27. Off-Ramp Reaction Distance (FRESIM) | 2.0 |

At this stage, it may appear that the calibration exercise has nearly doubled (3.7% percent difference, reduced to 2.0%) the accuracy of the model. However, it is still possible that the 2.0% result represents a non-typical result, due to stochastic variation. Thus, it is advisable to perform some "post-calibration" random number seed analysis. By choosing Medium searching for the Entry Headway and Traffic Choice seeds, it is possible to set up a randomness analysis run with 25 simulations (run time estimate 5 minutes 51 seconds). After this post-calibration analysis run, the Mean Value is displayed as 2.4%, with 1.trf as the Mean Dataset. Clicking on 1.trf automatically loads these random number seeds; and File>Save As can now be used to save a copy of this calibrated network, under a new name.

At this point, the engineer might want to review the calibrated network (animation, inputs, outputs) for possible problems and anomalies. In addition, manual (non-automated) "fine-tuning" calibration could optionally be performed at this stage.

To summarize the results of this exercise, at the outset, it appeared that the percentage difference (between simulated and field-measured performance) was 3.7%, and random number analysis confirmed this to be a typical result for various seeds. In less than an hour, it was possible to reduce the percentage difference from 3.7% to 2.4%. Since the calibration of individual settings was done sequentially, instead of simultaneously, it is possible that the best combination of settings was not yet located. The sequential process was used to keep run times low, but a simultaneous process (with a small number of input parameters) might be preferable. To reduce the percentage difference further below 2.4%, the engineer might want to re-consider the overall list of options below.

8. Correction of fundamental input data (e.g., volume, timing, laneage) errors
9. Reconciliation of inconsistent performance measure definitions*
10. Collection of more accurate field-measured values
11. Elimination of simulation software limitations*
12. Correction of simulation software bugs*
13. Manual (non-automated) calibration
14. Automated self-calibration

*usually handled by the simulation software developers

In this exercise, all calibration input parameters were treated as "fair game", such that changing those parameters would be acceptable to the client. In a real-world project, the engineer would use judgment to avoid self-calibration of 1) parameters the client does not want changed, and 2) parameters that are not applicable to the given network. Self-calibration of non-applicable parameters would not interfere with accurate model results; but it would waste time, because non-applicable parameters have no impact on model results.

Tutorial #3—Link-Specific Inputs, Surveillance Detector Outputs (corsm1.trf)

Figure 30:
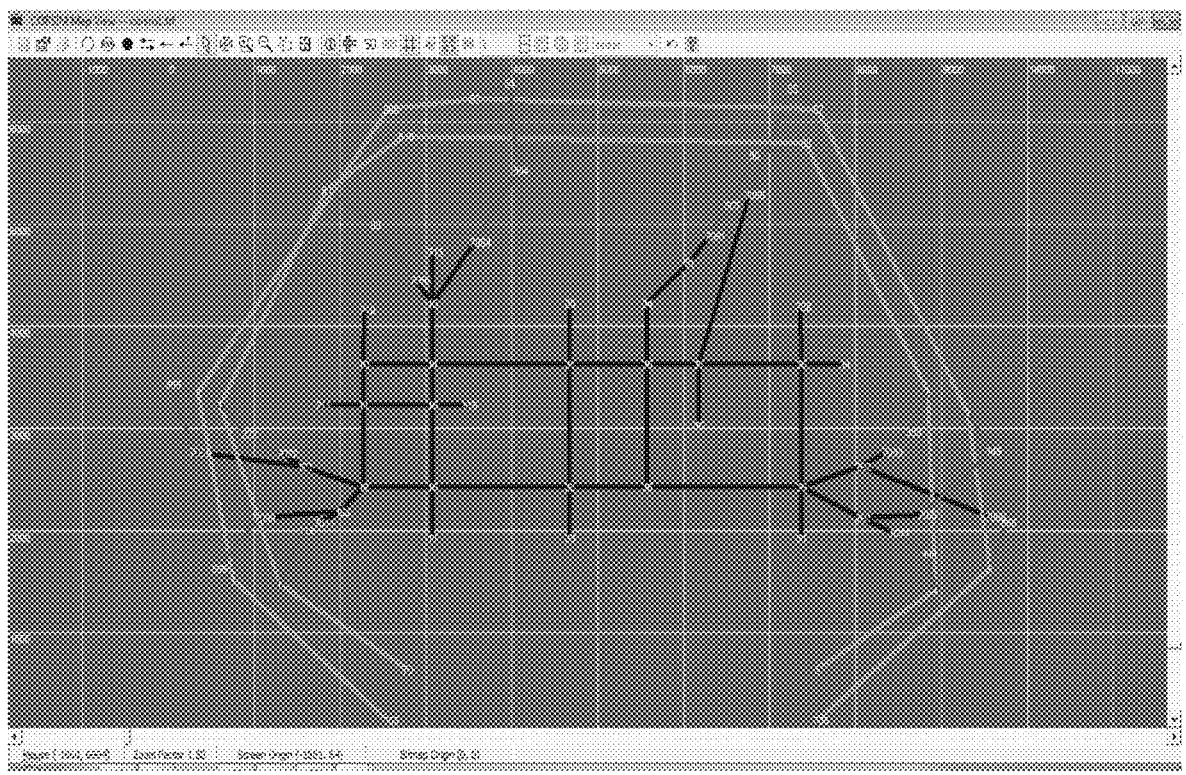
FIG. 30 illustrates the link-node geometry for a "Surface and Freeway Demo" example network, from Traffic Software Integrated System (TSIS), specifying a single 15-minute time period, with 9 surveillance detectors available on three freeway links (2->51, 510->52, 57->56).

The third tutorial example was derived from the "Surface and Freeway Demo" example network, from TSIS. This dataset specifies a single 15-minute time period, with 9 surveillance detectors available on three freeway links (2->51, 510->52, 57->56). The link-node geometry is shown in FIG. 30.

Before beginning the normal self-calibration runs, it would be advisable to perform some preliminary random number seed analysis, to determine whether the simulated performance measures actually represent non-typical results. However, field-measured performance measure values must be entered prior to any type of analysis. The steps to set up a preliminary random number seed analysis are as follows:

Launch TSIS Next.
Open corsm1.trf.
Turn on the following checkbox: Options>Preferences>Output Files>After CORSIM runs, copy OUT/CSV files to the TRF file folder.
Perform one preliminary CORSIM simulation run by clicking on the "Run CORSIM" toolbar icon.

Next, field-measured values are entered in the Output Parameters screen. The values to be used for this exercise are listed below. These values can be entered by clicking on the "Self-Calibration" toolbar icon, and then switching between links using the combo box; or by right-clicking on specific links in the Map View, and then selecting the "Self-Calibrate" menu item. In each case, after entering the numeric value, it is then necessary to turn on the checkbox under the Self-Calibrate? column.

Values for link 2--->51 Time Period 1 Link-Specific Freeway (FRESIM)
Enter 55.00 for SpeedAverage ID=1 Station=1
Enter 800.00 for Volume ID=1 Station=1
After entering in these values, the "total percent difference" should be displayed as 7.5%. Now, the preliminary random number seed analysis can begin.
Click on the tab that says Input Parameters and Run Status
In the data row that says Entry Headway Seed, turn on the checkbox under the Self-Calibrate? column
At the far left side of this same data row, select Medium under the Searching column
Click on the Generate button
Click on the Start button
At the end of the run, a Mean Value of 7.5% is displayed, which is identical to the original percent difference. When this process is repeated with only the Traffic Stream Seed selected, a Mean Value of 10.2% is generated. When this process is repeated with only the Traffic Choice Seed selected, a Mean Value of 6.9% is generated. Finally, the Traffic Stream and Traffic Choice seeds are selected simultaneously (25 runs~2 minutes), producing a Mean Value of 11.1%. Because the 11.1% difference appears to be more typical than the original 7.5%, random number seeds should be imported by clicking on the Mean Dataset (1.trf), which produces the closest (10.8%) difference to 11.1%. During this import process, click "Yes" when asked "Refresh outputs by performing a CORSIM run?"

Figure 31:
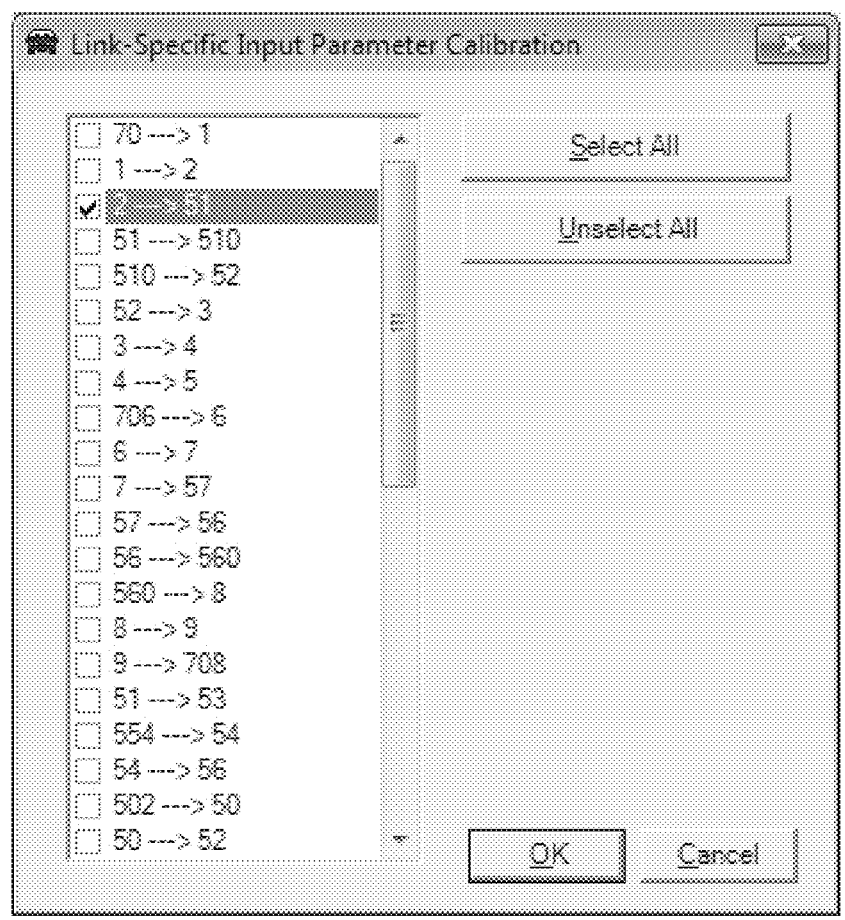
FIG. 31 illustrates one embodiment of a dialog box that can be used for link-specific calibration, according to the subject invention.

Now that the random number seeds have been checked, the self-calibration process can continue. In this example, assume that the client is willing to calibrate only four input parameters (car-following multiplier, warning sign distance, anticipatory lane change speed, anticipatory lane change distance) on a link-specific (not global) basis. Let's start by calibrating the car-following multiplier on link 2->51. First, unselect the Self-Calibrate checkbox for both random number seed input parameters. Then, select Thorough searching for Link-Specific Car Following Multiplier (FRESIM). When the Self-Calibrate checkbox is turned on for this input parameter, the Link-Specific Input Parameter Calibration dialog will pop up. Click on Unselect All before selecting link 2->51, as illustrated in FIG. 31.

Click OK to save link-specific calibration for link 2->51. After clicking on Generate, and then clicking on Start, the Best Value is now 7.9% for all seven trial values of car-following multiplier. Therefore, the value of car-following multiplier producing 7.9% should be imported at this time, from dataset 1.trf. When Link-Specific On-Ramp Lane Change Speed (FRESIM) is self-calibrated in this same manner, the Best Value is now 6.3%, so this lane change speed should be imported from dataset 1.trf. When Link-Specific On-Ramp Lane Change Distance (FRESIM) is self-calibrated in this same manner, the Best Value is now 4.8%, so this lane change distance should be imported from dataset 1.trf. When Link-Specific Off-Ramp Reaction Distance (FRESIM) is self-calibrated in this same manner, the Best Value remains 4.8%.

The next step is to check the imported calibration settings across different random number seeds. After unchecking Self-Calibrate for the Off-Ramp Reaction Distance, re-check Self-Calibrate for the Traffic Choice and Traffic Stream seeds, with Medium searching (25 runs ~2 minutes). After clicking on Generate and then Start, to analyze these random number seeds, the Mean Value is 6.8% for dataset 13.trf. Therefore, the final result of this exercise was an improvement (in surveillance detector output discrepancies) from 10.8% to 6.8%.

Note that the time estimate for calibrating all four input parameters simultaneously was estimated as 15 hours on the computer used for this exercise. If the analyst were willing to let the program run for 15 hours, it is likely that a better combination of inputs would be found.

Tutorial #4—Simple Sensitivity Analysis (actctrl.trf)

Figure 32:
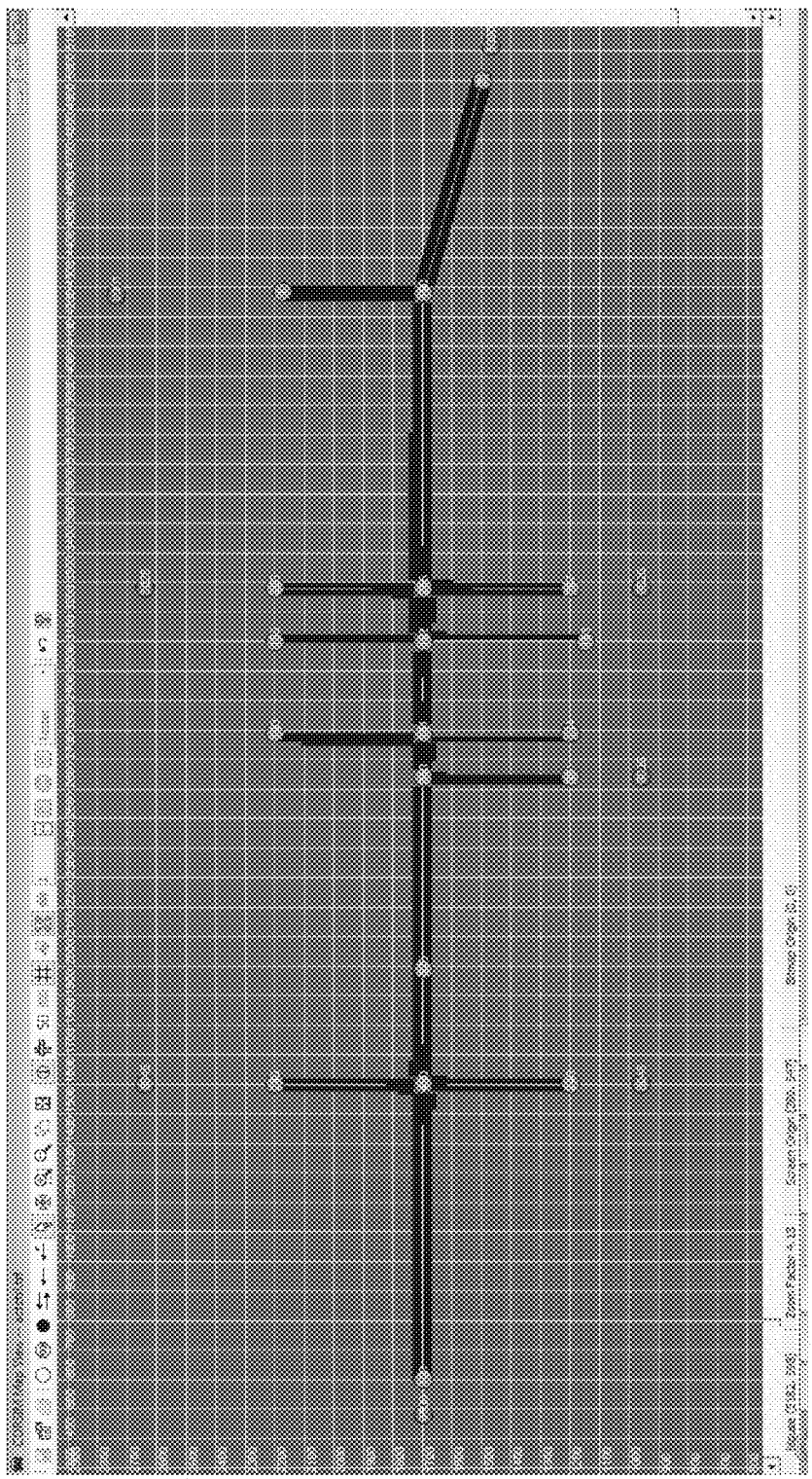
FIG. 32 illustrates the link-node geometry for an "Actuated Control Demo" example network, from TSIS that specifies two 5-minute time periods, as described in Example. 5.

The fourth tutorial example was derived from the "Actuated Control Demo" example network, from ISIS. This dataset specifies two 5-minute time periods, with the link-node geometry shown in FIG. 32.

As with the previous tutorial exercises, a single preliminary simulation run is needed to enable the self-calibration feature, which will be used for sensitivity analysis:
Launch TSIS Next.
Open actctrl.trf.
Turn on the following checkbox: Options>Preferences>Output Files>After CORSIM runs, copy OUT/CSV files to the TRF file folder.
Perform one preliminary CORSIM simulation run by clicking on the "Run CORSIM" toolbar icon.

Figure 33:
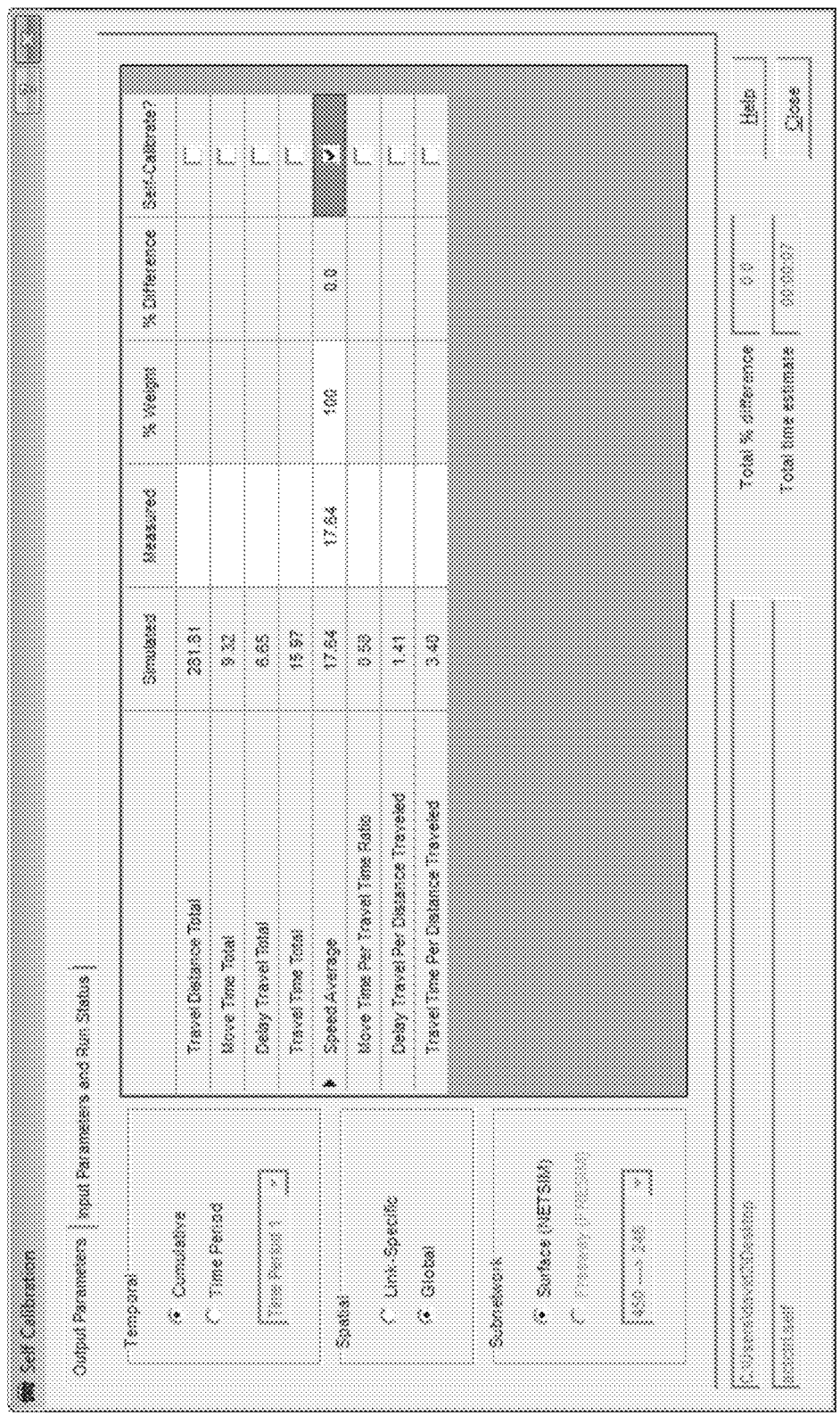
FIG. 33 illustrates one embodiment of an interface screen used for setting the measured SpeedAverage (Cumulative, Global) equal to its simulated value (17.64), as described in Example 5.

Before beginning the sensitivity analysis (SA) runs, preliminary random number seed analysis is again recommended, to determine whether simulated performance measures represent typical results. For self-calibration, field-measured performance measure values would normally be entered at this stage. For an application of SA as opposed to calibration, time can be saved during this step by setting one of the measured values equal to its simulated value. This value can be entered by clicking on the "Self-Calibration" toolbar icon, and then choosing your desired performance measure on the Output Parameters screen; or by right-clicking on specific links in the Map View, and then selecting the "Self-Calibrate" menu item. The screen shown in FIG. 33 illustrates setting the measured SpeedAverage (Cumulative, Global) equal to its simulated value (17.64):

After entering in this value, the "total percent difference" should be displayed as 0.0%. Now, the preliminary random number seed analysis can begin.
Click on the tab that says Input Parameters and Run Status
In the data rows for Entry Headway Seed, Traffic Stream Seed, and Traffic Choice Seed, turn on the checkbox under the Self-Calibrate? column
At the far left side of this same data row, select Quick under the Searching column
Click on the Generate button
Click on the Start button
At the end of the run, a Mean Value of 1.6% is displayed. Because the 1.6% difference appears to be more typical than the original 0.0%, random number seeds should be imported by clicking on the Mean Dataset (4.trf). During this import process, click "Yes" when asked "Refresh outputs by performing a CORSIM run?"

Figure 34:
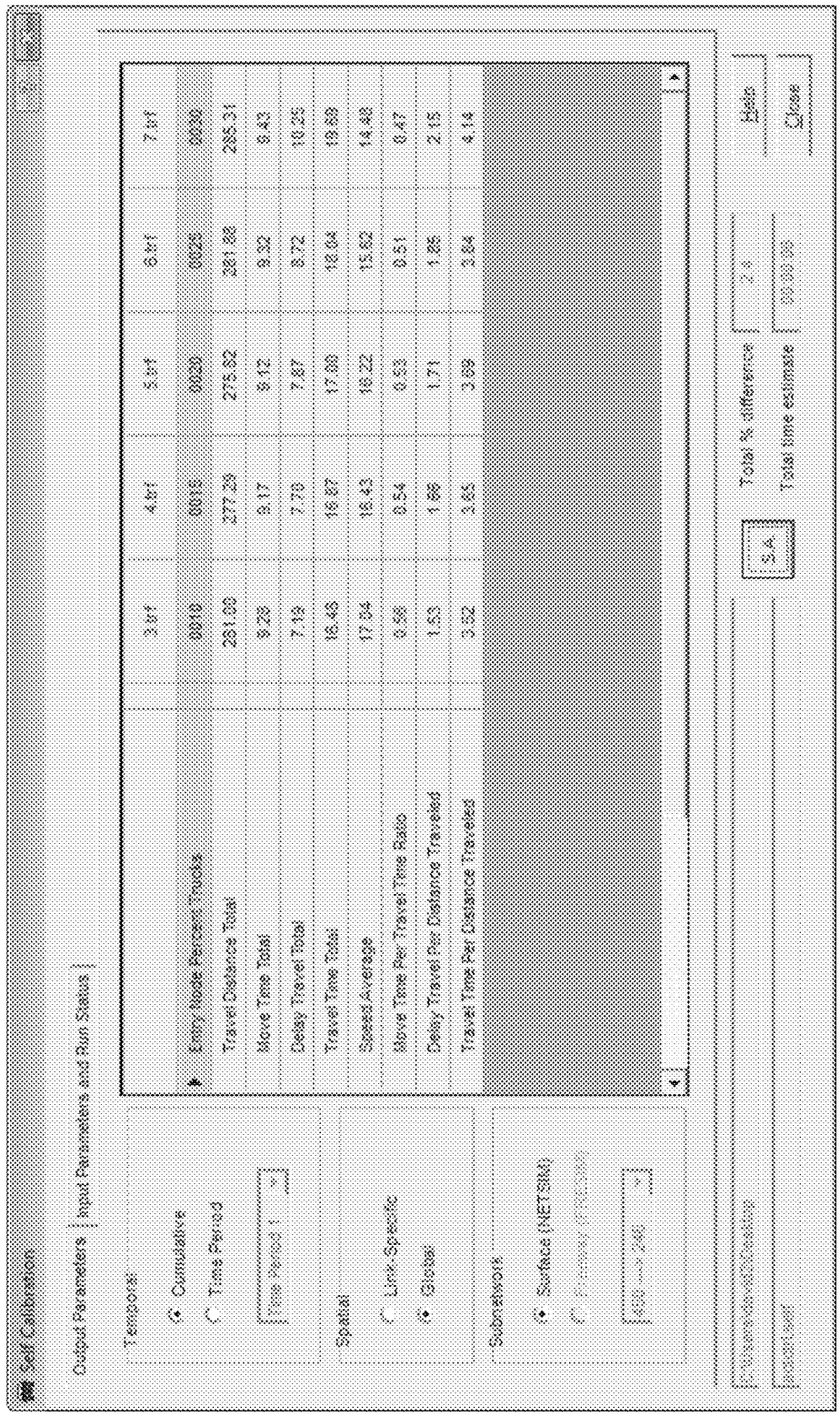
FIG. 34 illustrates one embodiment of an interface screen for displaying a table of sensitivity analysis (SA) results and shows that traffic network performance, in this example, generally deteriorates as the percentage of trucks increases.

Now that the random number seeds have been checked, the sensitivity analysis (SA) process can continue. In this example, an analysis will be done on the impact of Percent Trucks on SpeedAverage (Cumulative, Global). First, unselect the Self-Calibrate checkbox for all three random number seed input parameters. Then, select Medium searching for Entry Node Percent Trucks. After clicking on Generate, and then clicking on Start, the Best Value is naturally still 1.6% once the simulation runs are completed. Since it is not necessary to be concerned with SA than calibration, click on the Output Parameters tab. Once inside the Output Parameters screen, click on the radio buttons for Cumulative and Global, and click on the S.A. button at the bottom of the screen. The table of SA results illustrated in FIG. 34 shows that traffic network performance generally deteriorates as the percentage of trucks increases. Note that the S.A. button (Output Parameters screen) only becomes enabled and visible after clicking on Generate (Input Parameters and Run Status screen).

Tutorial #5—Simple Optimization (Sample #1.trf)

The fifth tutorial example involves the same pair of signalized intersections from Example #1. As with the previous tutorial exercises, a single preliminary simulation run is needed to enable the self-calibration feature, which will be used for sensitivity analysis:
Launch TSIS Next.
Open actctrl.trf.
Turn on the following checkbox: Options>Preferences>Output Files>After CORSIM runs, copy OUT/CSV files to the TRF file folder.
Perform one preliminary CORSIM simulation run by clicking on the "Run CORSIM" toolbar icon.

Figure 35:
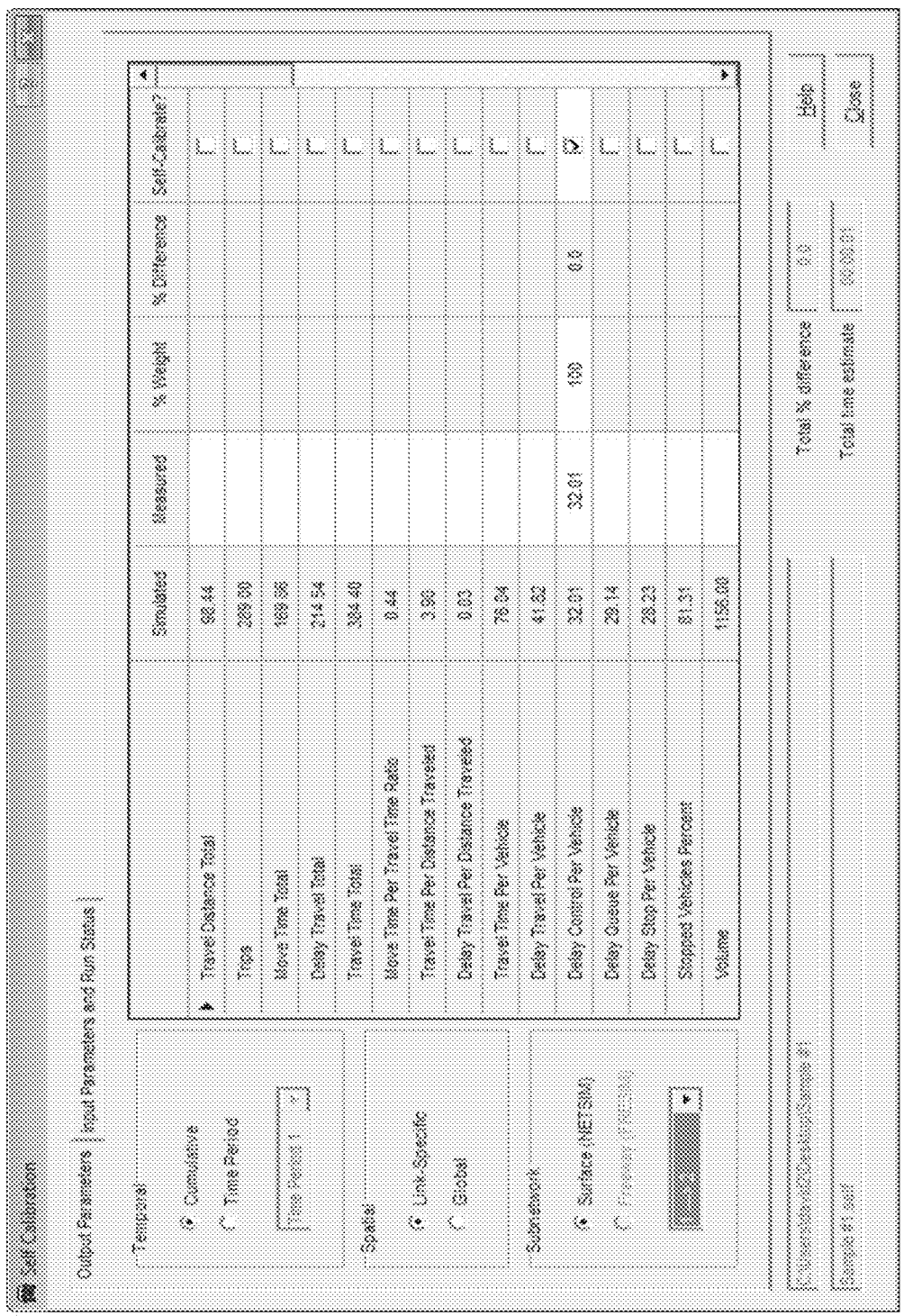
FIG. 35 illustrates one embodiment of an interface screen for setting the measured Delay Control Per Vehicle (Cumulative, Link-Specific) equal to its simulated value (32.01), on link 1-->2, as described in Example 5.

Before beginning the optimization runs, preliminary random number seed analysis is again recommended, to determine whether simulated performance measures represent typical results. For self-calibration, field-measured performance measure values would normally be entered at this stage. For an application of optimization as opposed to calibration, time can be saved during this step by setting one of the measured values equal to its simulated value. This value can be entered by clicking on the "Self-Calibration" toolbar icon, and then choosing your desired performance measure on the Output Parameters screen; or by right-clicking on specific links in the Map View, and then selecting the "Self-Calibrate" menu item. The screen in FIG. 35 illustrates setting the measured Delay Control Per Vehicle (Cumulative, Link-Specific) equal to its simulated value (32.01), on link 1-->2:

After entering in this value, the "total percent difference" should be displayed as 0.0%. Now, the preliminary random number seed analysis can begin.

Click on the tab that says Input Parameters and Run Status
In the data rows for Entry Headway Seed, Traffic Stream Seed, and Traffic Choice Seed, turn on the checkbox under the Self-Calibrate? column
At the far left side of this same data row, select Quick under the Searching column
Click on the Generate button
Click on the Start button At the end of the run, a Mean Value of 10.7% is displayed. Because the 10.7% difference appears to be more typical than the original 0.0%, random number seeds should be imported by clicking on the Mean Dataset (7.trf). During this import process, click "Yes" when asked "Refresh outputs by performing a CORSIM run?"

Figure 36:
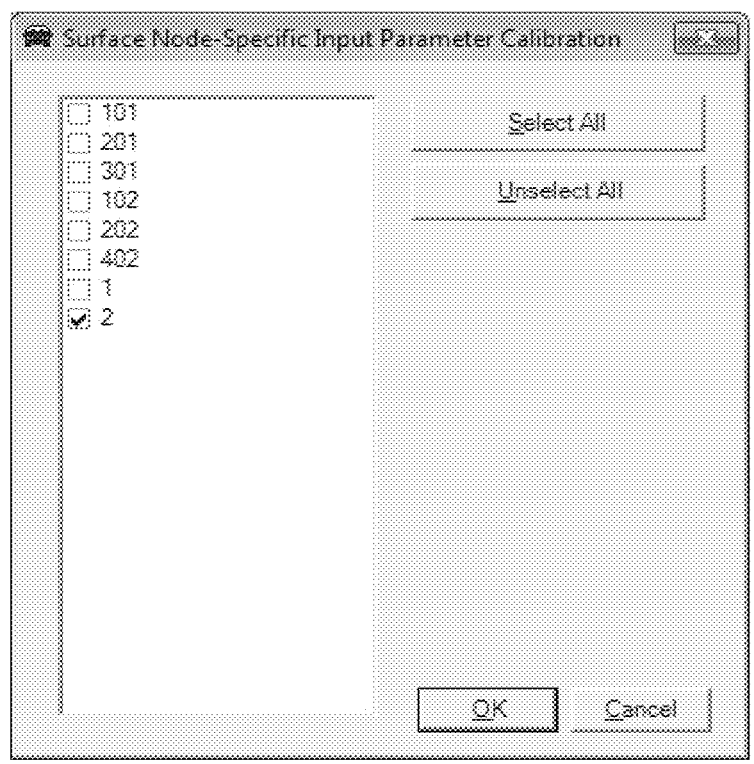
FIG. 36 illustrates one embodiment of a dialog box for selecting specific nodes for calibration, as described in Example 5.

Now that the random number seeds have been checked, the optimization process can continue. In this example the Yield Point at node #2 will be optimized, with Delay Control Per Vehicle (Cumulative, Link-Specific) at link 1-->2 as the optimization objective. First, unselect the Self-Calibrate checkbox for all three random number seed input parameters. Then, select Medium searching for Surface Node Yield Point (NETSIM). After this the pop-up dialog should appear, as shown in FIG. 36.

Figure 37:
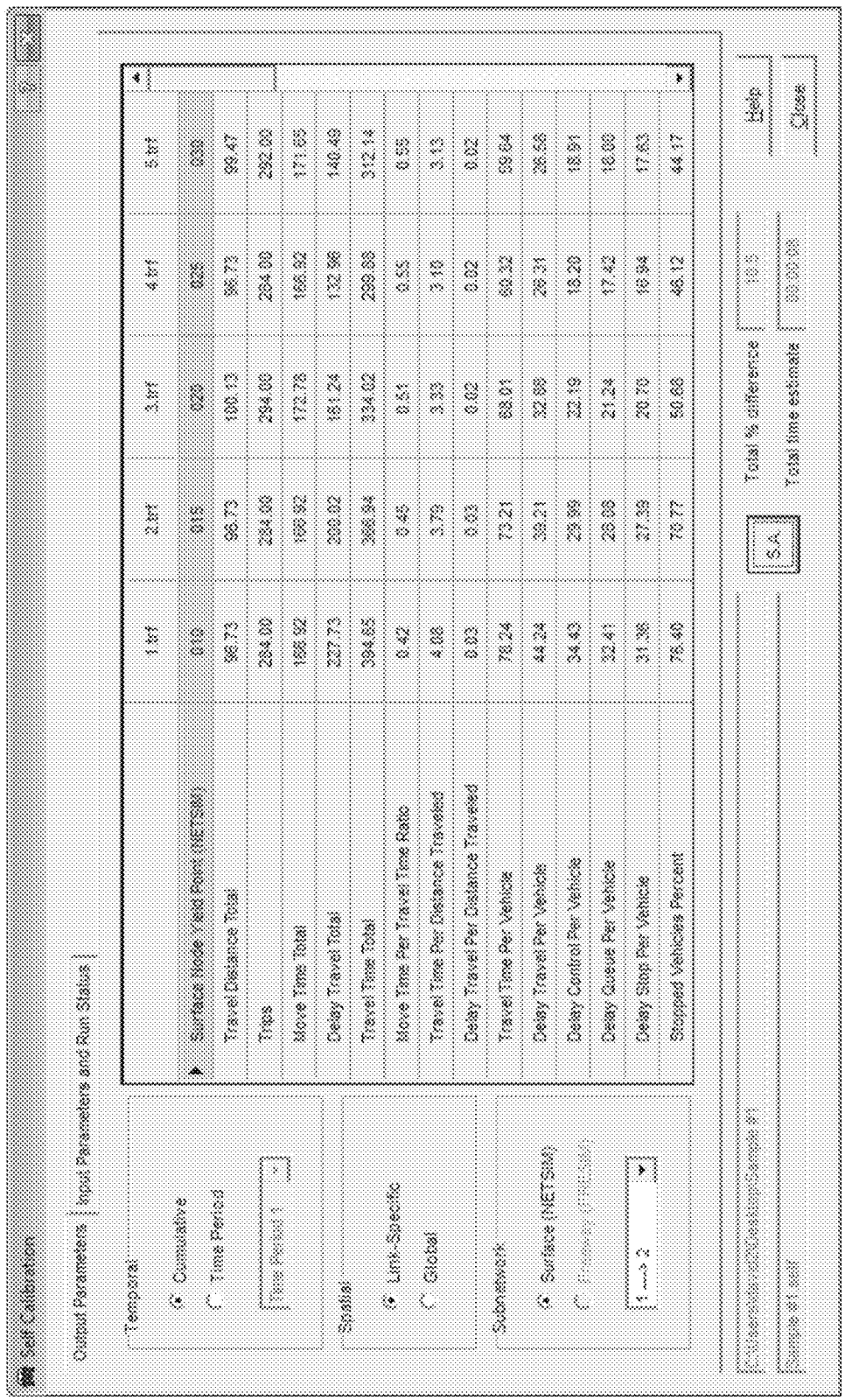
FIG. 37 illustrates one embodiment of an interface screen for displaying a table of optimization results. The example in this figure shows that control delay is minimized at a yield point of 25 seconds, as described in Example 5.

After clicking on Generate, and then clicking on Start, the Best Value appears to be 43.1% once the simulation runs are completed. Since it is not necessary to be more concerned with optimization than calibration, click on the Output Parameters tab. Once inside the Output Parameters screen, click on the radio buttons for Cumulative and Link-Specific (link 1--->2), and click on the S.A. button at the bottom of the screen. The table of optimization results illustrated in FIG. 37 shows that control delay is minimized at a yield point of 25 seconds. Note that the S.A. button (Output Parameters screen) only becomes enabled and visible after clicking on Generate (Input Parameters and Run Status screen).

Although Surface Node Yield Point is present within the default database of input parameters, the default trial values are very low, to avoid exceeding typical cycle lengths. In most cases the database file should be edited, so that higher yield point values can be examined, but the higher yield point values should never exceed the cycle length. Although Delay Control Per Vehicle can be viewed on the same screen as the yield point values, other performance measures can only be viewed by scrolling down the list. In cases such as this it might be preferable to copy-and-paste the tabular outputs into a spreadsheet file, also illustrated in FIG. 38, so that all desired outputs can be simultaneously visible.

Summary

The existing, non-automated methods of calibration have been considered difficult and/or inadequate by leading experts and practitioners. There has been a significant amount of research in the area of automated calibration techniques, but many of these projects have not provided the flexibility and practicality typically required by real-world engineers. With this in mind, the self-calibration features within TSIS-CORSIM were designed with an eye on maximizing practicality, flexibility, and ease-of-use. The implemented methodology allows engineers to quickly and easily select a set of input and output parameters for calibration. This methodology also allows engineers to prioritize specific input and output parameters, and specify their tolerable computer run time, prior to initiating the self-calibration process. The directed brute force search process is thought to be a key element in making this methodology flexible and practical, for real-world use. The self-calibration features can also facilitate sensitivity analysis and optimization for a wide variety of input and output parameters, helping practitioners and researchers to gain a better understanding of the modeling process.

By providing simple lists of input and output parameters to choose from, the software is designed to make calibration easier, and reduce the amount of engineering expertise required. By providing optional priority weighting for each output parameter, allowing the user to select search thoroughness (Quick, Medium, Thorough) for each input parameter, and allowing the user to modify the database of input parameters if desired, the software is designed to provide more flexibility than previous automated calibration techniques. By automatically generating all of the trial input data, and all of the trial data sets, the software is designed to reduce the amount of time and money typically spent on calibration. By automatically displaying recent simulation results next to the field-measured results, and by providing run time estimates in advance, the software is designed to make the process of calibration more simple and practical. In essence, the software is intended to make calibration easier, thus improving the accuracy of simulation.

Largely due to computer speed limitations, it is believed that automated calibration processes cannot fully replace engineering judgment, engineering expertise, or manual (non-automated) calibration. However the same could be said regarding many popular engineering software tools, all of which can lead to incorrect engineering decisions when not applied properly. The automated tools also cannot defend against fundamental (volume, timing, laneage) input data errors, simulation software bugs/limitations, or inconsistent performance measure definitions. Despite this, these software tools can hopefully "bridge the gap", in terms of significantly reducing the amount of time and expertise required for complex engineering projects.

It should be appreciated that the software components described herein may, when loaded into a central processing unit (CPU) and executed, transform the CPU and the overall computer architecture from a general-purpose computing system into a special-purpose computing system customized to facilitate the functionality presented herein. The CPU may be constructed from any number of transistors or other discrete circuit elements, which may individually or collectively assume any number of states. More specifically, the CPU may operate as a finite-state machine, in response to executable instructions contained within the software modules disclosed herein. These computer-executable instructions may transform the CPU by specifying how the CPU transitions between states, thereby transforming the transistors or other discrete hardware elements constituting the CPU.

Certain techniques set forth herein may be described or implemented in the general context of computer-executable instructions, such as program modules, executed by one or more computing devices. Generally, program modules include routines, programs, objects, components, and data structures that perform particular tasks or implement particular abstract data types.

Embodiments may be implemented as a computer process, a computing system, or as an article of manufacture, such as a computer program product or computer-readable medium. Certain methods and processes described herein can be embodied as code and/or data, which may be stored on one or more computer-readable media. Certain embodiments of the invention contemplate the use of a machine in the form of a computer system within which a set of instructions, when executed, can cause the system to perform any one or more of the methodologies discussed above. Certain computer program products may be one or more computer-readable storage media readable by a computer system and encoding a computer program of instructions for executing a computer process.

Computer-readable media can be any available computer-readable storage media or communication media that can be accessed by the computer system.

Communication media include the mechanisms by which a communication signal containing, for example, computer-readable instructions, data structures, program modules, or other data, is transmitted from one system to another system. The communication media can include guided transmission media, such as cables and wires (e.g., fiber optic, coaxial, and the like), and wireless (unguided transmission) media, such as acoustic, electromagnetic, RF, microwave and infrared, that can propagate energy waves.

By way of example, and not limitation, computer-readable storage media may include volatile and non-volatile, removable and non-removable media implemented in any method or technology for storage of information such as computer-readable instructions, data structures, program modules or other data. For example, a computer-readable storage medium can include volatile memory such as random access memories (RAM, DRAM, SRAM); and non-volatile memory such as flash memory, various read-only-memories (ROM, PROM, EPROM, EEPROM), magnetic and ferromagnetic/ferroelectric memories (MRAM, FeRAM), and magnetic and optical storage devices (hard drives, magnetic tape, CDs, DVDs). "Computer-readable storage media" do not consist of carrier waves or propagating signals.

In addition, the methods and processes described herein can be implemented in hardware modules. For example, the hardware modules can include, but are not limited to, application-specific integrated circuit (ASIC) chips, field programmable gate arrays (FPGAs), and other programmable logic devices now known or later developed. When the hardware modules are activated, the hardware modules perform the methods and processes included within the hardware modules.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

All patents, patent applications, provisional applications, and other publications referred to or cited herein are incorporated by reference in their entirety, including all figures and tables, to the extent they are not inconsistent with the explicit teachings of this specification. Additionally, the entire contents of the references cited within the references cited herein are also entirely incorporated by reference.

The examples and embodiments described herein are for illustrative purposes only and that various modifications or changes in light thereof will be suggested to persons skilled in the art and are to be included within the spirit and purview of this application.

The invention has been described herein in considerable detail, in order to comply with the Patent Statutes and to provide those skilled in the art with information needed to apply the novel principles, and to construct and use such specialized components as are required. However, the invention can be carried out by specifically different equipment and devices, and that various modifications, both as to equipment details and operating procedures can be effected without departing from the scope of the invention itself. Further, although the present invention has been described with reference to specific details of certain embodiments thereof and by examples disclosed herein, it is not intended that such details should be regarded as limitations upon the scope of the invention except as and to the extent that they are included in the accompanying claims.

What is claimed is:

1. A computer-implemented interface apparatus for a model, wherein the computer-implemented interface apparatus comprises at least one memory storing instructions and at least one processor to execute the instructions to cause the interface apparatus to at least:

provide one or more selectable input parameters for display via an interface;

receive a selection of at least one input parameter of the one or more selectable input parameters and a corresponding search thoroughness level, wherein the selection of the at least one input parameter is input via the interface;

receives a selection for the model to initiate one of automated sensitivity analysis or optimization of the selected at least one input parameter, wherein the selection for the model is input via the interface;

archive, during execution of the model, a dynamically updated list of one or more completed trials obtained from one or more default values available for the selected at least one input parameter; and provide an option for displaying, via the interface, at least one of the archived one or more completed trials.

2. The computer-implemented interface apparatus according to claim 1, wherein the at least one memory storing instructions and the at least one processor to execute the instructions further cause the interface apparatus to at least:

in response to receiving the selection for the model to conduct sensitivity analysis, archive an associated set of model generated output parameter values for each of the one or more completed trials; and provide an option for displaying the model generated output parameter values with the one or more completed trials.

3. The computer-implemented interface apparatus according to claim 1, wherein the at least one memory storing instructions and the at least one processor to execute the instructions further cause the interface apparatus to at least:

in response to receiving the selection for the model to conduct optimization of the selected at least one input parameter, archive an associated set of model generated output parameter values for each of the one or more completed trials, wherein the output parameter values are generated based on one or more objective function value for the selected at least one input parameter; and provide an option for displaying the model generated output parameter values with the one or more completed trials.

4. The computer-implemented interface apparatus according to claim 1, wherein the at least one memory storing instructions and the at least one processor to execute the instructions further cause the interface apparatus to at least:
prior to receiving the selection of at least one input parameter, receive a selected output parameter of the model; and
display the selected output parameter.

5. The computer-implemented interface apparatus according to claim 4, wherein the at least one memory storing instructions and the at least one processor to execute the instructions further cause the interface apparatus to at least:
provide a list of available output parameters of the model from which the selected output parameter is received.

6. The computer-implemented interface apparatus according to claim 5, wherein the at least one memory storing instructions and the at least one processor to execute the instructions further cause the interface apparatus to at least:
provide the selection of output parameters and the one or more selectable input parameters and the search thoroughness levels for the selectable input parameters for adjustment before executing the one of automated sensitivity analysis or optimization.

7. The computer-implemented interface apparatus according to claim 6, wherein the at least one memory storing instructions and the at least one processor to execute the instructions further cause the interface apparatus to at least:
provide an estimated time to perform an automated sensitivity analysis or optimization of the model generated by using at least the selected at least one input parameter and the corresponding search thoroughness level before executing the automated sensitivity analysis or optimization.

8. The computer-implemented interface apparatus according to claim 1, wherein the default values available for the selected at least one input parameter are obtained from a database of default values available for each input parameter.

9. The computer-implemented interface apparatus according to claim 8, wherein the at least one memory storing instructions and the at least one processor to execute the instructions further cause the interface apparatus to at least:
provide at least one statistic during execution of the one of automated sensitivity analysis or optimization of the selected input parameter, based on a dynamic analysis of the one or more archived sensitivity analysis or optimization trials as they are generated by the automated sensitivity analysis or optimization of the selected input parameter.

10. The computer-implemented interface apparatus according to claim 9, wherein the statistic is obtained by analysis of the output parameter values obtained from each candidate trial generated during the automated sensitivity analysis or optimization of the selected input parameter.

11. The computer-implemented interface apparatus according to claim 10, wherein the at least one memory storing instructions and the at least one processor to execute the instructions further cause the interface apparatus to at least:
receive a selection to abort the automated sensitivity analysis or optimization of the selected input parameter; and
provide a list of the sensitivity analysis or optimization trials completed and the at least one statistic compiled prior to receiving the abort selection.

12. The computer-implemented interface apparatus according to claim 1, wherein the at least one memory storing instructions and the at least one processor to execute the instructions further cause the interface apparatus to at least:
receive a selection of at least one of the one or more archived sensitivity analysis or optimization trials; and
provide at least one candidate value in the selected archived sensitivity analysis or optimization trial.

13. The computer-implemented interface apparatus according to claim 12, wherein the at least one memory storing instructions and the at least one processor to execute the instructions further cause the interface apparatus to at least:
provide an option for loading the candidate values for the selected sensitivity analysis or optimization trial into the model for optimization of the automated optimization of the selected output parameter.

14. The computer-implemented interface apparatus according to claim 1, wherein the at least one memory storing instructions and the at least one processor to execute the instructions further cause the interface apparatus to at least:
provide a range of candidate values for a selected input parameter;
provide an option for selecting a sub-range of candidate values; and
receive a selection of a sub-range of candidate values.

15. The computer-implemented interface apparatus according to claim 1, wherein the at least one memory storing instructions and the at least one processor to execute the instructions further cause the interface apparatus to at least:
provide an option for selecting a step size value by which the selected sub-range of values is incrementally analyzed during automated sensitivity analysis or optimization of the selected input parameter; and
receive a selection of a step size value prior to initiation of sensitivity analysis or optimization.

16. The computer-implemented interface apparatus according to claim 15, wherein the at least one memory storing instructions and the at least one processor to execute the instructions further cause the interface apparatus to at least:
provide an estimated time to perform an automated sensitivity analysis or optimization of the model that includes using the step size value.

17. The computer-implemented interface apparatus according to claim 1, wherein the at least one memory storing instructions and the at least one processor to execute the instructions further cause the interface apparatus to at least:
provide an option for conducting automated calibration after conducting the sensitivity analysis of the selected input parameter.

18. A computer-implemented method for automated sensitivity analysis or optimization of a model, the method comprising:
providing one or more selectable input parameters for display via an interface;
receiving a selection of at least one input parameter of the one or more selectable input parameters and a corresponding search thoroughness level, wherein the selection of the at least one input parameter is input via the interface;

in response to receiving a selection for the model to initiate one of automated sensitivity analysis or optimization of the selected at least one input parameter, executing one or more trials by selecting one or more default values available for the selected at least one input parameter;

archiving, during execution of the one or more trials, a dynamically updated list of one or more completed trials; and providing an option for displaying, via the interface, at least one of the archived one or more completed trials.

19. The computer-implemented method according to claim 18, further comprising:

in response to receiving the selection for the model to initiate sensitivity analysis, generating an at least one model-generated associated output parameter value for each trial; and archiving the associated output parameter with each completed trial.

20. The computer-implemented method according to claim 18, further comprising:

in response to receiving the selection for the model to initiate optimization, generating an at least one associated output parameter value for each trial, wherein the output parameter value is generated based on at least one objective function value for the selected at least one input parameter; and archiving the associated output parameter value with each completed trial.

* * * * *